United States Patent
Matsumoto et al.

(10) Patent No.: US 9,324,542 B2
(45) Date of Patent: Apr. 26, 2016

(54) PLASMA PROCESSING METHOD AND PLASMA PROCESSING APPARATUS

(71) Applicant: TOKYO ELECTRON LIMITED, Tokyo (JP)

(72) Inventors: Naoki Matsumoto, Miyagi (JP); Yugo Tomita, Miyagi (JP); Naoki Mihara, Miyagi (JP); Kazuki Takahashi, Miyagi (JP); Michitaka Aita, Miyagi (JP); Jun Yoshikawa, Miyagi (JP); Takahiro Senda, Miyagi (JP); Yoshiyasu Sato, Miyagi (JP); Kazuyuki Kato, Miyagi (JP); Kenji Sudou, Miyagi (JP); Hitoshi Mizusugi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/426,671

(22) PCT Filed: Sep. 20, 2013

(86) PCT No.: PCT/JP2013/075555
§ 371 (c)(1),
(2) Date: Mar. 6, 2015

(87) PCT Pub. No.: WO2014/057793
PCT Pub. Date: Apr. 17, 2014

(65) Prior Publication Data
US 2015/0228459 A1 Aug. 13, 2015

Related U.S. Application Data

(60) Provisional application No. 61/746,235, filed on Dec. 27, 2012.

(30) Foreign Application Priority Data

Oct. 9, 2012 (JP) ................... 2012-224095
Dec. 14, 2012 (JP) ................... 2012-273664

(51) Int. Cl.
*H01L 21/302* (2006.01)
*H01L 21/461* (2006.01)
(Continued)

(52) U.S. Cl.
CPC ....... *H01J 37/32449* (2013.01); *H01J 37/3222* (2013.01); *H01J 37/3244* (2013.01);
(Continued)

(58) Field of Classification Search
CPC ................. H01J 37/32449; H01J 37/32192
USPC ......................................... 438/714
See application file for complete search history.

(56) References Cited

U.S. PATENT DOCUMENTS 7,303,999 B1   12/2007  Sriraman et al.
2010/0101728 A1*  4/2010  Iwasaki ............ H01J 37/32192
                                                 156/345.33

FOREIGN PATENT DOCUMENTS

JP   2011-44567 A    3/2011
JP   2011-108816 A   6/2011
(Continued)

OTHER PUBLICATIONS

International Search Report mailed Dec. 17, 2013 in PCT/JP2013/075555.

*Primary Examiner* — Roberts Culbert
(74) *Attorney, Agent, or Firm* — Rothwell, Figg, Ernst & Manbeck, P.C.

(57) ABSTRACT

In a plasma processing apparatus of an exemplary embodiment, energy of microwaves is introduced from an antenna into the processing container through a dielectric window. The plasma processing apparatus includes a central introducing unit and a peripheral introducing unit. A central introduction port of the central introducing unit injects a gas just below the dielectric window. A plurality of peripheral introduction ports of the peripheral introducing unit injects a gas towards a periphery of the placement region. The central introducing unit is connected to with a plurality of first gas sources including a reactive gas source and a rare gas source through a plurality of first flow rate control units. The peripheral introducing unit is connected to with a plurality of second gas sources including a reactive gas source and a rare gas source through a plurality of second flow rate control units.

4 Claims, 37 Drawing Sheets

(51) Int. Cl.
*H01J 37/32* (2006.01)
*H01L 21/3065* (2006.01)
*H01L 21/311* (2006.01)

(52) U.S. Cl.
CPC ..... *H01J37/32192* (2013.01); *H01J 37/32238* (2013.01); *H01L 21/3065* (2013.01); *H01L 21/31116* (2013.01)

(56) References Cited

FOREIGN PATENT DOCUMENTS

| | | | |
|---|---|---|---|
| WO | 2009/107718 | A1 | 9/2009 |
| WO | 2011/125524 | A1 | 10/2011 |

\* cited by examiner

FIG.37
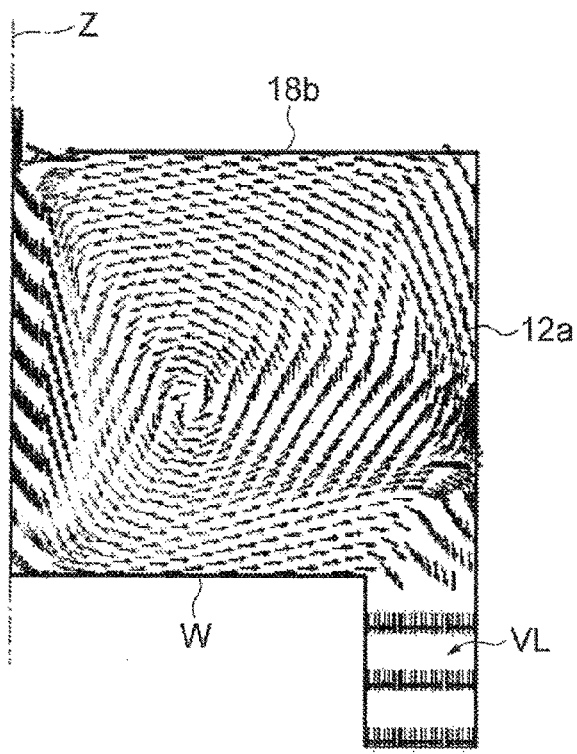
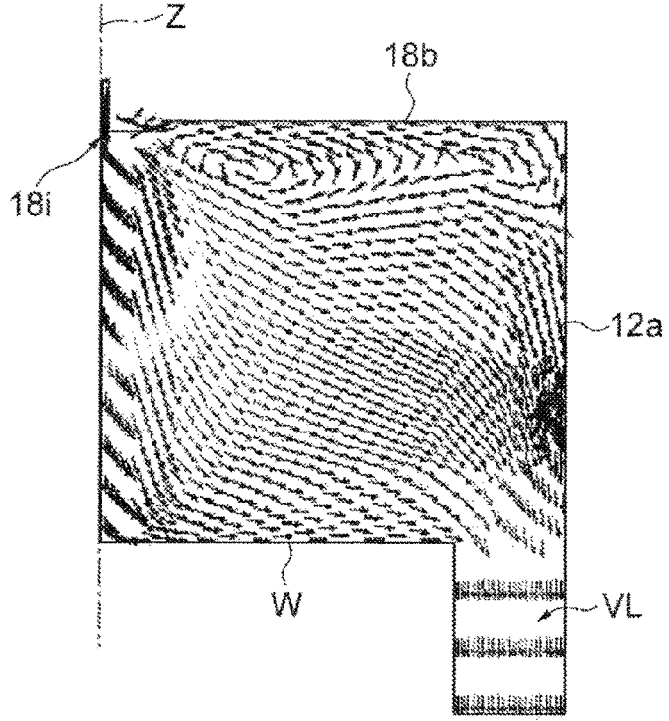

PLASMA PROCESSING METHOD AND PLASMA PROCESSING APPARATUS

CROSS REFERENCE TO RELATED APPLICATION

This application is a 35 U.S.C. 371 National Phase Entry Application from PCT/JP2013/075555, filed Sep. 20, 2013, which claims priority to and the benefit of U.S. Provisional Application No. 61/746,235, filed Dec. 27, 2012 and Japanese Patent Application Nos. 2012-224095, filed Oct. 9, 2012 and 2012-273664, filed Dec. 14, 2012, the disclosures of which are incorporated herein in their entirety by reference.

TECHNICAL FIELD

An embodiment of the present invention relates to a plasma processing method and a plasma processing apparatus.

BACKGROUND

In manufacturing semiconductor devices, a plasma processing is performed on a substrate by exciting a processing gas with energy supplied from a plasma source in a processing container. That is, a processing of etching a substrate is performed. As a plasma processing apparatus for use in such a plasma processing, a plasma processing apparatus including a radial line slot antenna has been recently developed (see Patent Document 1).

In the plasma processing apparatus described in Patent Document 1, a slot antenna having a plurality of slots is provided above a dielectric window of a processing container. A central introduction port of a central introducing unit is formed in the center of the dielectric window to supply a processing gas. Further, a peripheral introducing unit for supplying a processing gas is formed between the dielectric window and a placing table on which a substrate is placed. The peripheral introducing unit is provided below the central introduction port and includes an annular pipe that extends circumferentially in a space above the placing table. The annular pipe includes a plurality of peripheral introduction ports that are opened towards a central axis of the annular pipe. The central introducing unit and the peripheral introducing unit are connected to a processing gas source through a flow splitter.

The energy of microwaves radiated from the plurality of slots of the slot antenna is introduced into the processing container through the dielectric window. The processing gas introduced into the processing container by the central gas introducing unit and the peripheral gas introducing unit is converted into plasma by the energy of microwaves. Thus, the substrate is etched by the processing gas which has been converted into plasma.

PRIOR ART DOCUMENT

Patent Document

Patent Document 1: International Publication WO2011/125524

SUMMARY OF THE INVENTION

Problems to be Solved

In the plasma processing apparatus described in Patent Document 1, a plasma density just above the center of the substrate becomes higher than a plasma density just above the periphery of the substrate. Accordingly, in the plasma processing apparatus described in Patent Document 1, there is a limit to the controllability of the processing speed of each region in the radial direction of the substrate, even though a distribution ratio of the processing gas to the central introducing unit and the peripheral introducing unit is adjusted by the flow splitter. For example, there is a limit to a control of the processing speed in the periphery of the substrate so as to come closer to the processing speed in the central portion of the substrate.

From such a circumstance, what is requested in the technical field is a plasma processing method and a plasma processing apparatus, in which a deviation of the processing speed in the entire region in the radial direction of the substrate can be reduced.

Means to Solve the Problems

According to an aspect, a method of performing a plasma processing on a substrate is provided. The method includes a step (a) of etching a substrate placed on a placing table so as to face a lower surface of a dielectric window by supplying a first gas from a central introducing unit into a processing container, supplying a second gas from a peripheral introduction unit into the processing container, and introducing energy of microwaves from an antenna provided above an upper surface of the dielectric window into the processing container through the dielectric window. The central introducing unit includes a central introduction port. The central introduction port is opened towards the center of the substrate and injects a gas just below the dielectric window. The central introducing unit is connected with a plurality of first gas sources including a source of the first gas through a plurality of first flow rate control units. The peripheral introducing unit is provided with a plurality of peripheral introduction ports. The plurality of peripheral introduction ports is arranged in a circumferential direction below the central introduction ports and above the placing table. The plurality of peripheral introduction ports injects a gas towards the periphery of the substrate. The peripheral introducing unit is connected with a plurality of second gas sources including a source of the second gas through a plurality of second flow rate control units. In this method, a flow rate of a reactive gas in the second gas is higher than a flow rate of a reactive gas in the first gas, and a ratio of the flow rate of the reactive gas to a flow rate of a rare gas in the second gas is greater than a ratio of the flow rate of the reactive gas to a flow rate of a rare gas in the first gas.

In the method according to the aspect, the first gas mainly containing a rare gas may be introduced into the processing container from the central introducing unit by using the plurality of first gas sources and the plurality of first flow rate control units for exclusive use of the central introducing unit. For example, the first gas may contain a rare gas only, or may contain a small amount of a reactive gas in addition to the rare gas. Meanwhile, the second gas containing a relatively large amount of a rare gas may be introduced into the processing container from the peripheral introducing unit by using the plurality of second gas sources and the plurality of second flow rate control units for exclusive use of the peripheral introducing unit. Accordingly, a more reactive gas may be supplied to the periphery of the substrate than to the center of the substrate. As a result, according to the present method, the deviation of the processing speed of the entire region in the radial direction of the substrate may be reduced. Further, since more reactive gas may be supplied from the peripheral introducing unit to a region having an electron temperature lower than that of a region just below the dielectric window, it is possible to adjust a dissociation rate of the reactive gas supplied to the substrate.

In an exemplary embodiment, the substrate may include a silicon oxide layer and a polycrystalline silicon layer, and in step (a), $C_4F_6$ gas may be supplied as the reactive gas to the peripheral introducing unit. $C_4F_6$ gas serves as a corrosive gas for the silicon oxide layer and serves as a deposition gas for the polycrystalline silicon layer. According to the exemplary embodiment, the silicon oxide layer may be etched while the polycrystalline silicon layer is protected. Further, the distribution of the etching rate of the polycrystalline silicon layer and the distribution of the deposition rate of the polycrystalline silicon layer in the radial direction may be adjusted by adjusting the flow rate of the rare gas in the first gas. In addition, the distribution of the etching rate of the silicon oxide layer in the radial direction may be adjusted by adjusting the flow rate of $C_4F_6$ gas in the second gas.

As an example to which the method of the present exemplary embodiment is applicable, the polycrystalline silicon layer may constitute a fin having a source, drain, and a channel in a fin type field effect transistor, and the silicon oxide layer may be formed around the fin.

In an exemplary embodiment, the substrate may include an underlying portion made of silicon, a plurality of gates arranged on the underlying portion, and sidewall spacer layers formed along sidewalls of the plurality of gates. The sidewall spacer layer is made of, for example, silicon nitride. In this exemplary embodiment, the placing table is connected to a high frequency power supply that generates a high frequency bias power. The method of this exemplary embodiment further includes a step (b) of etching the underlying portion below a gap between two spacer layers interposed between two adjacent gates by introducing a reactive gas for etching the underlying portion into the processing container, introducing energy of microwaves from the antenna into the processing container through the dielectric window, and applying the high frequency bias power to the placing table. In the method of this exemplary embodiment, step (a) is performed after step (b). In step (a), the substrate, that is, the underlying portion is further etched using the reactive gas for etching the underlying portion as the reactive gas in the second gas without applying the high frequency bias power to the placing table.

In the method of the above-mentioned exemplary embodiment, the underlying portion of the substrate may be etched vertically (that is, in the thickness of the substrate) by step (b). In addition, the underlying portion may be etched horizontally by performing step (a) after step (b). Further, in step (a), since the reactive gas is injected from the peripheral introduction ports towards the periphery of the substrate, radicals are supplied to the periphery of the substrate without being deactivated. As a result, the underlying portion may be etched horizontally in the entire region over the radial direction of the substrate, including the periphery.

According to another aspect, a plasma processing apparatus is provided. The plasma processing apparatus includes a processing container, a placing table, a dielectric window, an antenna, a central introducing unit, a peripheral introducing unit, a plurality of first gas source, a plurality of first flow rate control unit, a plurality of second gas source, and a plurality of second flow rate control unit. The placing table has a placement region for placing a substrate and is provided in the processing container. The dielectric window has a lower surface facing the placement region and an upper surface at a side opposite to the lower surface. The antenna is provided on the upper surface of the dielectric window and introduces energy of microwaves into the processing container through the dielectric window. The central introducing unit is provided with a central introduction port. The central introduction port is opened towards the center of the placement region and injects a gas just below the dielectric window. The peripheral introducing unit is provided with a plurality of peripheral introduction ports. The plurality of peripheral introduction ports is arranged in a circumferential direction below the central introduction port and above the placing table and injects a gas towards the periphery of the placement region. The plurality of first gas sources includes a source of a reactive gas and a source of a rare gas and is connected to the central introducing unit. The plurality of first flow rate control units is provided between the plurality of first gas source and the central introducing unit. The plurality of second gas sources includes a source of a reactive gas and a source of a rare gas and is connected to the peripheral introducing unit. The plurality of second flow rate control units is provided between the plurality of second gas source and the peripheral introducing unit.

In the plasma processing apparatus, the flow rates of the reactive gas and the rare gas, which are supplied to the central introducing unit, may be separately adjusted by the first flow rate control unit. Further, the flow rates of the reactive gas and the rare gas, which are supplied to the peripheral introducing unit, may be separately adjusted by the second flow rate control unit, independently from the adjustment of the flow rates of the gases supplied to the central introducing unit by the first flow rate control unit. Thus, according to the plasma processing apparatus, the method according to the above-mentioned aspect may be performed.

In an exemplary embodiment, the plasma processing apparatus may further include a control unit. The control unit may control the plurality of first flow rate control units and the plurality of second flow rate control units such that a first gas is supplied to the central introducing unit and a second gas is supplied to the peripheral introducing unit. Specifically, the control unit controls the plurality of first flow rate control units and the plurality of second flow rate control units such that a flow rate of a reactive gas in the second gas is higher than a flow rate of a reactive gas in the first gas, and a ratio of the flow rate of the reactive gas to a flow rate of a rare gas in the second gas is greater than a ratio of the flow rate of the reactive gas to a flow rate of a rare gas in the first gas.

According to the plasma processing apparatus of the exemplary embodiment, the method according to the above-mentioned aspect may be performed under the control by the control unit. Further, according to the plasma processing apparatus of the exemplary embodiment, by using $C_4F_6$ gas as the reactive gas, the silicon oxide layer of a substrate may be etched while the polycrystalline silicon layer of the substrate is protected. Such a substrate may be exemplified by a substrate including a polycrystalline silicon layer constituting a fin having a source, drain, and a channel in a fin type field effect transistor, and a silicon oxide layer provided around the fin.

In an exemplary embodiment, the plasma processing apparatus further includes a high frequency power supply that generates a high frequency bias power. The control unit may perform a first control so as to introduce a gas containing a rare gas and a reactive gas into the processing container, introduce the energy of microwaves into the processing container through the dielectric window, and apply the high frequency bias power to the placing table, and subsequently, a second control so as to introduce the first gas and the second gas from the central introducing unit and the peripheral introducing unit, respectively, introduce the energy of microwaves into the processing container through the dielectric window, and stop the supply of the high frequency bias power to the placing table. The plasma processing apparatus of the exemplary embodiment may be applied to a processing of a substrate including an underlying portion made of silicon, a plurality of gates arranged on the underlying portion, and sidewall spacer layers formed along sidewalls of the plurality of gates. Specifically, the underlying portion may be etched vertically by performing step (b) under the first control, and subsequently, the underlying portion may also be etched horizontally by performing step (a) under the second control.

In an exemplary embodiment, the peripheral introducing unit extends in a circumferential direction and includes an annular pipe that provides the plurality of peripheral introduction ports. The annular pipe may be formed along an inner wall of the processing container. According to the plasma processing apparatus of the exemplary embodiment, since the annular pipe is formed along the inner wall of the processing container, the annular pipe is not an obstacle to diffusion of plasma, and hence, the uniformity of the plasma density distribution is enhanced. Further, the annular pipe is inserted into the wall of the processing container, the stability of the temperature of the annular pipe, furthermore, the temperature of the gas introduced into the processing container from the annular pipe may be enhanced.

In an exemplary embodiment, the annular pipe has a rectangular cross-section, and the plasma processing apparatus further includes a support member that extends along a lower surface and an outer peripheral surface and supports the annular pipe. Further, a peripheral introduction assembly including the annular pipe and the support member is inserted into a wall of the processing container. In this exemplary embodiment, the number of parts used in the structure supporting the annular pipe may be reduced. As a result, the maintenance is improved, and the cost is reduced.

In an exemplary embodiment, the placing table may include an electrostatic chuck and a metal plate supplied with the high frequency bias power. In this exemplary embodiment, the electrostatic chuck includes a lower portion and an upper portion providing the placement region and defines a stepped outer peripheral surface such that a diameter of the upper portion is smaller than a diameter of the lower portion. The plasma processing apparatus of the exemplary embodiment further includes a focus ring that surrounds the placement region and an insulating member that extends along the stepped outer peripheral surface and an outer peripheral surface of the plate from an outer edge of the focus ring and defines a space along with the inner wall of the processing container. In the plasma processing apparatus of the exemplary embodiment, since the outer peripheral surface of the electrostatic chuck is stepped, the upper portion of the electrostatic chuck is reduced in diameter. Further, the insulating member extends along the outer peripheral surface of the electrostatic chuck and the outer peripheral surface of the plate from the outer edge of the focus ring and faces a space between the inner wall of the processing container and the placing table. Accordingly, a diameter of a placing table assembly including the placing table, focus ring, and the insulating member may be reduced. As a result, plasma may be diffused up to the vicinity of the periphery of the substrate, and hence, the uniformity of the plasma density distribution may be enhanced.

In an exemplary embodiment, the plasma processing apparatus may further include an exhaust path around the placing table, an exhaust port formed below the exhaust path, an exhaust device connected to the exhaust port, and a baffle plate provided 80 mm or more down from the placement region and including a plurality of through-holes formed therein. In the plasma processing apparatus of the exemplary embodiment, since the baffle plate is provided 80 mm or more down from the placement region, the size of the exhaust path above the baffle plate may be increased, and thus, plasma may be diffused up to the exhaust path above the baffle plate. As a result, the plasma may be diffused up to the vicinity of the periphery of the substrate, and hence, the uniformity of the plasma density distribution may be enhanced. Further, in the present exemplary embodiment, since the exhaust path is biased transversely with respect to the center of the placing table, the distance from the exhaust path varies depending on the radial position of the periphery of the substrate. However, in the present exemplary embodiment, since the baffle plate is provided considerably downward from the placement region as described above, the length of the exhaust above the baffle plate may be increased, so that a stream line from the periphery of the substrate to the baffle plate may be increased. As a result, a difference in the circumferential direction of the gas flow at the periphery of the substrate may be suppressed.

Effect of the Invention

As described above, according to various aspects and embodiments of the present invention, a plasma processing method and a plasma processing apparatus are provided, in which a deviation of the processing speed in the entire region in the radial direction of the substrate can be reduced.

BRIEF DESCRIPTION OF THE DRAWINGS

FIG. 37 illustrates diagrams of distribution of gas flows in the processing containers obtained in Simulations 26 and 27.

DETAILED DESCRIPTION TO EXECUTE THE INVENTION

Figure 1:
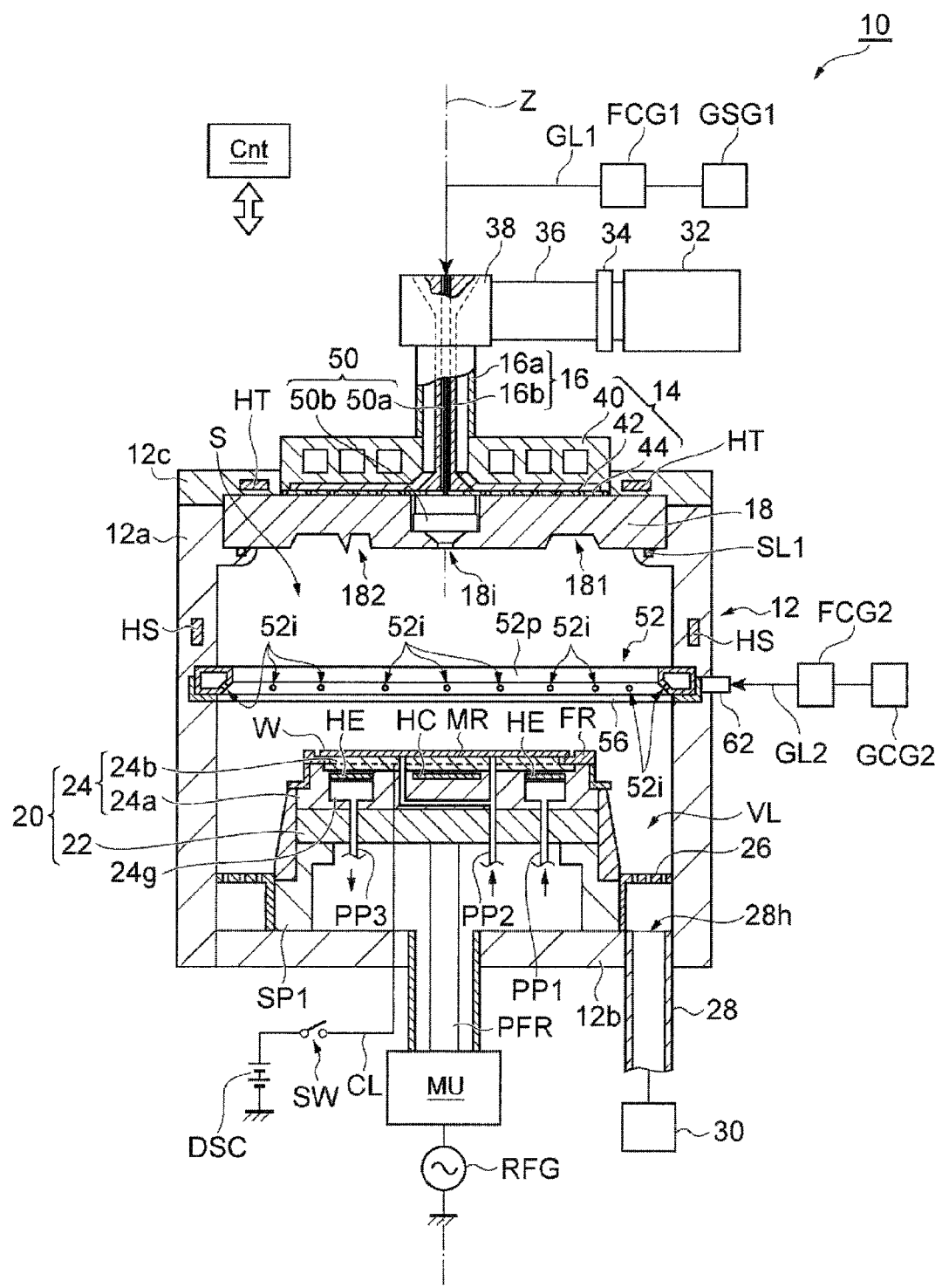
FIG. 1 is a schematic cross-sectional view illustrating a plasma processing apparatus according to an exemplary embodiment.

Hereinafter, various exemplary embodiments of the present invention will be described in detail with reference to the accompanying drawings. Further, the same reference numerals will be given to the same or corresponding portions in respective drawings.

First, a plasma processing apparatus according to an exemplary embodiment will be described. FIG. 1 is a schematic cross-sectional view illustrating a plasma processing apparatus according to an exemplary embodiment. The plasma processing apparatus 10 illustrated in FIG. 1 includes a processing container 12. The processing container 12 defines a processing space S to accommodate a substrate (wafer) W. The processing container 12 may include a sidewall 12a, a bottom 12b, and a ceiling 12c.

The sidewall 12a has a substantially cylindrical shape extending in a direction where an axis Z extends (hereinafter, referred to as an "axis Z direction"). The inner diameter of the sidewall 12a is, for example, 540 mm. The bottom 12b is formed at a lower end of the sidewall 12a. An upper end of the sidewall 12a is opened. An upper end opening of the sidewall 12a is closed by a dielectric window 18. The dielectric window 18 is sandwiched between the upper end of the sidewall 12a and the ceiling 12c. A sealing member SL1 may be interposed between the dielectric window 18 and the upper end of the sidewall 12a. The sealing member SL1 is, for example, an O-ring, and contributes to sealing of the processing container 12.

The plasma processing apparatus 10 further includes a placing table 20 provided in the processing container 12. The placing table 20 is provided below the dielectric window 18. In an exemplary embodiment, the placing table 20 includes a plate 22 and an electrostatic chuck 24.

The plate 22 is a substantially disc-shaped member made of a metal such as, for example, aluminum. The plate 22 is supported by a cylindrical support SP1. The support SP1 extends vertically upward from the bottom 12b. The plate 22 serves as a high frequency electrode. The plate 22 is electrically connected to a high frequency power supply RFG, which generates a high frequency bias power, through a matching unit MU and a power feeding rod PFR. The high frequency power supply RFG outputs a high frequency bias power having a frequency suitable to control energy of ions drawn to the wafer W, for example, a frequency of 13.65 MHz. The matching unit MU accommodates a matcher to match the impedance of the high frequency power supply RFG side and the impedance of the load side such as, mainly, an electrode, plasma, or the processing container 12. A blocking condenser for self-bias generation is included in the matcher.

The electrostatic chuck 24 is provided on the top surface of the plate 22. The electrostatic chuck 24 includes a base plate 24a and a chuck 24b. The base plate 24a is a substantially disc-shaped member made of a metal such as, for example, aluminum. The base plate 24a is provided on the plate 22. The chuck 24b is provided on the top surface of the base plate 24a. The top surface of the chuck 24b serves as a placement region MR to place the wafer W. The chuck 24b holds the wafer W by an electrostatic attractive force. The chuck 24b includes an electrode film sandwiched between dielectric films. The electrode film of the chuck 24b is electrically connected with a DC power supply DCS through a switch SW and a coated wire CL. The chuck 24b is able to attract and hold the wafer W on its top surface by a Coulomb force generated by a DC voltage applied from the DC power supply DCS. A focus ring FR is provided radially outside of the chuck 24b to annularly surround the periphery of the wafer W.

An annular coolant chamber 24g, which extends circumferentially, is provided inside the base plate 24a. In the cooling chamber 24g, a coolant having a predetermined temperature, for example, cooling water is circulated and supplied from a chiller unit through pipes PP1, PP3. The processing temperature of the wafer W on the chuck 24b may be controlled by the temperature of the coolant. Further, a heat transfer gas such as, for example, helium (He) gas is supplied from a heat transfer gas supplying unit to a gap between the top surface of the chuck 24b and the rear surface of the wafer W through a supply pipe PP2.

An annular exhaust path VL is formed around the placing table 20. An annular baffle plate 26 including a plurality of through-holes formed therein is provided in the middle of the exhaust path VL in the axis Z direction. The exhaust path VL is connected to an exhaust pipe 28 that provides an exhaust port 28h. The exhaust pipe 28 is attached to the bottom 12b of the processing container 12. The exhaust pipe 28 is connected to an exhaust device 30. The exhaust device 30 is provided with a pressure adjuster and a vacuum pump such as, for example, a turbo molecular pump. The processing space S in the processing container 12 may be decompressed to a desired vacuum degree by the exhaust device 30. Further, the exhaust device 30 may be operated to exhaust gas from an outer periphery of the placing table 20 through the exhaust path VL.

In an exemplary embodiment, the plasma processing apparatus 10 may further include heaters HT, HS, HC, and HE as temperature control mechanisms. The heater HT is provided in the ceiling 12c and extends annularly so as to surround an antenna 14. Further, the heater HS is provided in the sidewall 12a and extends annularly. The heater HC is provided in the base plate 24a. The heater HC is provided below the central portion of the placement region MR as described above, that is, in a region intersecting with the axis Z, in the base plate 24a. Further, the heater HE is provided in the base plate 24a and extends annularly so as to surround the heater HC. The heater HE is provided below the peripheral portion of the placement region MR as described above.

In an exemplary embodiment, the plasma processing apparatus 10 may further include the antenna 14, a coaxial waveguide 16, the dielectric window 18, a microwave generator 32, a tuner 34, a waveguide 36, and a mode converter 38. The antenna 14, the coaxial waveguide 16, the dielectric window 18, the microwave generator 32, the tuner 34, the waveguide 36, and the mode converter 38 constitute a plasma source of the plasma processing apparatus.

The microwave generator 32 generates microwaves having a frequency of, for example, 2.45 GHz. The microwave generator 32 is connected to an upper portion of the coaxial waveguide 16 through the tuner 34, the waveguide 36, and the mode converter 38. The coaxial waveguide 16 extends along the axis Z which is its central axis. In an exemplary embodiment, the center of the placement region MR of the placing table 20 is positioned on the axis Z.

The coaxial waveguide 16 includes an outer conductor 16a and an inner conductor 16b. The outer conductor 16a has a cylindrical shape extending along the center of the axis Z. The lower end of the outer conductor 16a may be electrically connected to an upper end of a cooling jacket 40 having a conductive surface. The inner conductor 16b is provided coaxially with the outer conductor 16a in the inside of the outer conductor 16a. The inner conductor 16b has a cylindrical shape extending along the center of the axis Z. The lower end of the inner conductor 16b is connected to a slot plate 44 of the antenna 14.

In an exemplary embodiment, the antenna 14 is a radial line slot antenna. The antenna 14 is disposed in an opening formed in the ceiling 12c, and provided on the upper surface of the dielectric window 18. The antenna 14 includes a dielectric plate 42 and the slot plate 44. The dielectric plate 42 shortens the wavelength of the microwaves and is substantially disc-shaped. The dielectric plate 42 is made of, for example, quartz or alumina. The dielectric plate 42 is sandwiched between the slot plate 44 and the bottom surface of the cooling jacket 40.

Therefore, the antenna 14 may be configured by the dielectric plate 42, the slot plate 44, and the bottom surface of the cooling jacket 40.

Figure 2:
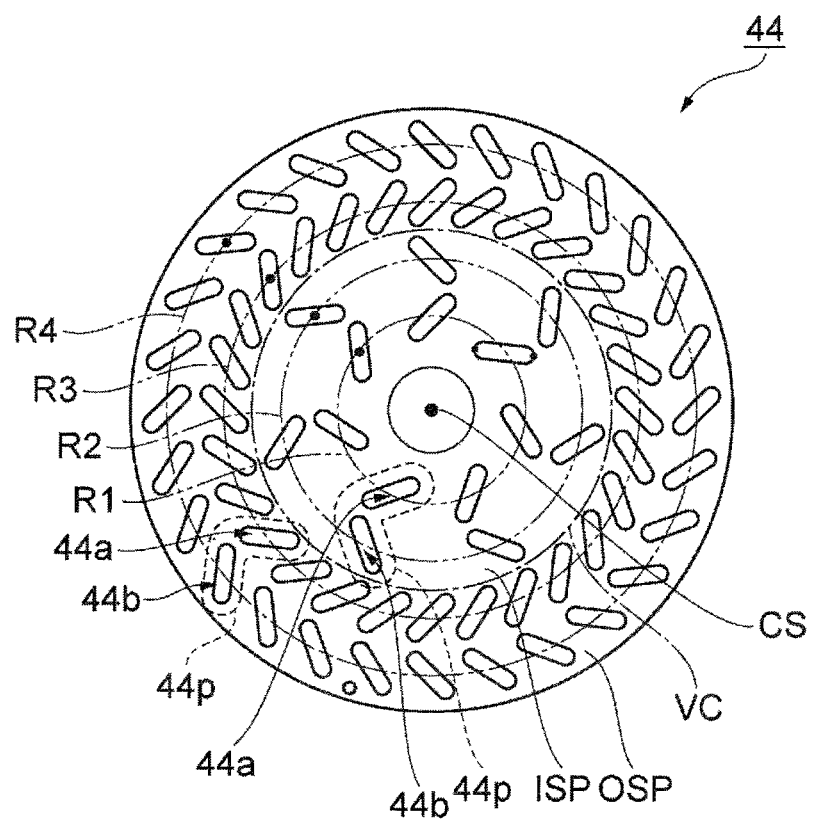
FIG. 2 is a plan view illustrating an exemplary slot plate.

FIG. 2 is a plan view illustrating an exemplary slot plate. The slot plate 44 is thin and disc-shaped. Both surfaces of the slot plate 44 in the plate thickness direction are flat. A center CS of the circular slot plate 44 is positioned on the axis Z. The slot plate 44 is provided with multiple slot pairs 44p. Each of the multiple slot pairs 44p includes two slot holes 44a, 44b penetrating in the plate thickness direction. The planar shape of each of the slot holes 44a, 44b is an elongated hole shape. In each slot pair 44p, the direction where the major axis of the slot hole 44a extends and the direction where the major axis of the slot hole 44b extends intersect with or cross at right angles to each other.

In the example illustrated in FIG. 2, the multiple slot pairs 44p are generally divided into an inner slot pair group ISP that is provided inside a virtual circle VC around the axis Z and an outer slot pair group OSP that is provided outside the virtual circle VC. The inner slot pair group ISP includes multiple slot pairs 44p. In the example illustrated in FIG. 2, the inner slot pair group ISP includes seven slot pairs 44p. The multiple slot pairs 44p of the inner slot pair group ISP are arranged at regular intervals in the circumferential direction with respect to the center CS. The multiple slot holes 44a included in the inner slot pair group ISP are arranged at regular intervals such that the gravity center of each slot holes 44a is positioned on a circle having a radius R1 from the center CS of the slot plate 44. Further, the multiple slot holes 44b included in the inner slot pair group ISP are arranged at regular intervals such that the gravity center of each slot holes 44b is positioned on a circle having a radius R2 from the center CS of the slot plate 44. Here, the radius R2 is larger than the radius R1.

The outer slot pair group OSP includes multiple slot pairs 44p. In the example illustrated in FIG. 2, the outer slot pair group OSP includes twenty eight slot pairs 44p. The multiple slot pairs 44p of the outer slot pair group OSP are arranged at regular intervals in the circumferential direction with respect to the center CS. The multiple slot holes 44a included in the outer slot pair group OSP are arranged at regular intervals such that the gravity center of each slot hole 44a is positioned on a circle having a radius R3 from the center CS of the slot plate 44. Further, the multiple slot holes 44b included in the outer slot pair group OSP are arranged at regular intervals such that the gravity center of each slot hole 44b is positioned on a circle having a radius R4 from the center CS of the slot plate 44. Here, the radius R3 is larger than the radius R2, and the radius R4 is larger than the radius R3.

Further, the respective slot holes 44a of the inner slot pair group ISP and the outer slot pair group OSP are formed such that their major axes have the same angle with respect to a line segment connecting the center CS and their gravity centers. Further, the respective slot holes 44b of the inner slot pair group ISP and the outer slot pair group OSP are formed such that their major axes have the same angle with respect to a line segment connecting the center CS and their gravity centers.

Figure 3:
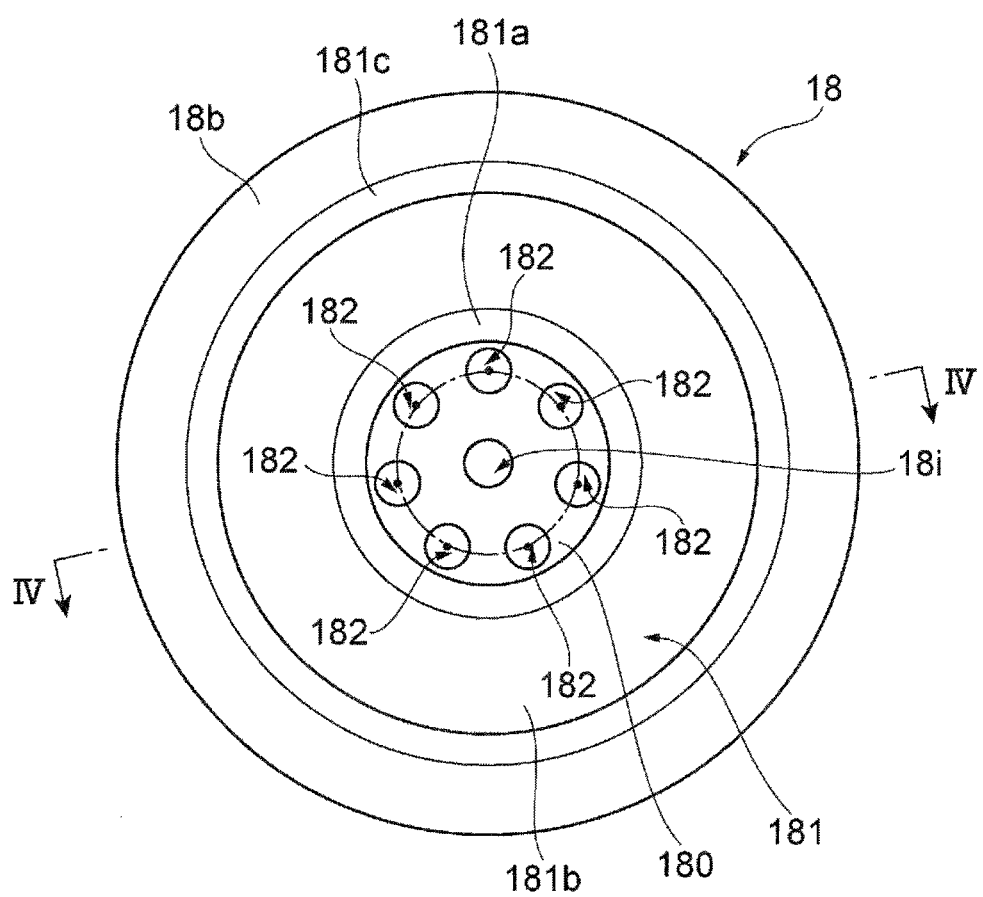
FIG. 3 is a plan view illustrating an exemplary dielectric window.
Figure 4:
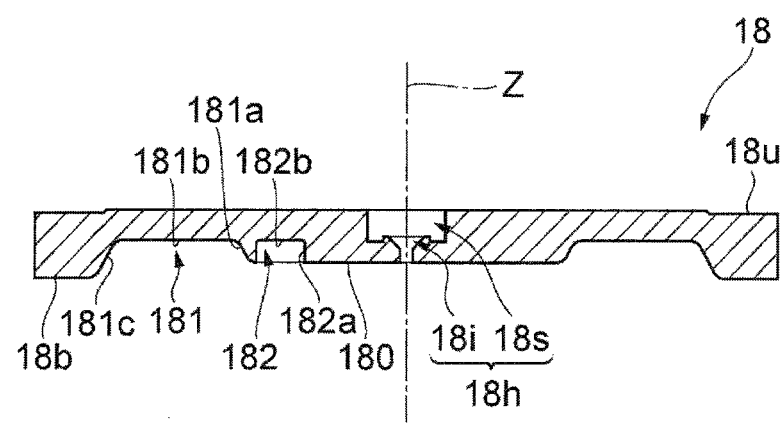
FIG. 4 is a cross-sectional view taken along line IV-IV of FIG. 3.

FIG. 3 is a plan view illustrating an exemplary dielectric window in which the dielectric window is viewed from the processing space S side. FIG. 4 is a cross-sectional view taken along the line IV-IV of FIG. 3. The dielectric window 18 is substantially disc-shaped, and is made of a dielectric such as quartz or alumina. The slot plate 44 is provided on an upper surface 18u of the dielectric window 18.

A through-hole 18h is formed in the center of the dielectric window 18. The upper portion of the through-hole 18h serves as a space 18s that accommodates an injector 50b of a central introducing unit 50 (to be described later), and the lower portion thereof serves as a central introduction port 18*i* of the central introducing unit 50 (to be described later). Meanwhile, the central axis of the dielectric window 18 coincides with the axis Z.

A surface opposite to the upper surface 18*u* of the dielectric window, that is, a lower surface 18*b* is in contact with the processing space S and is positioned at the side where plasma is produced. The lower surface 18*b* defines various shapes. Specifically, the lower surface 18*b* has a flat surface 180 in the central region surrounding the central introduction port 18*i*. The flat surface 180 is a plane surface orthogonal to the axis Z. In a radially outside region of the flat surface 180, the lower surface 18*b* defines a first annular recess 181 that is continuous annularly and recessed in a tapered shape towards the inner side in the plate thickness direction of the dielectric window 18.

The first recess 181 is defined by an inner tapered surface 181*a*, a bottom surface 181*b*, and an outer tapered surface 181*c*. The bottom surface 181*b* is formed closer to the upper surface 18*u* side than the flat surface 180 and extends annularly in parallel with the flat surface 180. The inner tapered surface 181*a* extends annularly between the flat surface 180 and the bottom surface 181*b*, and is inclined with respect to the flat surface 180. The outer tapered surface 181*c* extends annularly between the bottom surface 181*b* and the peripheral portion of the lower surface 18*b*, and is inclined with respect to the bottom surface 181*b*. Meanwhile, the peripheral region of the lower surface 18*b* is a surface to be in contact with the sidewall 12*a*.

Further, the lower surface 18*b* defines multiple second recesses 182 recessed from the flat surface 180 towards the inside in the plate thickness direction. The number of the multiple second recesses 182 is seven in the example illustrated in FIGS. 3 and 4. The multiple second recesses 182 are formed at regular intervals along the circumferential direction. Further, the multiple second recesses 182 have a circular planar shape on the surface orthogonal to the axis Z. Specifically, an inner surface 182*a* defining each second recess 182 is a cylindrical surface extending in the axis Z direction. Meanwhile, a bottom surface 182*b* defining the second recess 182 is formed closer to the upper surface 18*u* than the flat surface 180, and is a circular surface in parallel with the flat surface 180.

Figure 5:
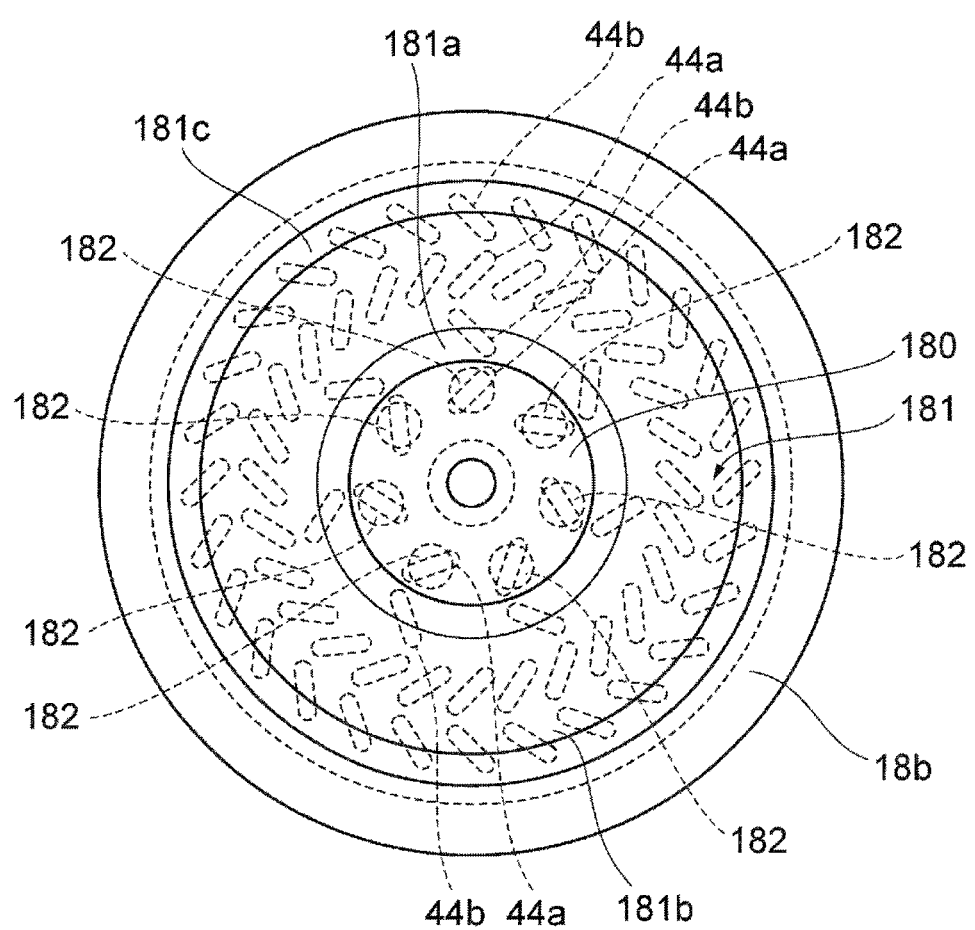
FIG. 5 is a plan view illustrating a state where the slot plate illustrated in FIG. 2 is provided on the dielectric window illustrated in FIG. 3.

FIG. 5 is a plan view illustrating a state where the slot plate illustrated in FIG. 2 is provided on the dielectric window illustrated in FIG. 3, in which the dielectric window 18 is viewed from the bottom. As illustrated in FIG. 5, in a plan view, that is, when viewed in the axis Z direction, the multiple slot holes 44*a* and the multiple slot holes 44*b* of the outer slot pair group OSP, and the multiple slot holes 44*b* of the inner slot pair group ISP are overlapped with the first recess 181. Specifically, in the plan view, the multiple slot holes 44*b* of the outer slot pair group OSP are overlapped partly with the outer tapered surface 181*c* and partly with the bottom surface 181*b*. Further, in the plan view, the multiple slot holes 44*a* of the outer slot pair group OSP are overlapped with the bottom surface 181*b*. Further, in the plan view, the multiple slot holes 44*b* of the inner slot pair group ISP are overlapped partly with the inner tapered surface 181*a* and partly with the bottom surface 181*b*.

Further, in the plan view, that is, when viewed in the axis Z direction, the multiple slot holes 44*a* of the inner slot pair group ISP are overlapped with the second recesses 182. Specifically, in the plan view, the gravity centers (centers) of the multiple second recesses 182 on the bottom surface are positioned inside the multiple slot holes 44*a* of the inner slot pair group ISP, respectively.

FIG. 1 will be referenced again. In the plasma processing apparatus 10, the microwaves generated by the microwave generator 32 are propagated to the dielectric plate 42 through the coaxial waveguide 16 and given to the dielectric window 18 from the slot holes 44*a*, 44*b* of the slot plate 44.

In the dielectric window 18, the plate thickness of the portion defining the first recess 181 and the plate thickness of the portion defining the second recesses 182, as described above, are thinner than other portions. Therefore, in the dielectric window 18, the permeability of the microwaves is increased in the portion defining the first recess 181 and the portion defining the second recesses 182. Further, when viewed in the axis Z direction, the slot holes 44*a* and 44*b* of the outer slot pair group OSP, and the slot holes 44*b* of the inner slot pair group ISP are overlapped with the first recess 181, and the slot holes 44*a* of the inner slot pair group ISP are overlapped with the second recesses 182. Accordingly, the electric field of the microwaves is concentrated in the first recess 181 and the second recesses 182, and the energy of the microwaves is concentrated in the first recess 181 and the second recesses 182. As a result, plasma may be stably generated in the first recess 181 and the second recesses 182. Therefore, plasma distributed in the radially and circumferentially just below the dielectric window 18 may be stably generated.

In the plasma processing apparatus 10, it is possible to generate plasma just below the dielectric window 18 and process the wafer W on the placing table 20 provided below the dielectric window 18. The distance from the lower surface 18*b* of the dielectric window 18 to the top surface of the placing table 20, that is, the placement region MR in the axis Z direction is, for example, 245 mm. Here, the electron temperature of the plasma occurs as a function of the distance from the dielectric window 18. The electron temperature increases as the distance from the dielectric window 18 increases. Therefore, in the plasma processing apparatus 10, the wafer W may be processed in a plasma diffusion region in which the electron temperature is low, and as a result, damage to the wafer W may be reduced.

Diffusion of the plasma is defined by the following Equation (1):

$$D \times \delta Ne/\delta x \quad (1)$$

Here, D represents a diffusion coefficient, and $\delta Ne/\delta x$ represents an electron density gradient. According to Equation (1), the diffusion of the plasma depends on a density gradient directed from the plasma generation region towards the inner wall of the processing container. Since the plasma is diffused in this manner, the plasma density increases as the distance from the inner wall of the processing container increases. In general, the radial outside of the placing table is surrounded by the inner wall of the processing container. Therefore, the plasma distribution tends to be formed such that the plasma density increases in the center on the placing table, that is, the center of the wafer, and the plasma density decreases in the periphery on the placing table, that is, the periphery of the wafer. Such plasma distribution may cause a deviation of the processing speed in the radial direction of the wafer W. Thus, the plasma processing apparatus 10 has various configurations for reducing the deviation of the processing speed in the radial direction of the wafer W. Hereinafter, the configuration of the plasma processing apparatus 10 will be described in more detail.

The plasma processing apparatus 10 includes a central introducing unit 50 and a peripheral introducing unit 52. The central introducing unit 50 includes a conduit 50*a*, an injector 50*b*, and a central introduction port 18*i*. The conduit 50*a* passes through an inner hole of the inner conductor 16b of the coaxial waveguide 16. Further, the end of the conduit 50a extends to the space 18s defined by the dielectric window 18 along the axis Z (see FIG. 4). The injector 50b is accommodated inside the space 18s and below the terminal end of the conduit 50a. The injector 50b includes a plurality of through-holes that extend in the axis Z direction. The dielectric window 18 defines the central introduction port 18i. The central introduction port 18i continues below the space 18s and extends along the axis Z. The central introducing unit 50 having such a configuration supplies a gas to the injector 50b through the conduit 50a, and injects the gas from the injector 50b through the central introduction port 18i. As such, the central introducing unit 50 injects the gas just below the dielectric window 18 along the axis Z. That is, the central introducing unit 50 introduces the gas into the plasma generation region in which the electron temperature is high.

The peripheral introducing unit 52 includes a plurality of peripheral introduction ports 52i. The plurality of peripheral introduction ports 52i mainly supplies the gas to the periphery of the wafer W. The plurality of peripheral introduction ports 52i is opened towards the periphery of the wafer W or the periphery of the placement region MR. The plurality of peripheral introduction ports 52i is arranged in the circumferential direction below the central introduction port 18i and above the placing table 20. That is, the plurality of peripheral introduction ports 52i is arranged annularly around the axis Z in a region in which the electron temperature is lower (plasma diffusion region) than in a region just below the dielectric window. Here, the dissociation rate of the gas is defined by the product of the residence time, the electron density, and the electron temperature. Since the peripheral introducing unit 52 supplies the gas towards the wafer W in a region in which the electron temperature is low, the dissociation rate of the gas introduced from the peripheral introducing unit 52 into the processing space S is suppressed to be lower than the dissociation rate of the gas supplied from the central introducing unit 50 to the processing space S. Further, when the electron density is adjusted by adjusting the power of the microwaves as described above, the dissociation rate of the gas may be adjusted.

Figure 6:
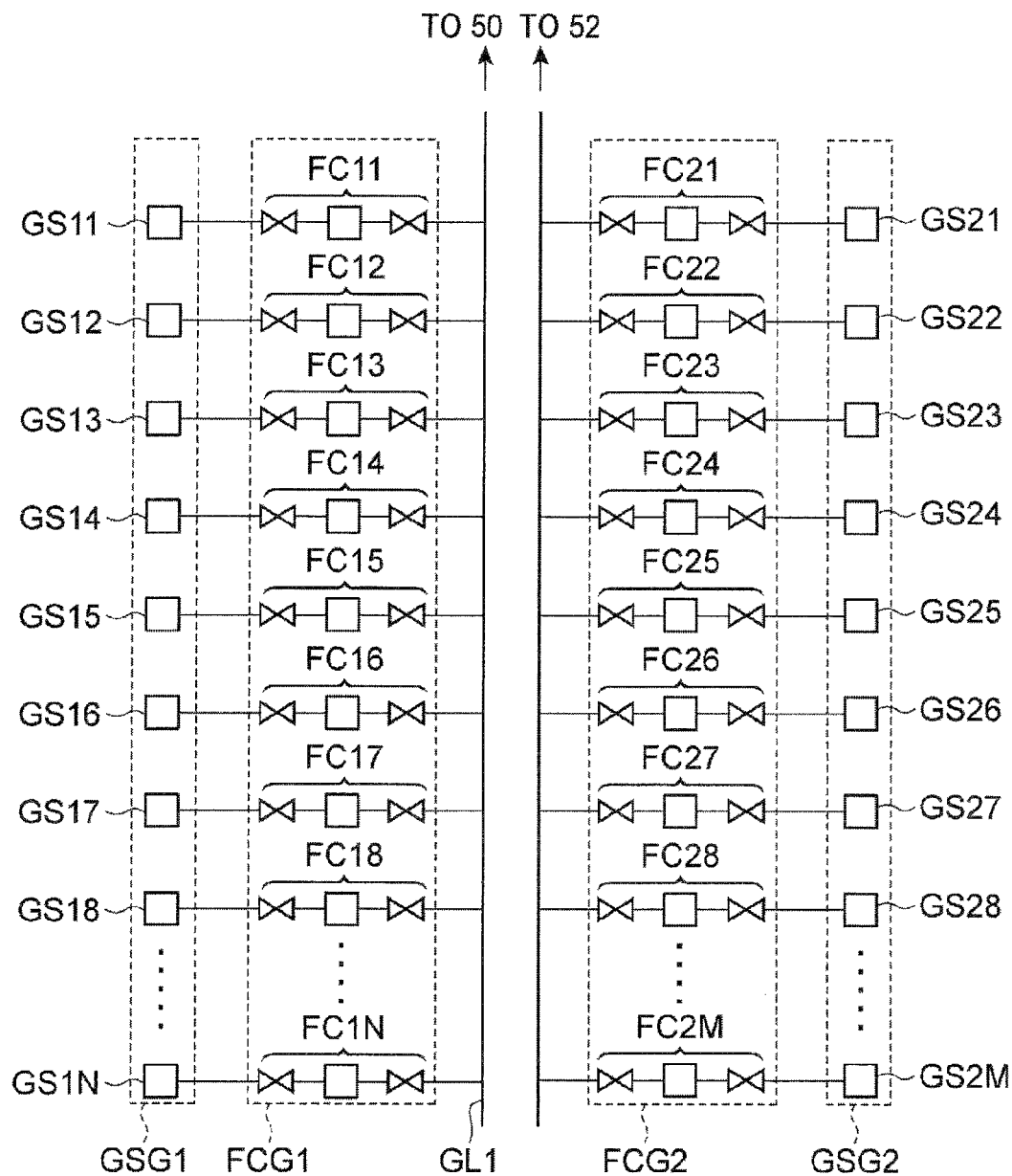
FIG. 6 is a diagram illustrating a gas supply system including a first flow rate control unit group, a first gas source group, a second flow rate control unit group, and a second gas source group.

The central introducing unit 50 is connected with a first gas source group GSG1 through a first flow rate control unit group FCG1. Further, the peripheral introducing unit 52 is connected with a second gas source group GSG2 through a second flow rate control unit group FCG2. FIG. 6 is a diagram illustrating a gas supply system including the first flow rate control unit group, the first gas source group, the second flow rate control unit group, and the second gas source group. As illustrated in FIG. 6, the first gas source group GSG1 includes a plurality of first gas sources GS11 to GS1N. Here, "N" is a symbol representing the total number. The first gas sources GS11 to GS18 are a source of Ar gas, a source of He gas, a source of $C_4F_6$ gas, a source of $O_2$ gas, a source of HBr gas, a source of $CF_4$, a source of $Cl_2$ gas, and a source of $N_2$ gas, respectively. The first gas source group GSG1 may further include sources of gases other than these gases.

The first flow rate control unit group FCG1 includes a plurality of first flow rate control units FC11 to FC1N. Each of the plurality of first flow rate control units FC11 to FC1N includes, for example, two valves and a flow rate controller provided between the two valves. The flow rate controller is, for example, a mass flow controller. The plurality of first gas sources GS11 to GS1N is connected to a common gas line GL1 through the plurality of first flow rate control units FC11 to FC1N, respectively. The common gas line GL1 is connected to the central introducing unit 50.

The second gas source group GSG2 includes a plurality of second gas sources GS21 to GS2M. Here, "M" is a symbol representing the total number. The second gas sources GS21 to GS28 are a source of Ar gas, a source of He gas, a source of $C_4F_6$ gas, a source of $O_2$ gas, a source of HBr gas, a source of $CF_4$, a source of $Cl_2$ gas, and a source of $N_2$ gas, respectively. The second gas source group GSG2 may further include sources of gases other than these gases.

The second flow rate control unit group FCG2 includes a plurality of second flow rate control units FC21 to FC2M. Each of the plurality of second flow rate control units FC21 to FC2M includes, for example, two valves and a flow rate controller provided between the two valves. The flow rate controller is, for example, a mass flow controller. The plurality of second gas sources GS21 to GS2M is connected to a common gas line GL2 through the plurality of second flow rate control units FC21 to FC2M, respectively. The common gas line GL2 is connected to the peripheral introducing unit 52.

As described above, in the plasma processing apparatus 10, the plurality of first gas sources and the plurality of first flow rate control units are provided exclusively for the central introducing unit 50, and, independently from the plurality of first gas sources and the plurality of first flow rate control units, the plurality of second gas sources and the plurality of second flow rate control units are provided exclusively for the peripheral introducing unit. Accordingly, the kinds of the gases introduced from the central introducing unit 50 into the processing space S and the flow rates of one or more gases introduced from the central introducing unit 50 into the processing space S may be independently controlled, and in addition, the kinds of the gases introduced from the peripheral introducing unit 52 into the processing space S and the flow rates of one or more gases introduced from the peripheral introducing unit 52 into the processing space S may be independently controlled.

For example, in the plasma processing apparatus 10, the ratio of the flow rate of reactive gas to the flow rate of the rare gas in the gases introduced from the peripheral introducing unit 52 into the processing space S may be set to be larger than the ratio of the flow rate of the reactive gas to the flow rate of the rare gas in the gases introduced from the central introducing unit 50 into the processing space S. Further, the flow rate of the reactive gas introduced from the peripheral introducing unit 52 into the processing space S may be set to be higher than the flow rate of the reactive gas introduced from the central introducing unit 50 into the processing space S. For example, the rare gas may be introduced from the central introducing unit 50 into the processing space S, and then, the reactive gas may be introduced from the peripheral introducing unit 52 into the processing space S. Therefore, in the plasma processing apparatus 10, active species of more reactive gases may be supplied to the periphery of the wafer W without being deactivated. Accordingly, the deviation of the processing speed in the entire region in the radial direction of the wafer W may be reduced.

Meanwhile, in the etching of the silicon oxide film, $C_4F_6$ gas may be used as the reactive gas. $C_4F_6$ gas becomes a deposition gas for polysilicon. Further, in the etching of the polycrystalline silicon, HBr gas, or $CF_4$ gas and/or $Cl_2$ gas may be used as the reactive gas.

In an exemplary embodiment, the plasma processing apparatus 10 may further include a control unit Cnt as illustrated in FIG. 1. The control unit Cnt may be a controller such as, for example, a programmable computer device. The control unit Cnt may control the respective parts of the plasma processing apparatus 10 in accordance with a program based on a recipe.

For example, the control unit Cnt may control the kinds and the flow rates of the gases supplied to the central introducing unit 50 by sending a control signal to the plurality of first flow rate control unit FC11 to FC1N. Further, the control unit Cnt may control the kinds and the flow rates of the gases supplied to the peripheral introducing unit 50 by sending a control signal to the plurality of second flow rate control unit FC21 to FC2M. Further, the control unit Cnt may supply a control signal to the microwave generator 32, the high frequency power supply RFG, and the exhaust device 30 so as to control the power of the microwaves, the power and ON/OFF of RF bias, and the pressure in the processing container 12. Furthermore, the control unit Cnt may send a control signal to a heater power supply connected to the heaters HT, HS, HC, and HE to adjust the temperatures of the heaters.

In an exemplary embodiment, the peripheral introducing unit 52 may further include an annular pipe 52p. The pipe 52p includes a plurality of peripheral introducing ports 52i formed therein. The annular pipe 52p may be made of, for example, quartz. As illustrated in FIG. 1, the annular pipe 52p is provided along the inner wall of the sidewall 12a in an exemplary embodiment. In other words, the annular pipe 52p is not disposed on a path connecting the lower surface of the dielectric window 18 and the placement region MR, that is, the wafer W. Therefore, the annular pipe 52p does not obstruct the diffusion of the plasma. Further, since the annular pipe 52p is provided along the inner wall of the sidewall 12a, consumption of the annular pipe 52p by the plasma may be suppressed, so that the frequency of replacement of the annular pipe 52p is reduced. Further, since the annular pipe 52p is provided along the sidewall 12a of which the temperature is controllable by the heaters, the temperature stability of the gases introduced from the peripheral introducing unit 52 into the processing space S may be improved.

Figure 7:
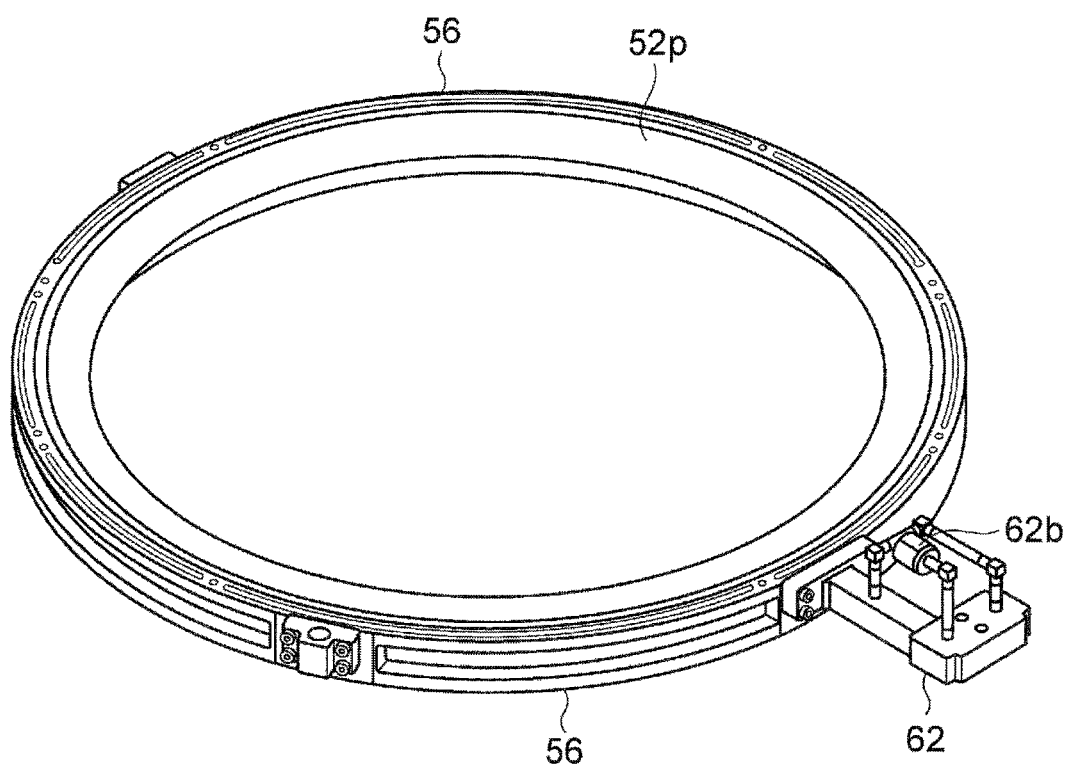
FIG. 7 is a perspective view illustrating an annular pipe of a peripheral introducing unit and its support structure.
Figure 8:
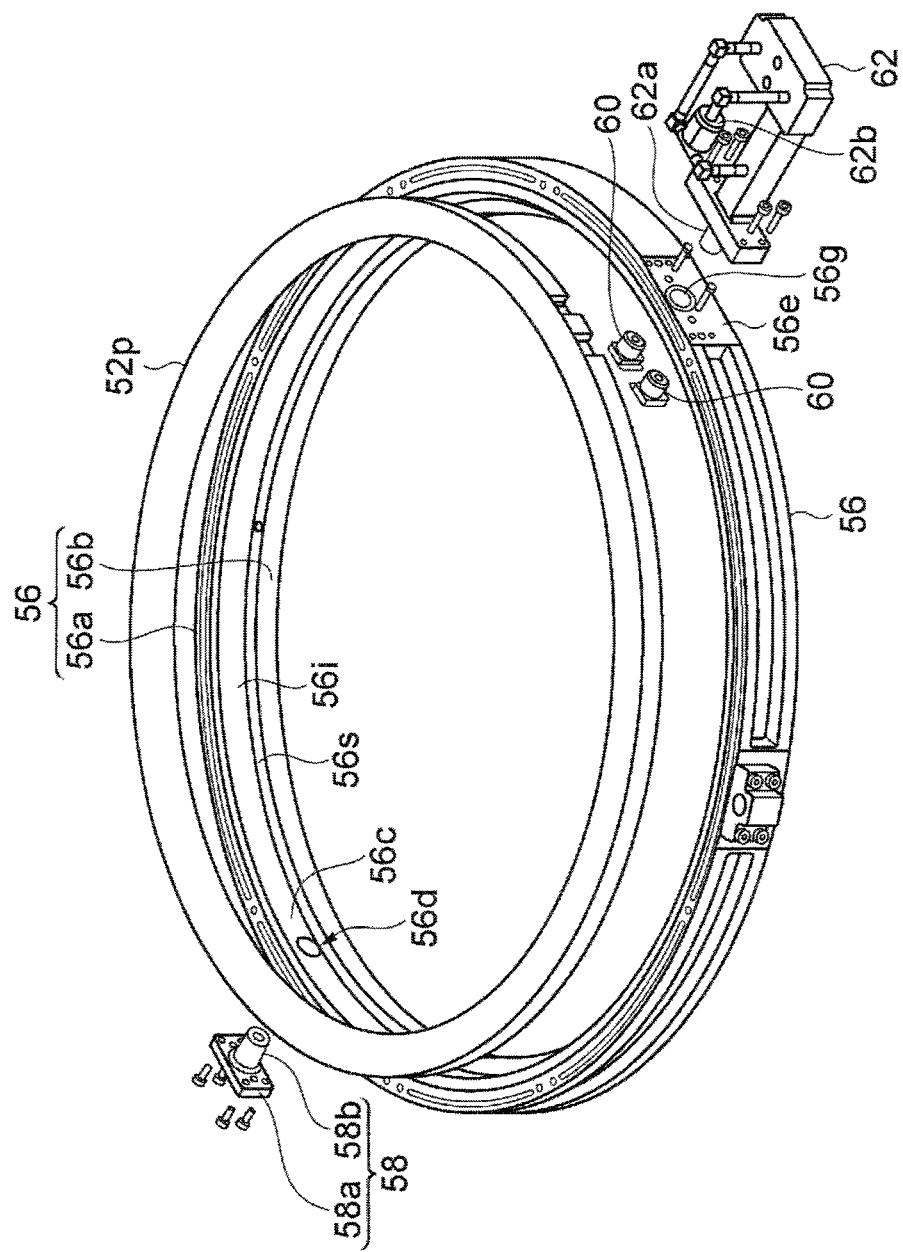
FIG. 8 is an exploded perspective view illustrating the annular pipe of the peripheral introducing unit and its support structure.
Figure 9:
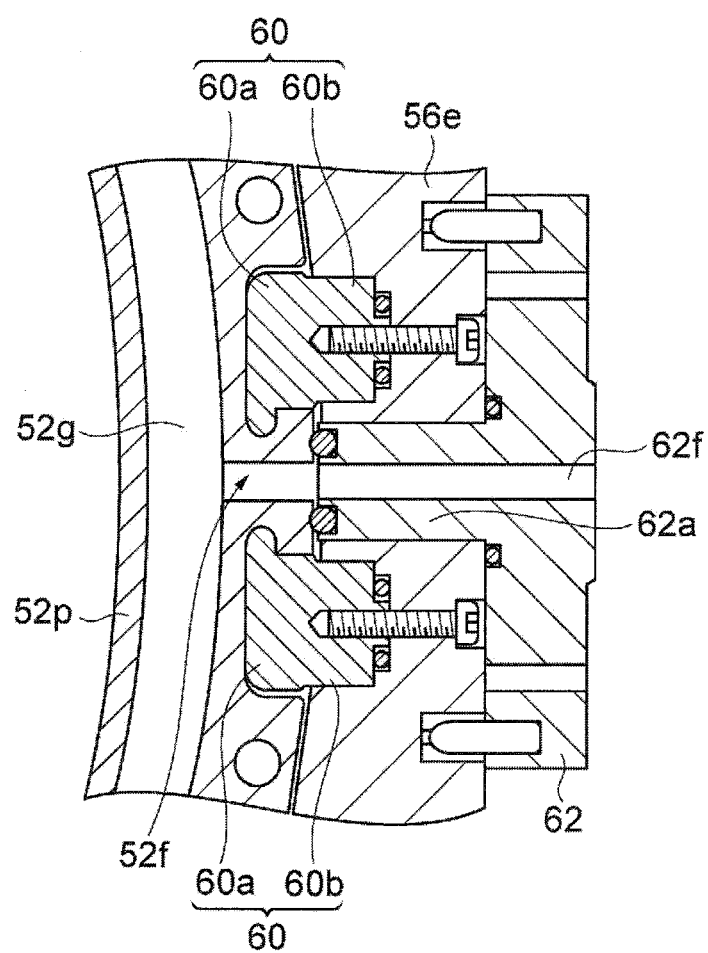
FIG. 9 is a cross-sectional view illustrating the annular pipe and a gas supply block.

FIG. 7 is a perspective view illustrating the annular pipe of the peripheral introducing unit and its support structure. FIG. 8 is an exploded perspective view illustrating the annular pipe of the peripheral introducing unit and its support structure. FIG. 9 is a cross-sectional view illustrating the annular pipe and a gas supply block. As illustrated in FIGS. 7 to 9, in an exemplary embodiment, the plasma processing apparatus 10 may further include a support member 56 that supports the annular pipe 52p.

The support member 56 has an annular shape, and may be made of, for example, aluminum whose surface is subjected to an alumite treatment. The support member 56 includes an upper portion 56a and a lower portion 56b. The inner diameter of the upper portion 56a of the support member 56 is smaller than the inner diameter of the lower portion 56b. Therefore, in the support member 56, an annular surface 56s facing upward is provided between the upper portion 56a and the lower portion 56b. The annular surface 56s extends along the lower surface of the annular pipe 52p and an inner surface 56i of the upper portion 56a extends along the outer peripheral surface of the annular pipe 52p, so that the annular pipe 52p is supported by the support member 56.

Further, the plasma processing apparatus 10 may further includes fixing members 58, 60 that fix the annular pipe 52p to the support member 56, and a gas supply block 62 that connects the annular pipe 52p and the common gas line GL2. Specifically, a through-hole 56d extending in the radial direction is formed in a first portion 56c, which is a part of the support member 56. A columnar pressing portion 58b of the fixing member 58 is inserted into the through-hole 58b. The fixing member 58 includes a plate-shaped base portion 58a connected to a base end of the pressing portion 58b. The base portion 58a is in contact with the outer peripheral surface of the support member 56 and screwed to the support member 56. When the base portion 58a is screwed to the support member 56, the front end of the pressing portion 58b comes into contact with the outer peripheral surface of the annular pipe 52p. Accordingly, the annular pipe 52p is pressed in the radial direction of the support member 56 so as to be pushed against a second portion 56e of the support member 56 that faces the first portion 56c in the radial direction.

The annular pipe 52p includes two grooves formed at an opposite side to a portion in contact with the fixing member 58. Engaged portions 60a of two fixing members 60 are inserted into the grooves, respectively. Accordingly, the fixing members 60 are engaged to the annular pipe 52p. Further, the two fixing members 60 include protrusions 60b that protrude outward from the outer peripheral surface of the annular pipe 52p. The protrusions 60b of the fixing members 60 include screw holes formed therein. The protrusions 60b of the fixing members 60 are accommodated in grooves formed in the inner peripheral surface of the second portion 56e of the support member 56. The second portion 56e of the support member 56 includes holes formed therein, which extend inward from the outer peripheral surface of the second portion 56e. The holes are connected to the grooves accommodating the protrusions 60b in the second portion 56e. When screws are inserted into the holes of the second portion 56e of the support member 56 and fixed to the screw holes of the protrusions 60b of the fixing members 60, the annular pipe 52p is fixed to the support member 56 by the fixing members 60.

In the annular pipe 52p, a gas line 52f extending in the radial direction is formed between two grooves that accommodate the engaged portions 60a of the fixing members 60. One end of the gas line 52f is connected to an annular gas line 52g formed in the annular pipe 52p, and the other end of the gas line 52f extends to the outer peripheral surface of the annual pipe 52p. Further, the second portion 56e of the support member 56 includes a through-hole 56g extending in the radial direction to the outer peripheral surface of the support member 56 at a position facing the other end of the gas line 52f. A first port 62a of the gas supply block 62 is inserted into the through-hole 56g. The gas supply block 62 includes a gas line 62f extending from the front end of the first port to a second port 62b. The second port 62b is connected to the common gas line GL2. As the gas supply block 62 is fixed to the outer peripheral surface of the support member 56, the front end of the first port 62a and the outer peripheral surface of the annular pipe 52p are in contact with each other, so that the gas line 52f and the gas line 62f are connected. Meanwhile, a sealing member such as, for example, an O-ring may be provided to surround the connecting portion of the gas line 52f and the gas line 62f.

A peripheral introduction assembly including the annular pipe 52p and the support member 56 configured as described above is inserted into a groove formed in the inner wall of the sidewall 12a as illustrated in FIG. 1. As described above, the annular pipe 52p is mounted on the single support member 56, and fixed to the support member 56 by the fixing members 58, 60. Since the supporting structure of the annular pipe 52p is configured with such a small number of parts, the plasma processing apparatus 10 is excellent in maintainability with respect to the annular pipe 52a and its supporting structure. Further, the supporting structure of the annular pipe 52p is realized at a low cost.

Figure 10:
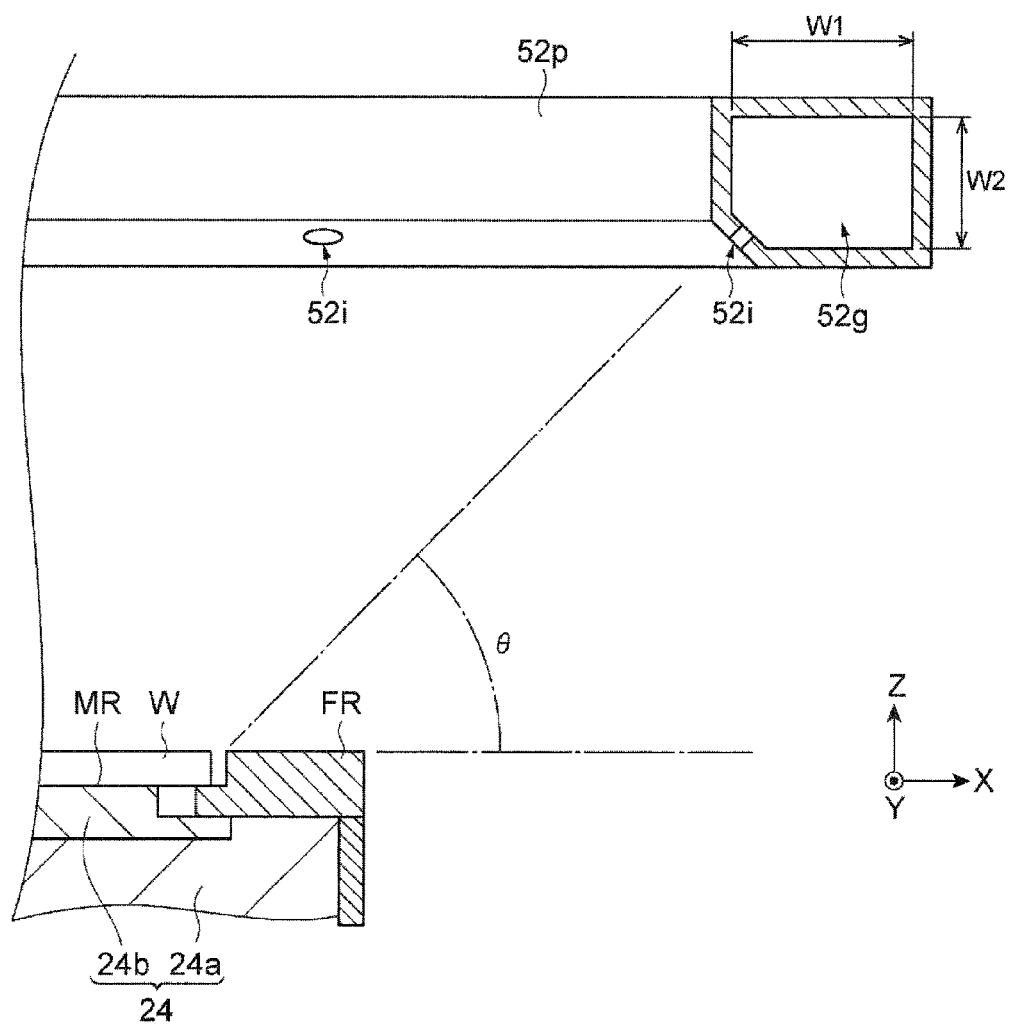
FIG. 10 is a cross-sectional view illustrating a peripheral introduction port of the peripheral introducing unit and a wafer in an enlarged scale.

FIG. 10 is a cross-sectional view illustrating a peripheral introduction port of the peripheral introducing unit and a wafer W in an enlarged scale. In an exemplary embodiment, the cross-sectional shape of the gas line 52g in the annular pipe 52p is configured such that one of the width in the radial direction and the width in the axis Z direction is larger than the other width. In the exemplary embodiments illustrated in FIGS. 1 and 10, the width W1 in the radial direction of the gas line 52g in the annular pipe 52p is set to be larger than the width W2 in the height direction of the gas line 52g in the annular pipe 52p. The pressures of the gas supplied to the annular pipe 52p may drop while the gas flows within the annular pipe 52p. In the present exemplary embodiment, the pressure loss in the annular pipe 52p may be reduced by the annular pipe 52p having such a cross-sectional shape. Accordingly, the deviation of the flow rate of the gas injected from the plurality of peripheral introduction ports 52i may be reduced.

Further, in an exemplary embodiment, the plurality of peripheral introduction ports 52i is opened towards the periphery of the wafer W. That is, the plurality of peripheral introduction ports 52i is inclined at an angle θ with respect to a plane orthogonal to the axis Z so as to inject a gas towards the periphery of the wafer W. The angle θ is determined depending on a distance in the radial direction between the periphery of the wafer W or the placement region MR and a peripheral introduction port 52i, and a distance in the axis Z direction between the wafer W or the placement region MR and the peripheral introduction port 52i. For example, the angle θ is determined in a range of 30° to 50°. In an example, the distance in the axis Z direction between the wafer W or the placement region MR and the peripheral introduction port 52i is 90 mm, and the angle θ is 45°. Since the peripheral introduction port 52i is opened obliquely towards the periphery of the wafer W, active species of the reactive gas injected from the peripheral introduction port 52i are directed towards the periphery of the wafer W. Therefore, the active species of the reactive gas may be supplied to the periphery of the wafer W without being deactivated. As a result, the deviation in processing speed between respective regions in the radial direction of the wafer W may be reduced.

Figure 11:
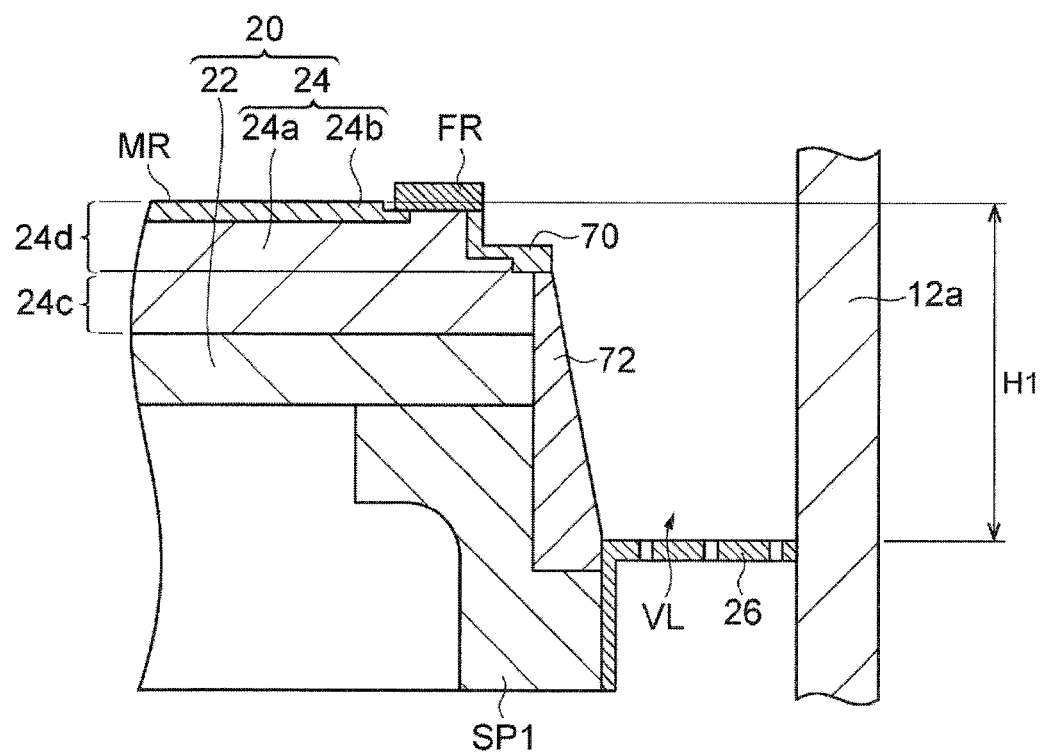
FIG. 11 is a cross-sectional view illustrating the vicinity of an outer edge of a placing table in an enlarged scale.

FIG. 11 is a cross-sectional view illustrating the vicinity of an outer edge of the placing table 20 in an enlarged scale. Generally, a placing table assembly including the placing table and an member accompanied thereto such as, for example, a focus ring FR, extends radially to the outside of the wafer W. Therefore, the placing table assembly is an obstacle to the diffusion of the plasma to the periphery of the wafer W. In order to reduce the deviation of the processing speed in the radial direction of the wafer W, it is necessary to diffuse the plasma up to the vicinity of the periphery of the wafer W. Accordingly, in an exemplary embodiment, the diameter of the placing table assembly including the placing table 20 and the focus ring FR is set to be 110% or less of the diameter of the wafer W. An example of such a placing table assembly is realized by the exemplary embodiment illustrated in FIG. 11.

As illustrated in FIG. 11, in an exemplary embodiment, the electrostatic chuck 24 includes a lower portion 24c and an upper portion 24d positioned above the lower portion 24c to provide the placement region MR. The upper portion 24d includes an upper region of the base plate 24a and the chuck 24b. The upper portion 24d has a diameter reduced to be smaller than a diameter of the lower portion 24c. The electrostatic chuck 24 having such a configuration has a stepped outer peripheral surface whose diameter is reduced at its upper side. The plate 22 has approximately the same diameter as that of the lower portion 24c of the electrostatic chuck 24 and provides an outer peripheral surface continuous with the outer peripheral surface of the lower portion 24c of the electrostatic chuck 24.

In the electrostatic chuck 24, the focus ring FR is provided in an outer edge region of the top surface of the base plate 24a.

The chuck 24b is provided on the top surface of the base plate 24a in a region surrounded by the outer edge region of the base plate 24a. Therefore, the placement region MR is surrounded by the focus ring FR. The outer edge of the focus ring FR slightly projects radially outwardly from the outer edge of the top surface of the base plate 24a. Further, an insulating member made of a material such as, for example, quartz is formed on the outer peripheral surface of the electrostatic chuck 24 and the outer peripheral surface of the plate 22. In the exemplary embodiment illustrated in FIG. 11, an insulating member 70 extends from the bottom surface of the outer edge of the focus ring FR along the outer peripheral surface of the upper portion 24d of the electrostatic chuck 24. The outer peripheral surface of the insulating member 70 has a shape following the outer peripheral surface of the upper portion 24d of the electrostatic chuck 24 and comes in contact with the exhaust path VL. Further, an insulating member 72 extends along the outer peripheral surface of the lower portion 24c of the electrostatic chuck 24 and the outer peripheral surface of the plate 22. The outer peripheral surface of the insulating member 72 also comes in contact with the exhaust path VL.

As described above, the upper portion 24d of the electrostatic chuck 24 has a diameter smaller than that of the lower portion 24c, and the focus ring FR slightly projects radially outwardly from the outer edge of the top surface of the base plate 24a so as to be continuous with the insulating member 70. In this configuration, since the diameter of the focus ring FR is smaller, the plasma may be diffused around the focus ring FR. For example, the outer diameter (diameter) of the focus ring FR is 330 mm. Accordingly, the plasma may be diffused up to the vicinity of the periphery of the wafer W. According to the exemplary embodiment illustrated in FIG. 11, a distance from the outer peripheral surface of the placing table assembly including the focus ring FR and the insulating members 70, 72 to the sidewall 12a is set to be large. As a result, a radially large space, that is, the exhaust path VL may be secured between the sidewall 12a and the outer peripheral surface of the placing table assembly and the diffusion of the plasma in the exhaust path VL may be facilitated.

Further, the baffle plate 26 is provided at a distance H1 of 80 mm or more downward from the placement region MR in the axis Z direction. In the exemplary embodiment illustrated in FIG. 11, the baffle plate 26 is provided downward from the electrostatic chuck 24 and the plate 22 in order to secure the distance H1 of 80 mm or more. By adopting such a configuration in which the baffle plate 26 is separated at the large distance H1 downwardly from the placement region MR, a large space, that is, the exhaust path VL may be secured around the placing table assembly. Therefore, the diffusion of the plasma may be further facilitated in the exhaust path VL.

The exhaust path VL extends annularly around the placing table 20. As illustrated in FIG. 1, the exhaust port 28h is formed below the exhaust path VL through the baffle plate 26. That is, the exhaust port 28h is not positioned below the center of the placing table 20, but is formed at a positon biased in the radial direction from the center of the placing table 20. This is because the above-mentioned power feeding rod PFR extends in the axis Z direction below the center of the placing table 20. Therefore, the distance from the periphery of the wafer W to the exhaust port 28h varies depending on the position of the periphery of the wafer W. However, since the plasma processing apparatus 10 has a configuration in which the baffle plate 26 is separated by the large distance H1 downwardly form the placement region MR, a length of a stream line from the periphery of the wafer W to the baffle plate 26 may be set large. As a result, the difference of the gas flow in the circumferential direction is reduced in the periphery of the wafer W, and hence, the gas flow around the wafer W becomes uniform in the circumferential direction.

Hereinafter, descriptions will be made on the plasma processing method which may be performed using the above-mentioned plasma processing apparatus 10. This method includes step Sa. In step Sa, a first gas is supplied into the processing container 12 from the central introducing unit 50, and a second gas is supplied into the processing container 12 from the peripheral introducing unit 52. Further, in step Sa, energy of microwaves is introduced into the processing container 12 from the antenna 12 through the dielectric window 18. Accordingly, in step Sa, the wafer W placed on the placing table 20 is etched.

In step Sa, a ratio of a flow rate of a reactive gas to a flow rate of a rare gas in the second gas is set to be larger than a ratio of a reactive gas to a flow rate of a rare gas in the first gas. Further, in step Sa, the flow rate of the reactive gas in the second gas is set to be higher than the flow rate of the reactive gas in the first gas. For example, the first gas may include a rare gas only, and the second gas may include a reactive gas only. The rare gas may be, for example, Ar gas or He gas, and the reactive gas may be $C_4F_6$ gas for a silicon oxide ($SiO_2$) layer. Further, the reactive gas may be HBr gas, or CF gas and/or $Cl_3$ gas for a polycrystalline silicon layer.

Step Sa may be performed under a control by the control Cnt of the plasma processing apparatus 10. That is, the first gas and the second gas may be supplied into the processing container 12 by controlling the plurality of flow rate control units FC11 to FC1N and the plurality of second flow rate control units FC21 to FC2M by the control unit Cnt.

Figure 12:
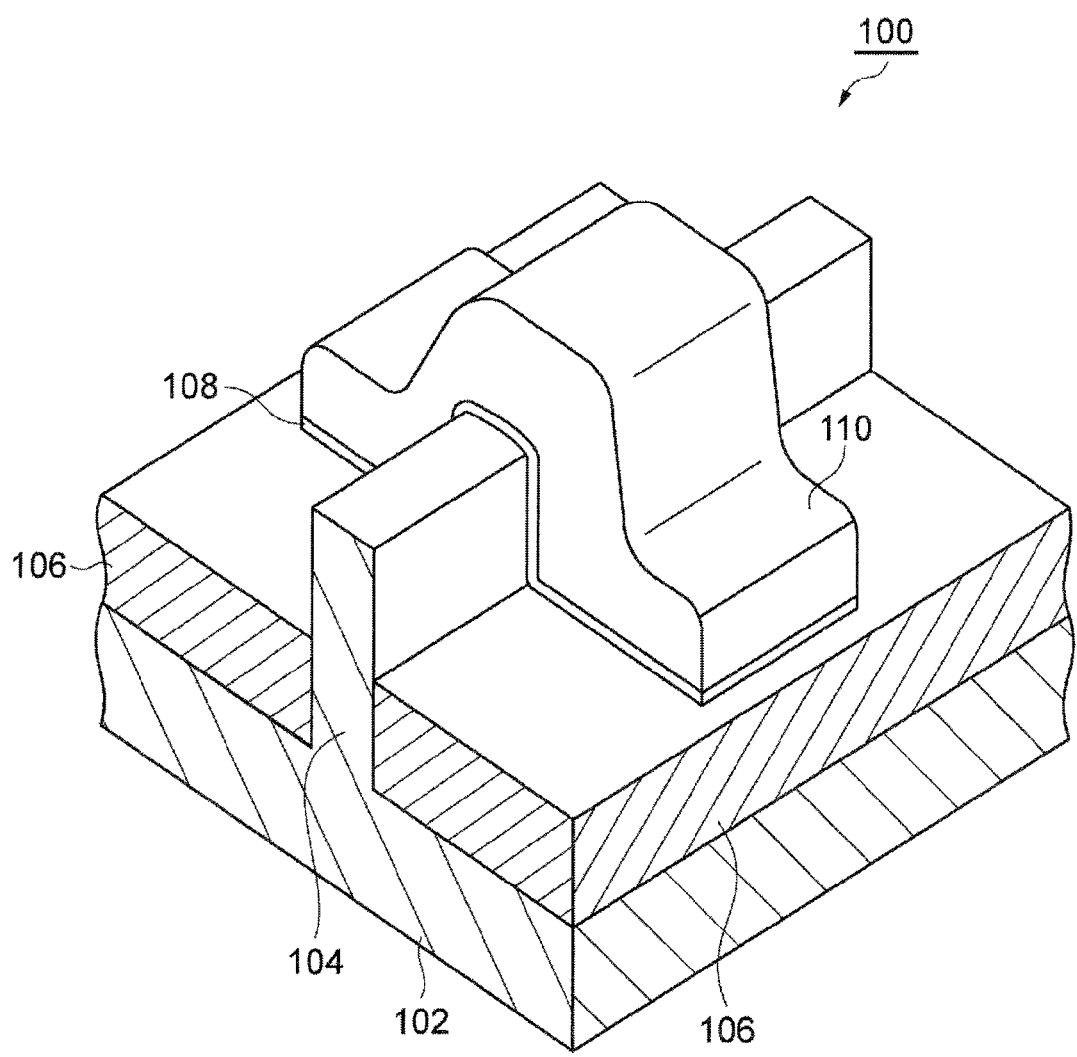
FIG. 12 is a perspective view illustrating an exemplary fin type field effect transistor.

Subsequently, an application example of the plasma processing method including step Sa will be described. The plasma processing method according to the first application example may be applied to an etching of $SiO_2$ layer in manufacturing a fin type field effect transistor. FIG. 12 is a perspective view illustrating an exemplary fin type field effect transistor. As illustrated in FIG. 12, a fin type field effect transistor 100 includes a substrate 102. The substrate 102 is made of, for example, Si. A polycrystalline silicon fin 104 is formed on a major surface of the substrate 102.

The fin 104 has a rectangular shape which is elongated in one direction. The fin 104 includes a source and a drain which are added with impurities, and has a channel between the source and the drain in the one direction. A $SiO_2$ layer 106 is formed at both sides of the fin 104 in the other direction orthogonal to the one direction. Further, a gate oxide film 108 is formed to cover the channel of the fin 104, and a gate 110 extends in the above other direction to cover the gate oxide film 108.

Figure 13:
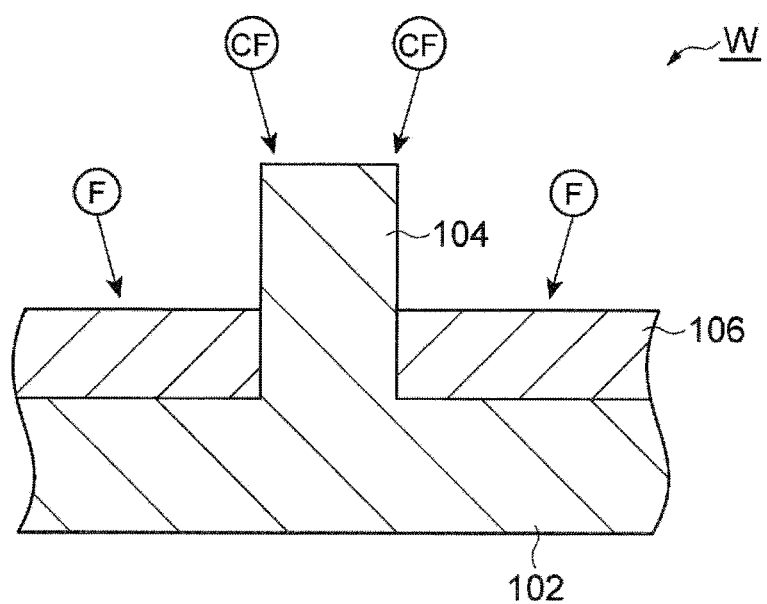
FIG. 13 is a view illustrating a step in a manufacture of the fin type field effect transistor.

FIG. 13 is a view illustrating a step in a manufacture of the fin type field effect transistor. As illustrated in FIG. 13, a step of etching the $SiO_2$ layer is performed after the $SiO_2$ layer is deposited to cover the fin 104 so as to expose the upper portion of the fin 104. Step Sa may be applied to the step illustrated in FIG. 13. Specifically, by using $C_4F_6$ gas as the reactive gas in step Sa, the $SiO_2$ layer 106 may be etched by the active species of fluorine dissociated from $C_4F_6$ gas, and simultaneously, the polycrystalline silicon fin 104 may be protected by fluorocarbon dissociated from $C_4F_6$ gas. That is, $C_4F_6$ gas may be used as a corrosive gas for the $SiO_2$ layer 106 and as a deposition gas for the polycrystalline silicon fin 104.

As described above, in step Sa, the ratio of the flow rate of a reactive gas to the flow rate of the rare gas in the second gas supplied from the peripheral introducing unit 52 is set to be larger than the ratio of the flow rate of the reactive gas ($C_4F_6$ gas) to the flow rate of the rare gas in the first gas supplied from the central introducing unit. Further, in step Sa, the flow rate of the reactive gas in the second gas is set to be higher than the flow rate of the reactive gas in the first gas. Therefore, according to step Sa, the active species of fluorine and fluorocarbon may be supplied to the periphery of the wafer W. Further, according to step Sa, the distribution of the etching rate of the polycrystalline silicon layer and the deposition rate onto the polycrystalline silicon layer in the radial direction may be adjusted by adjusting the flow rate of the rare gas in the first gas. Further, the distribution of the etching rate of the silicon oxide layer in the radial direction may be adjusted by adjusting the flow rate of $C_4F_6$ gas in the second gas. Therefore, according to step Sa, the distance between the height of the fin 104 itself and the height of the fin 104 exposed from the $SiO_2$ layer 106 may be reduced in the entire region in the radial direction including the center and the periphery of the wafer W.

Figure 14:
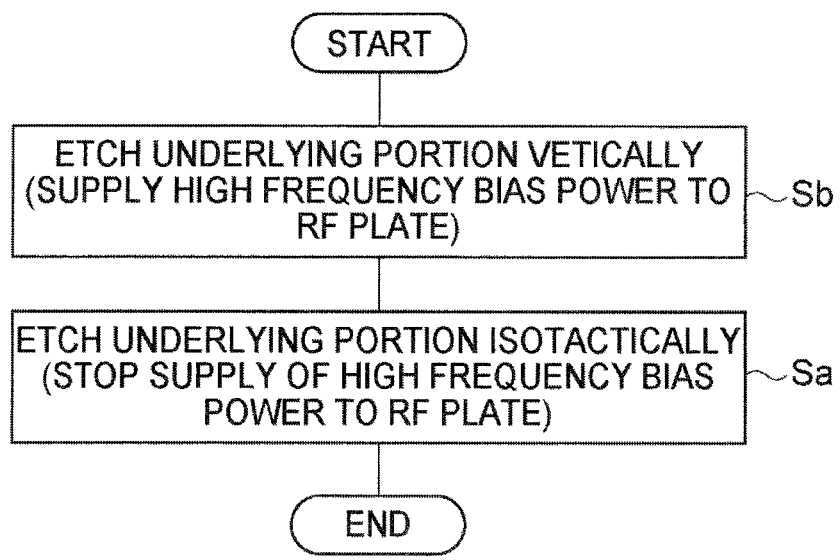
FIG. 14 is a flowchart illustrating an application example of a plasma processing method according to an exemplary embodiment.
Figure 15:
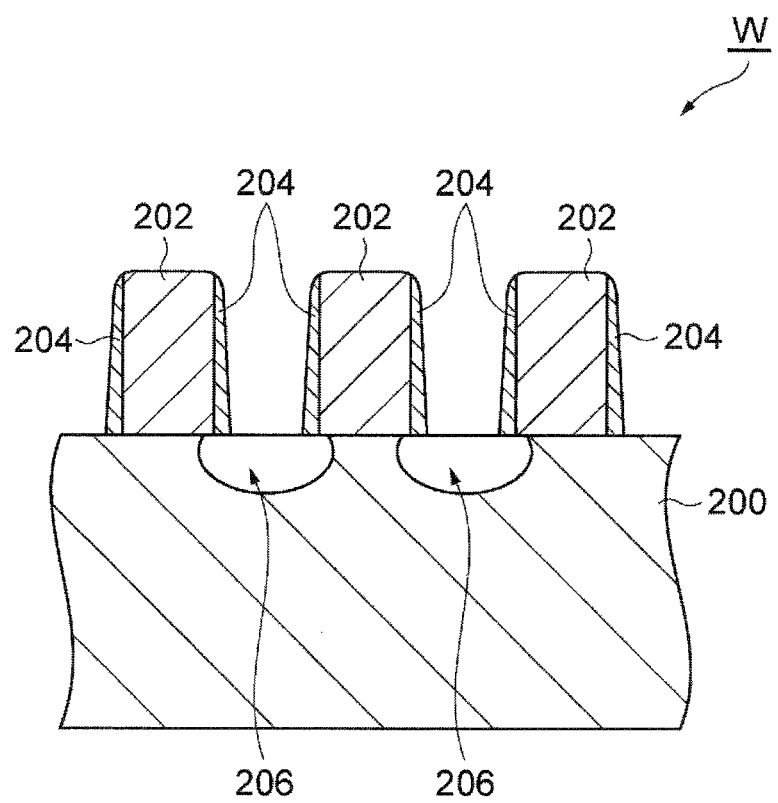
FIG. 15 is a view illustrating an exemplary substrate to which the plasma processing method illustrated in FIG. 14 is applicable.

Subsequently, a second application example will be described. FIG. 14 is a flowchart illustrating an application example of a plasma processing method according to an exemplary embodiment. The plasma processing method illustrated in FIG. 14 is applicable to a substrate in a state illustrated in FIG. 15. FIG. 15 is a view illustrating a state of a wafer W in an intermediate process in the manufacture of the fin type field effect transistor. The wafer W illustrated in FIG. 15 includes a plurality of gates 202 arranged on a main surface of a silicon (Si) substrate (underlying portion) 200. Further, sidewall spacer layers 204 are formed along the both sides of the plurality of gates 202. The sidewall spacer layers 204 are made of, for example, SiN. In the manufacture of the field effect transistor, in some cases, holes 206 are each formed in the Si substrate 200 below two sidewall spacers 204 provided between two adjacent gates 202, and the holes extend to portions under the sidewall spacers 204. To this end, it is necessary to etch the Si substrate 200 in a longitudinal direction, that is, the thickness direction, as well as, in the transverse direction. The plasma processing method of FIG. 14, which is able to be performed using the plasma processing apparatus 10, is suitable for such an etching. Meanwhile, after the holes 206 are formed, the holes 206 may be filled with silicon germanium which may be used to generate stress.

The plasma processing method illustrated in FIG. 14 includes step Sa and step Sb preceding step Sa. In step Sb, a reactive gas for etching the underlying portion is introduced into the processing container 12, energy of microwaves is introduced from the antenna 14 into the processing container through the dielectric window 18, and a high frequency bias power is applied to the plate 22 of the placing table 20. Accordingly, active species of atoms or molecules contained in the reactive gas is generated in the processing container 12. Then, the Si substrate 200 is etched mainly in the longitudinal direction, that is, in the thickness direction below a portion between two spacer layers 204 interposed between two adjacent gates 200. Meanwhile, the reactive gas used in step Sb may be $CF_4$ gas or HBr gas.

The plasma processing method illustrated in FIG. 14, step Sb is followed by step Sa. In step Sa, a first gas is introduced into the processing container 12 from the central introducing unit 50, a second gas is introduced into the processing container 12 from the peripheral introducing unit 52, and energy of microwaves is introduced into the processing container 12 from the antenna 14 through the dielectric window 18. Further, in step Sa, no high frequency bias power is applied to the plate 22 of the placing table 20. Since step Sa is performed with no bias, the Si substrate 200 is etched isotropically, that is, also in the transverse direction below a portion between two spacer layers 204 interposed between two adjacent gates 200, by the active species of the atoms or molecules contained in the reactive gas. Meanwhile, the reactive gas in step Sa may be either HBr gas, or $CF_4$ gas and $Cl_2$ gas.

As described above, in step Sa, a ratio of the flow rate of the reactive gas to the flow rate of the rare gas in the second gas supplied from the peripheral introducing unit 52 is set to be larger than the ratio of the flow rate of the reactive gas to the flow rate of the rare gas in the first gas supplied from the central introducing unit 50. Further, in step Sa, the flow rate of the reactive gas in the second gas is set to be higher than the flow rate of the reactive gas in the first gas. Therefore, according to step Sa, a large amount of radicals may be supplied to the periphery of the wafer W without being deactivated. As a result, the holes 206 may be formed in the entire region in the radial direction including the center and the periphery of the wafer W so as to extend in the transverse direction.

The plasma processing method illustrated in FIG. 14 may be performed under a control of the control unit Cnt in the plasma processing apparatus 10. In this case, the control unit Cnt performs a first control and a second control. The first control is for performing step Sb. In the first control, the control unit Cnt controls the plurality of first flow rate control units FC11 to FC1N and the plurality of second flow control units FC21 to FC2M such that a gas containing the rare gas and the reactive gas for etching the substrate 200 is supplied into the processing container 12. Further, the control unit Cnt controls the microwave generator 32 such that the energy of the microwaves is introduced into the processing container 12 through the dielectric window 18. Further, the control unit Cnt controls the high frequency power supply RFG such that the high frequency bias power is applied to the plate 22 of the placing table 20.

The second control is for performing step Sa. In the second control, the control unit Cnt controls the plurality of first flow rate control units FC11 to FC1N and the plurality of second flow control units FC21 to FC2M such that the first gas and the second gas are supplied from the central introducing unit 50 and the peripheral introducing unit 52, respectively. Further, the control unit Cnt controls the microwave generator 32 such that energy of microwaves is introduced into the processing container 12 through the dielectric window 18. Furthermore, the control unit Cnt controls the high frequency power supply RFG such that the supply of the high frequency bias power to the plate 22 of the placing table 20 is stopped.

Hereinafter, descriptions will be made on various simulations for evaluating the plasma processing apparatus 10.

(Simulation 1)

In Simulation 1, a distribution of an electron density of Ar plasma at 5 mm above the placing table MR was obtained by changing the diameter of the annular pipe 52p of the peripheral introducing unit 52 as a parameter, and a deviation of the electron density in the electron density distribution was obtained. In Simulation 1, the inner diameter of the processing container 12 was set to 540 mm, and the distance in the axis Z direction between the annular pipe 52p and the placement region MR was set to 90 mm. Further, in Simulation 1, the pressure in the processing container 12 was set to 20 mTorr (2.666 Pa) and 100 mTorr (13.33 Pa). The deviation of the electron density was calculated by the following Equation (2):

$$NeU=(NeMax-NeMin)/(2\times NeAve) \quad (2)$$

Here, NeU represents a deviation of the electron density, NeMax represents a maximum of the electron density, NeMin represents a minimum of the electron density, and NeAve represents an average of the electron density.

Figure 16:
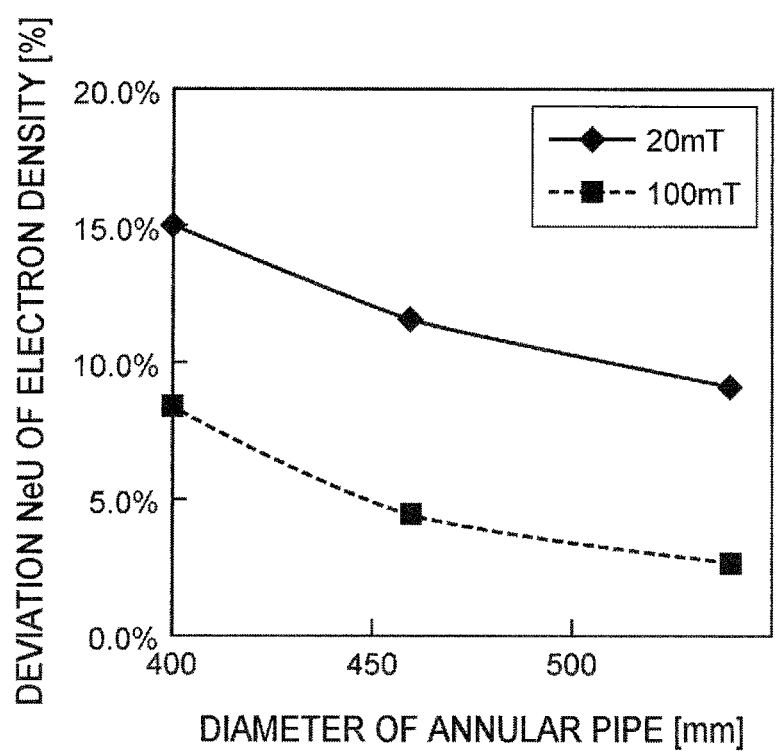
FIG. 16 is a graph illustrating a result of Simulation 1.

FIG. 16 is a graph illustrating the results of Simulation 1. In FIG. 16, the horizontal axis represents a diameter of the annular pipe 52p, and the vertical axis represents a deviation NeU (%) of the electron density. As illustrated in FIG. 16, it has been found that regardless of the pressure in the processing container 12, the deviation NeU of the electron density is decreased as the diameter of the annular pipe 52p is increased. From the results, it has been found that the deviation of the plasma density distribution just above the placement region MR may be reduced by providing the annular pipe 52p along the inner wall of the sidewall 12a of the processing container 12.

(Simulation 2)

In Simulation 2, a distribution of an electron density of Ar plasma at 5 mm above the placing table MR was obtained by changing the diameter of the placing table as a parameter, and a deviation of the electron density in the electron density distribution was obtained. In Simulation 2, "the diameter of the placing table" is a diameter of the contour of the placing table assembly including the placing table 20, the focus ring FR, and the insulating members 70, 72. Meanwhile, in Simulation 2, the inner diameter of the processing container 12 was set to 540 mm, the diameter of the annular pipe 52p was set to 540 mm, and the distance in the axis Z direction between the annular pipe 52p and the placement region MR was set to 90 mm. Further, in Simulation 2, the pressure in the processing container 12 was set to 20 mTorr (2.666 Pa) and 100 mTorr (13.33 Pa). Further, the deviation of the electron density was calculated using Equation (2).

Figure 17:
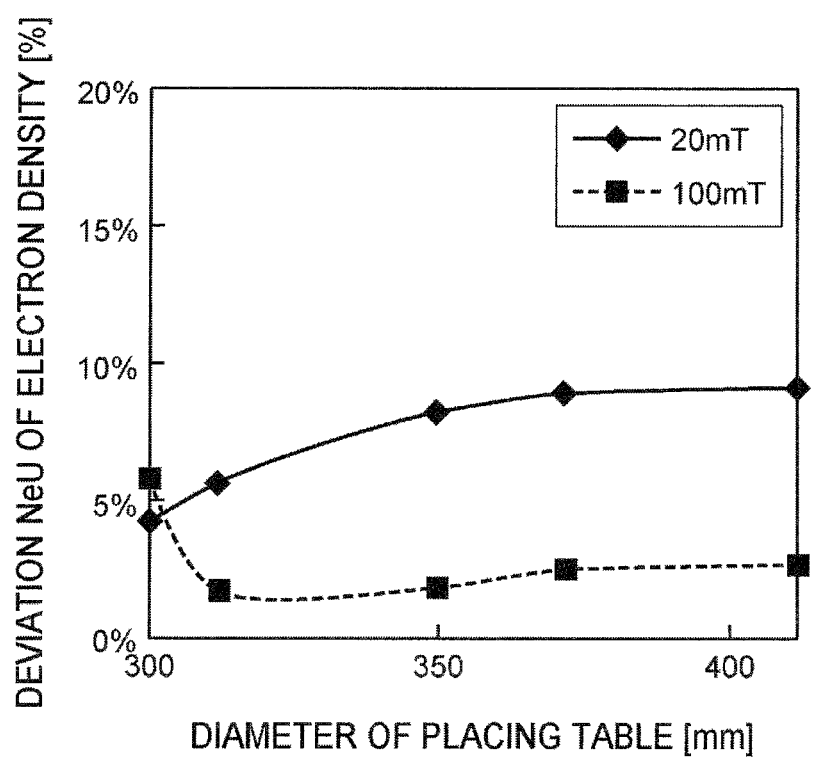
FIG. 17 is a graph illustrating a result of Simulation 2.

FIG. 17 is a graph illustrating the results of Simulation 2. In FIG. 17, the horizontal axis represents a diameter of the placing table, and the vertical axis represents a deviation NeU (%) of the electron density. As illustrated in FIG. 17, it has been found that regardless of the pressure in the processing container 12, the deviation NeU of the electron density is decreased as the diameter of the contour of the placing table assembly is decreased. Further, assuming a wafer W having a diameter of 300 mmφ, it has been found that the deviation of the plasma density distribution just above the placement region MR may be reduced by setting the diameter of the contour of the placing table assembly to 110% or less of the diameter of the wafer W, that is, 330 mm or less.

(Simulations 3 and 4 and Simulations 5 to 7)

In Simulations 3 and 4, a distribution of a molar concentration of HBr at 5 mm above the placing table MR was calculated by changing the kind and flow rate of the gas introduced into the processing container 12 from the central introducing unit 50 and the peripheral introducing unit 52 as parameters. Other conditions of Simulations 3 and 4 are as follows.

<Conditions of Simulations 3 and 4>

Inner diameter of the processing container 12 in Simulations 3 and 4: 540 mm

Distance between the lower surface of the dielectric window 18 and the placement region MR in Simulations 3 and 4: 245 mm Diameter of the annular pipe 52p in Simulations 3 and 4: 540 mm Distance between the annular pipe 52p and the placement region MR in Simulations 3 and 4: 90 mm Angle (θ) of the peripheral introduction ports 52i in Simulations 3 and 4: 45°

Flow rate of HBr gas of the central introducing unit 50 in Simulation 3: 800 sccm Flow rate of Ar gas of the peripheral introducing unit 52 in Simulation 3: 1,000 sccm Flow rate of Ar gas of the central introducing unit 50 in Simulation 4: 1,000 sccm Flow rate of HBr gas of the peripheral introducing unit 52 in Simulation 4: 800 sccm In Simulations 5 to 7, a distribution of a molar concentration of HBr at 5 mm above the placing table MR was calculated by setting the diameter of the annular pipe 52p to 528 mm, providing the peripheral introducing ports 52i opened horizontally towards the axis Z, and introducing the same gas into the processing container 12 from the central introducing unit 50 and the peripheral introducing unit 52 while changing its distribution ratio. Other conditions of Simulations 5 to 7 are as follows.

<Conditions of Simulations 5 to 7>

Inner diameter of the processing container 12 in Simulations 5 to 7: 540 mm

Distance between the lower surface of the dielectric window 18 and the placement region MR in Simulations 5 to 7: 245 mm Distance between the annular pipe 52p and the placement region MR in Simulations 5 to 7: 90 mm Flow rate of Ar gas/flow rate of HBr gas: 1,000 sccm/800 sccm Gas distribution ratio (the central introduction unit to the peripheral introduction unit) in Simulation 5: 5 to 95

Gas distribution ratio (the central introduction unit to the peripheral introduction unit) in Simulation 6: 30 to 70

Gas distribution ratio (the central introduction unit to the peripheral introduction unit) in Simulation 7: 90 to 10

Figure 18:
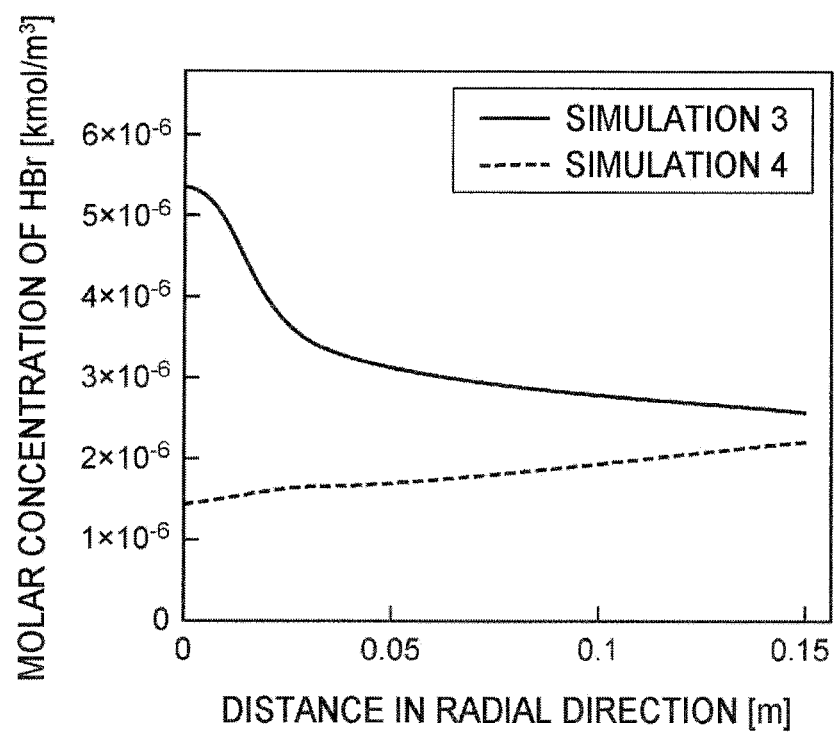
FIG. 18 is a graph illustrating results of Simulations 3 and 4.
Figure 19:
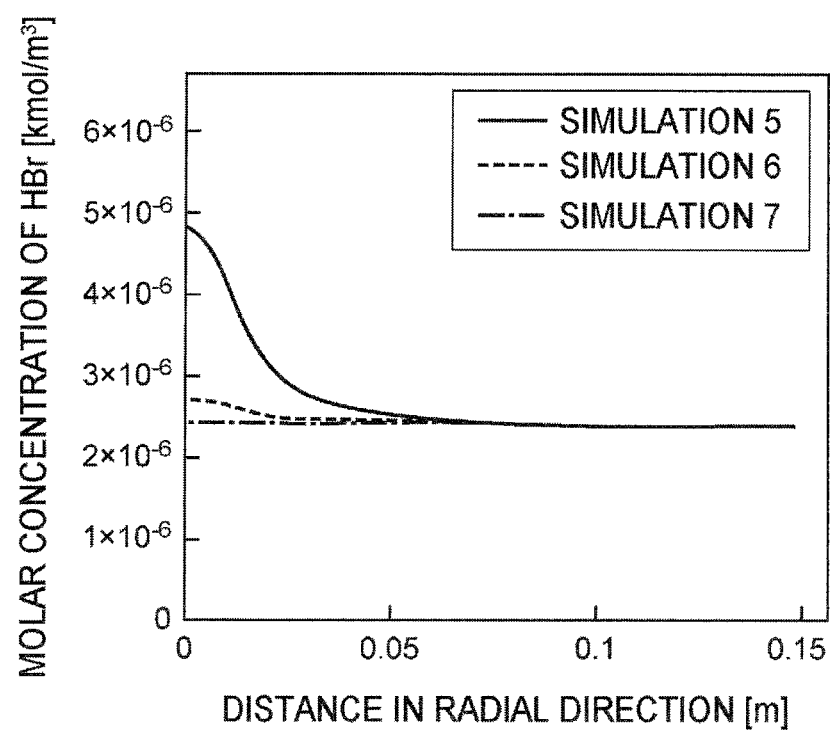
FIG. 19 is a graph illustrating results of Simulations 5 to 7.

The results of Simulations 3 and 4 are illustrated in FIG. 18, and the results of Simulations 5 to 7 are illustrated in FIG. 19. In FIGS. 18 and 19, the horizontal axis represents a distance in the radial direction in a case where a position just above the central position of the wafer W having a diameter of 300 mm is set to zero (0), and the vertical axis represents a molar concentration of HBr. As illustrated in FIG. 19, in a case where the same gas was introduced from the central introducing unit 50 and the peripheral introducing unit 52 while changing its distribution ratio, that is, in Simulations 5 to 7, it has been found that more HBr is supplied to the center of the wafer W than the periphery of the wafer W. Further, as illustrated in FIG. 18, even in a case where HBr gas was supplied from the central introducing unit 50 and Ar gas is supplied from the peripheral introducing unit 52, that is, in Simulation 3, it has been found that more HBr is supplied to the center of the wafer W than the periphery of the wafer W. Meanwhile, as illustrated in FIG. 18, in a case where Ar gas was supplied from the central introducing unit 50 and HBr gas was supplied from the peripheral introducing unit 52, that is, in Simulation 4, it has been found that more HBr is supplied to the periphery of the wafer W than the center of the wafer W.

(Simulations 8 to 25)

In Simulations 8 to 25, a distribution of a molar concentration of HBr at 5 mm above the placing table MR was calculated by changing the distance (height) of the annular pipe 52p from the placement region MR and the angle (θ) of the peripheral introduction ports 52i as parameters. Further, in Simulations 8 to 25, Ar gas was introduced into the processing container 12 from the central introducing unit 50, and HBr gas was introduced into the processing container 12 from the peripheral introducing unit 52. Other conditions of Simulations 8 to 25 are as follows.

<Conditions of Simulations 8 to 25>

Inner diameter of the processing container 12 in Simulations 8 to 25: 540 mm

Distance between the lower surface of the dielectric window 18 and the placement region MR in Simulations 8 to 25: 245 mm Diameter of the annular pipe 52p in Simulations 8 to 25: 540 mm Pressure in the processing container in Simulations 8 to 16: 100 mTorr (13.33 Pa)

Pressure in the processing container in Simulations 17 to 25: 20 mTorr (2.666 Pa)

Flow rate of Ar gas of the central introducing unit 50 in Simulations 8 to 25: 1,000 sccm Flow rate of HBr gas of the peripheral introducing unit 52 in Simulations 8, 10, 13, 15, 17, 19, 22, and 24: 1,000 sccm Flow rate of HBr gas of the peripheral introducing unit 52 in Simulations 11 and 20: 600 sccm Flow rate of HBr gas of the peripheral introducing unit 52 in Simulations 9, 12, 14, 16, 18, 21, 23, and 25: 400 sccm Distance (height) of the annular pipe 52p from the placement region MR in Simulations 8, 9, 17, and 18: 120 mm Angle (θ) of the peripheral introduction ports 52i in Simulations 8, 9, 17, and 18: 50°

Distance (height) of the annular pipe 52p from the placement region MR in Simulations 10 to 12, and 19 to 21: 90 mm Angle (θ) of the peripheral introduction ports 52i in Simulations 10 to 12, and 19 to 21: 45°

Distance (height) of the annular pipe 52p from the placement region MR in Simulations 13, 14, 22, and 23: 60 mm Angle (θ) of the peripheral introduction ports 52i in Simulations 13, 14, 22, and 23: 35°

Distance (height) of the annular pipe 52p from the placement region MR in Simulations 15, 16, 24, and 25: 30 mm Angle (θ) of the peripheral introduction ports 52i in Simulations 15, 16, 24, and 25: 0°

Figure 20:
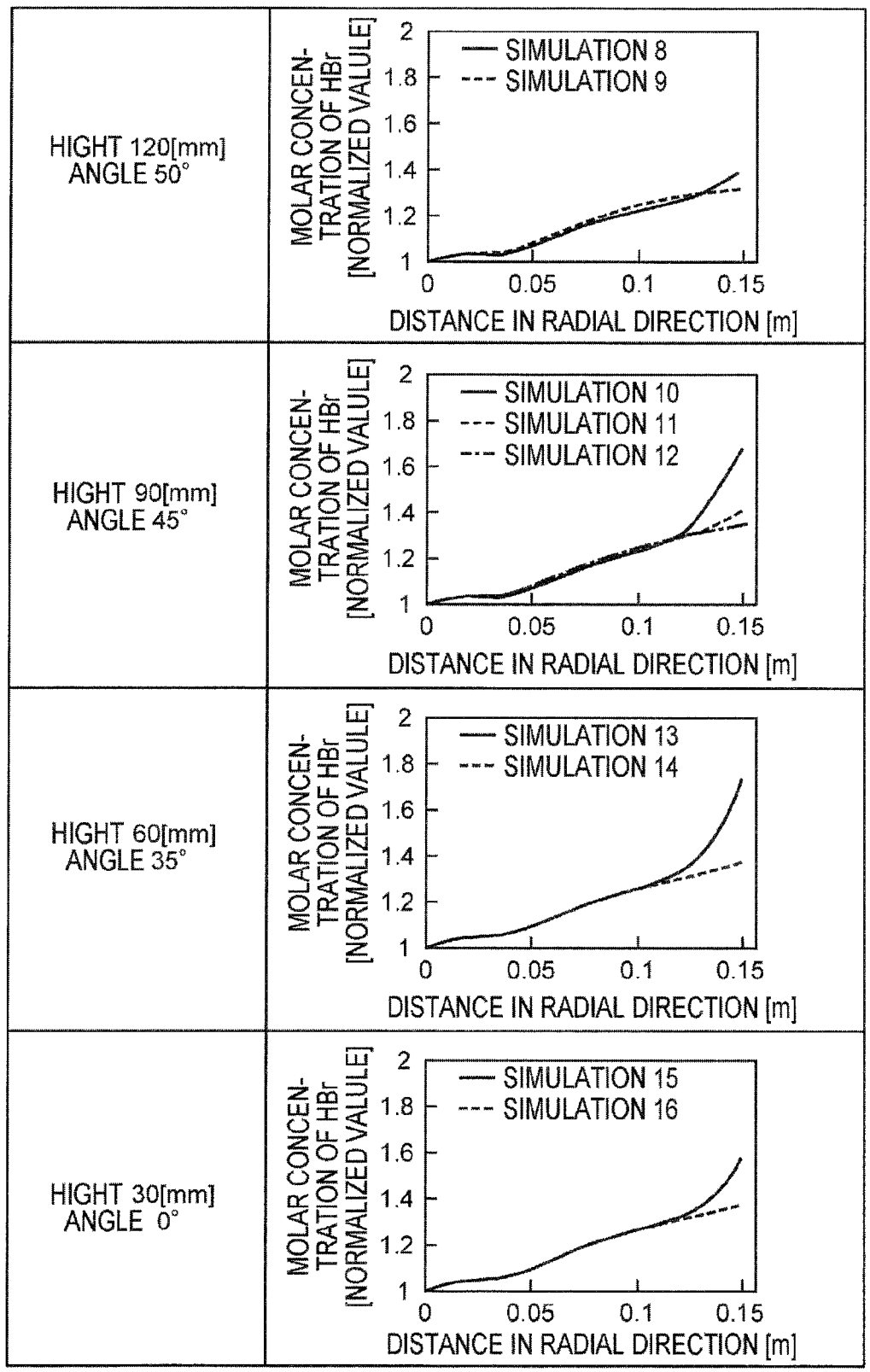
FIG. 20 is a graph illustrating results of Simulations 8 to 16.
Figure 21:
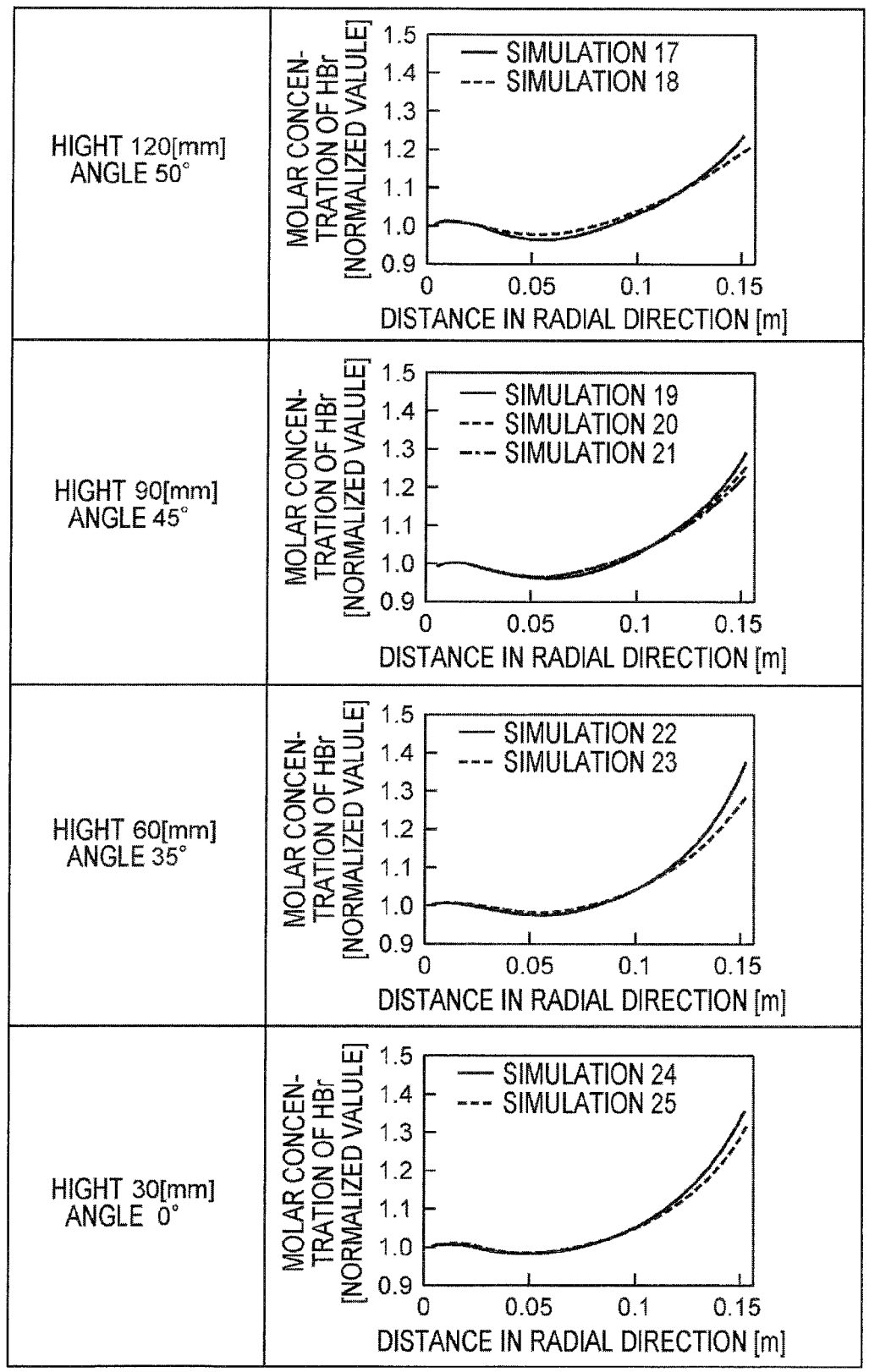
FIG. 21 is a graph illustrating results of Simulations 17 to 25.

The results of Simulations 8 to 16 are illustrated in FIG. 20, and the results of Simulations 17 to 25 are illustrated in FIG. 21. In FIGS. 20 and 21, the horizontal axis represents a distance in the radial direction in a case where a position just above the central position of the wafer W having a diameter of 300 mm is set to zero (0), and the vertical axis represents a molar concentration of HBr normalized by the molar concentration of HBr at position "0". As illustrated in FIGS. 20 and 21, it has been found that more HBr is supplied to the periphery of the wafer W than the center of the wafer W by introducing Ar gas into the processing container 12 from the central introducing unit 50 and introducing HBr gas into the processing container 12 from the peripheral introducing unit 52. Further, it has been found that the supply amount of HBr to the periphery of the wafer W may be adjusted by the supply amount of HBr gas introduced from the peripheral introducing unit 52. Further, as illustrated in FIGS. 20 and 21, it has been found that a wide adjustment width of the supply amount of HBr to the periphery of the wafer W may be obtained by setting the angle (θ) of the peripheral introduction ports 52i in a range of 35° to 45°.

Hereinafter, descriptions will be made on various test examples for evaluating the plasma processing apparatus 10.

TEST EXAMPLES 1 to 4

In Test Examples 1 to 4, $C_4F_6$ gas was introduced into the processing container 12 from the peripheral introducing unit 52 of the plasma processing apparatus 10, and the flow rate of He gas introduced into the processing container 12 from the central introducing unit 50 was changed as a parameter to generate plasma. A 300-mmφ wafer W including a $SiO_2$ layer formed uniformly on a base substrate was exposed to the plasma. Other conditions of Test Examples 1 to 4 are as follows.

Conditions of Test Examples 1 to 4

Inner diameter of the processing container 12 in Test Examples 1 to 4: 540 mm Distance between the lower surface of the dielectric window 18 and the placement region MR in Test Examples 1 to 4: 245 mm Diameter of the annular pipe 52$p$ in Test Examples 1 to 4: 540 mm Angle (θ) of the peripheral introduction ports 52$i$ in Test Examples 1 to 4: 45°

Distance (Height) of the annular pipe 52$p$ from the placement region MR in Test Examples 1 to 4: 90 mm Pressure in the processing container in Test Examples 1 to 4: 40 mTorr (5.333 Pa)

Microwave Power in Test Examples 1 to 4: 1,500 W

High frequency bias Power in Test Examples 1 to 4: 350 W

Gas flow rate ($C_4F_6/O_2$) of the peripheral introducing unit 52 in Test Examples 1 to 4: 20 sccm/3 sccm Flow rate of He gas of the central introducing unit in Test Example 1: 1,200 sccm Flow rate of He gas of the central introducing unit in Test Example 2: 900 sccm Flow rate of He gas of the central introducing unit in Test Example 3: 600 sccm Flow rate of He gas of the central introducing unit in Test Example 4: 300 sccm Processing time in Test Examples 1 to 4: 60 seconds TEST EXAMPLES 5 to 12

In Test Examples 5 to 12, $C_4F_6$ gas was introduced into the processing container 12 from the peripheral introducing unit 52 of the plasma processing apparatus 10, and the flow rate of He gas introduced into the processing container 12 from the central introducing unit 50 was changed as a parameter to generate plasma. A 300-mmφ wafer W including a polycrystalline silicon layer formed uniformly on a base substrate was exposed to the plasma. Other conditions of Test Examples 5 to 8 are the same as in Test Examples 1 to 4. In addition, other conditions of Test Examples 9 to 12 are the same as in Test Examples 1 to 4 except that the high frequency bias power was set to 0 W.

EVALUATION OF TEST EXAMPLES 1 to 12

The etching rate of the $SiO_2$ layer was determined from the change in film thickness of the $SiO_2$ layer before and after processing and the processing time in Test Examples 1 to 4. Specifically, sampling points were set at intervals of 50 mm on four diameters of the wafer W set at intervals of 45°, and the etching rate of the $SiO_2$ layer was determined at the sampling points. Hereinafter, the four diameters are referred to as an "axis X", "axis Y", "axis V", and "axis W", respectively.

The etching rate of the polycrystalline silicon layer was determined from the change in film thickness of the polycrystalline silicon layer before and after processing and the processing time in Test Examples 5 to 8. Specifically, sampling points were set at intervals of 50 mm on the axis X, the axis Y, the axis V, and the axis W, and the etching rate of the polycrystalline silicon layer was determined at the sampling points.

Further, the deposition rate of the fluorocarbon film was determined from the change in film thickness of the fluorocarbon film before and after processing and the processing time in Test Examples 9 to 12. Specifically, sampling points were set at intervals of 50 mm on the axis X, the axis Y, the axis V, and the axis W, and the deposition rate of the fluorocarbon film was determined at the sampling points.

Figure 22:
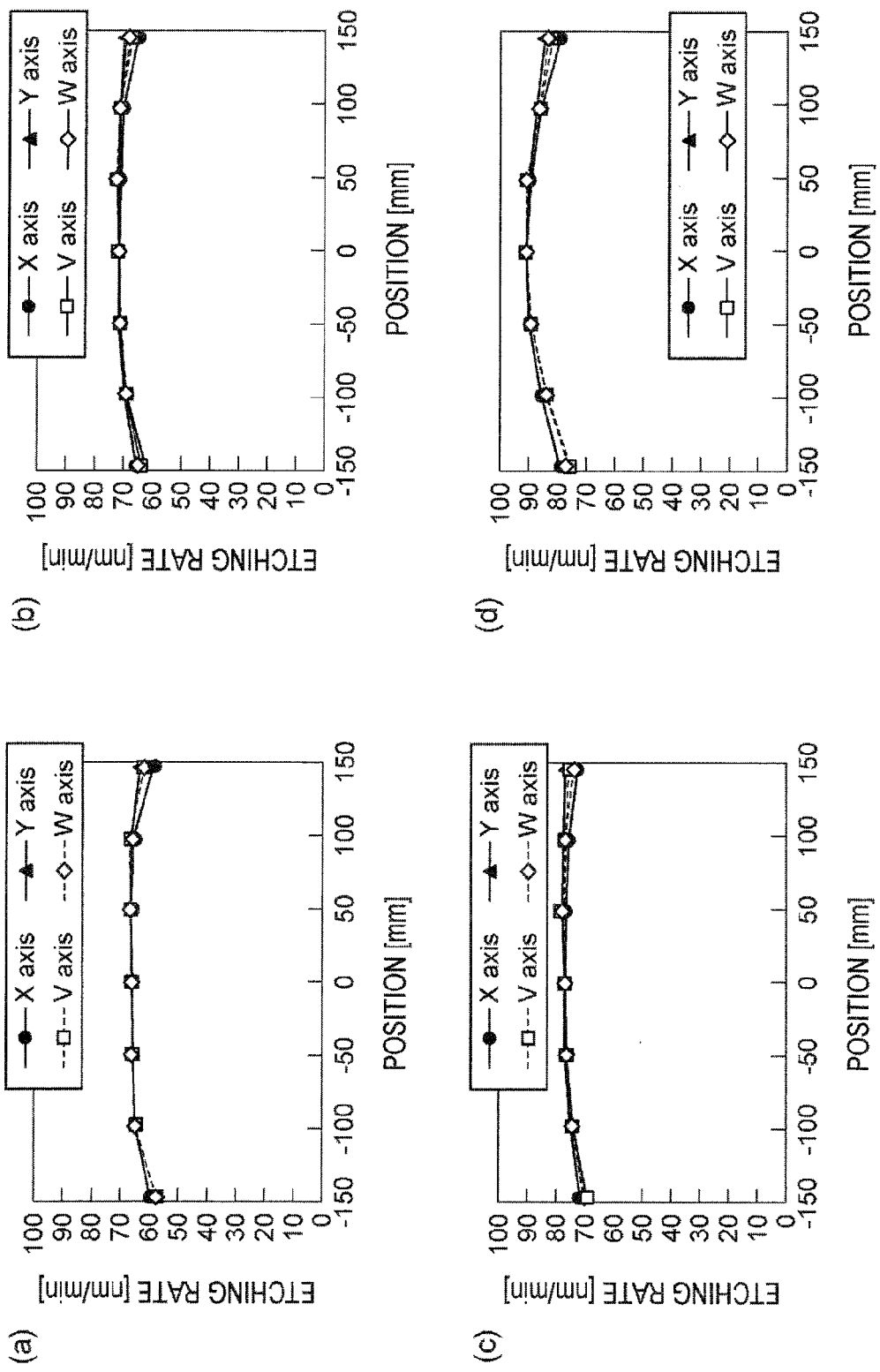
FIG. 22 illustrates graphs of distribution of etching rates for $SiO_2$ layers obtained in Test Examples 1 to 4.
Figure 23:
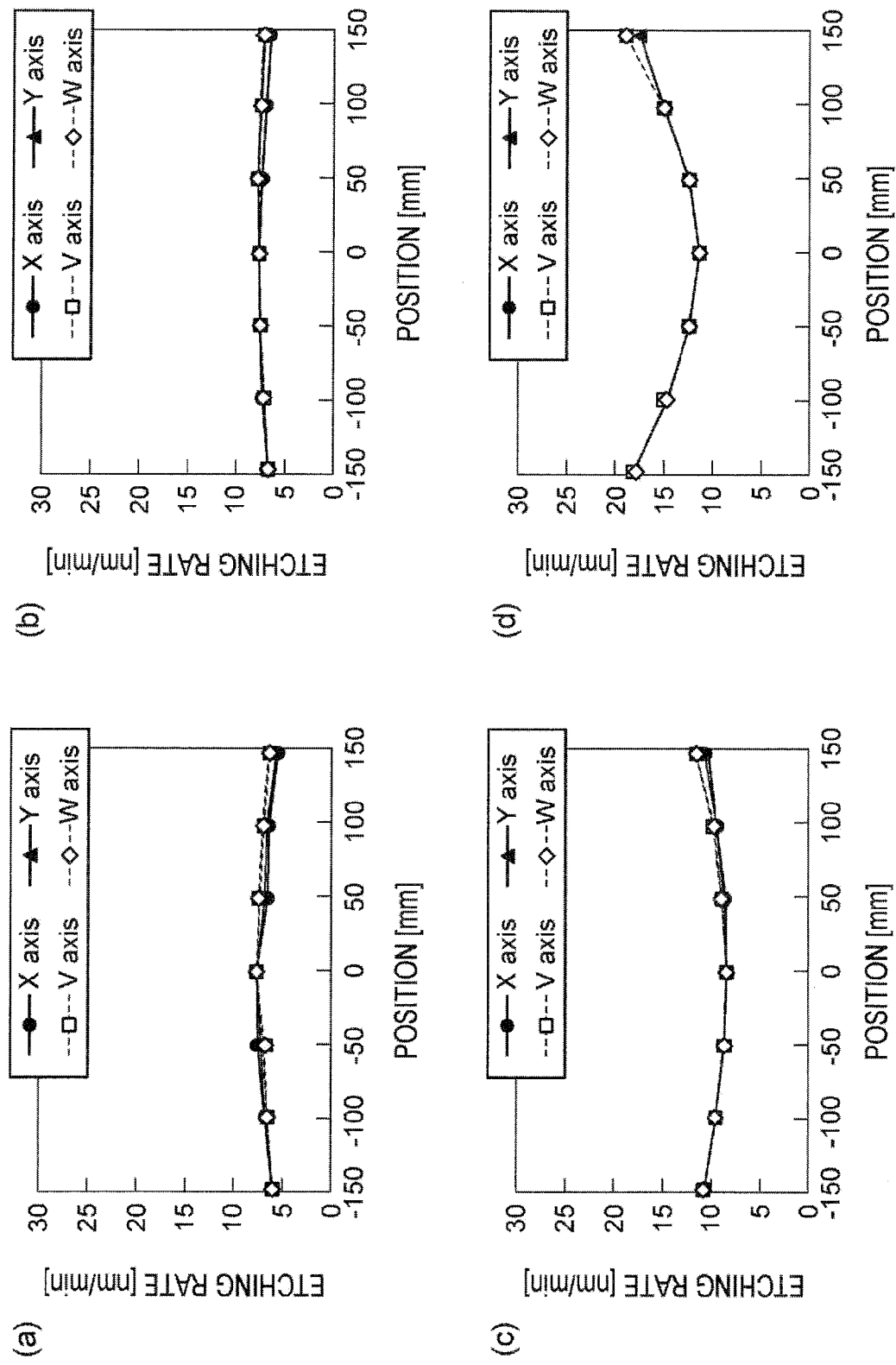
FIG. 23 illustrates graphs of distribution of etching rates for polycrystalline silicon layers obtained in Test Examples 5 to 8.
Figure 24:
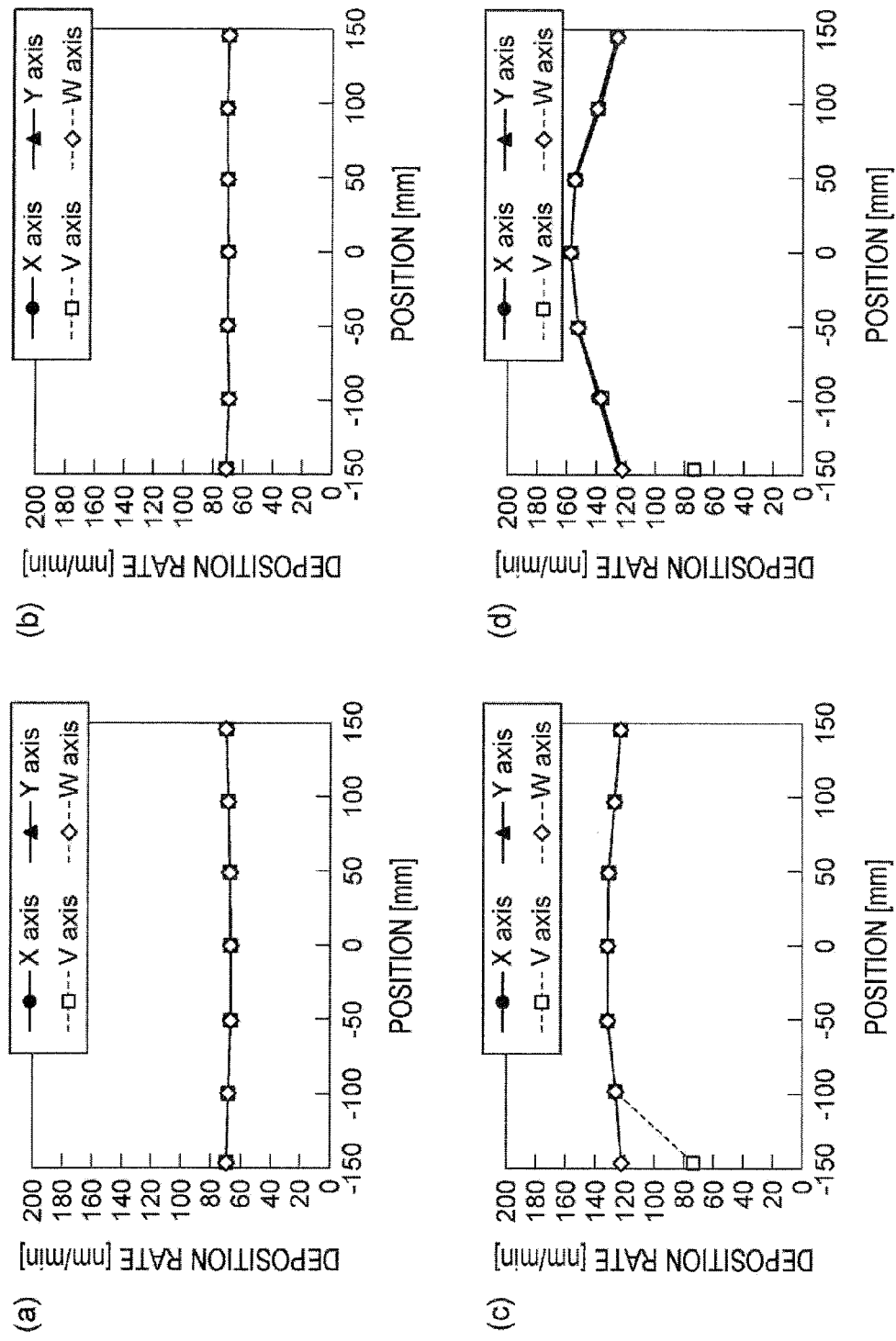
FIG. 24 illustrates graphs of distribution of deposition rates for fluorocarbon films obtained in Test Examples 9 to 12.
Figure 25:
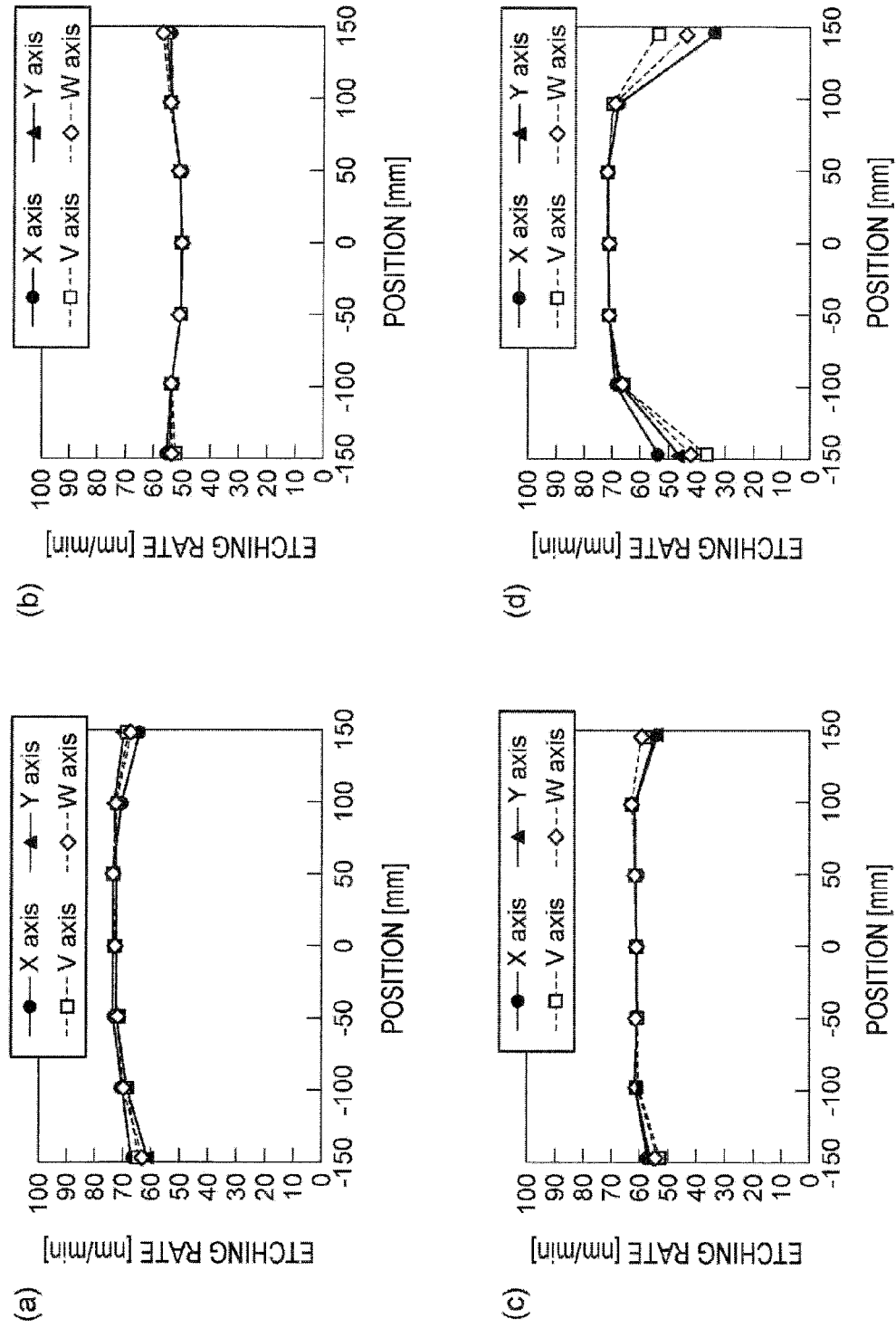
FIG. 25 illustrates graphs of distribution of etching rates for $SiO_2$ layers obtained in Test Examples 13 to 16.
Figure 26:
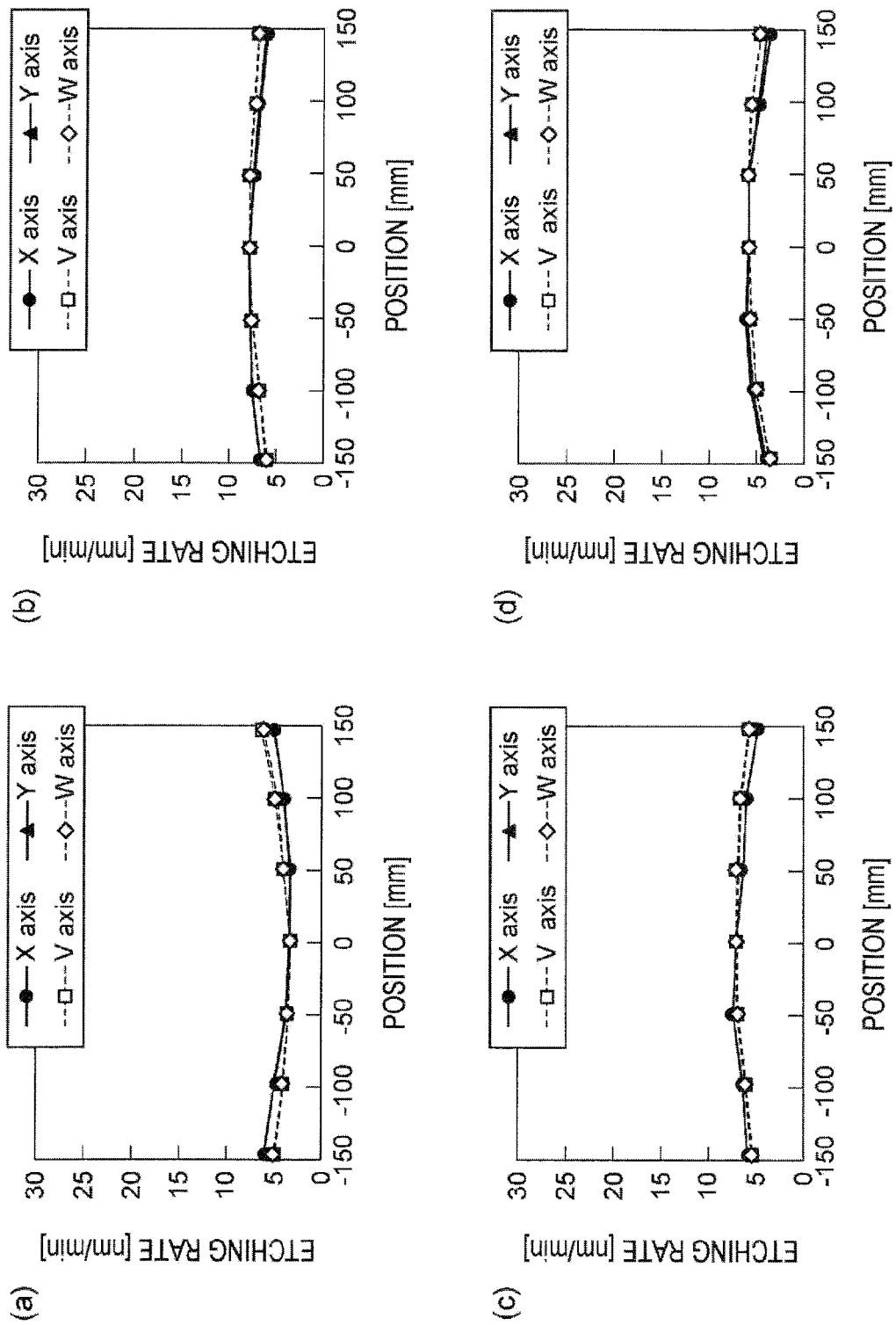
FIG. 26 illustrates graphs of distribution of etching rates for polycrystalline silicon layers obtained in Test Examples 17 to 20.
Figure 27:
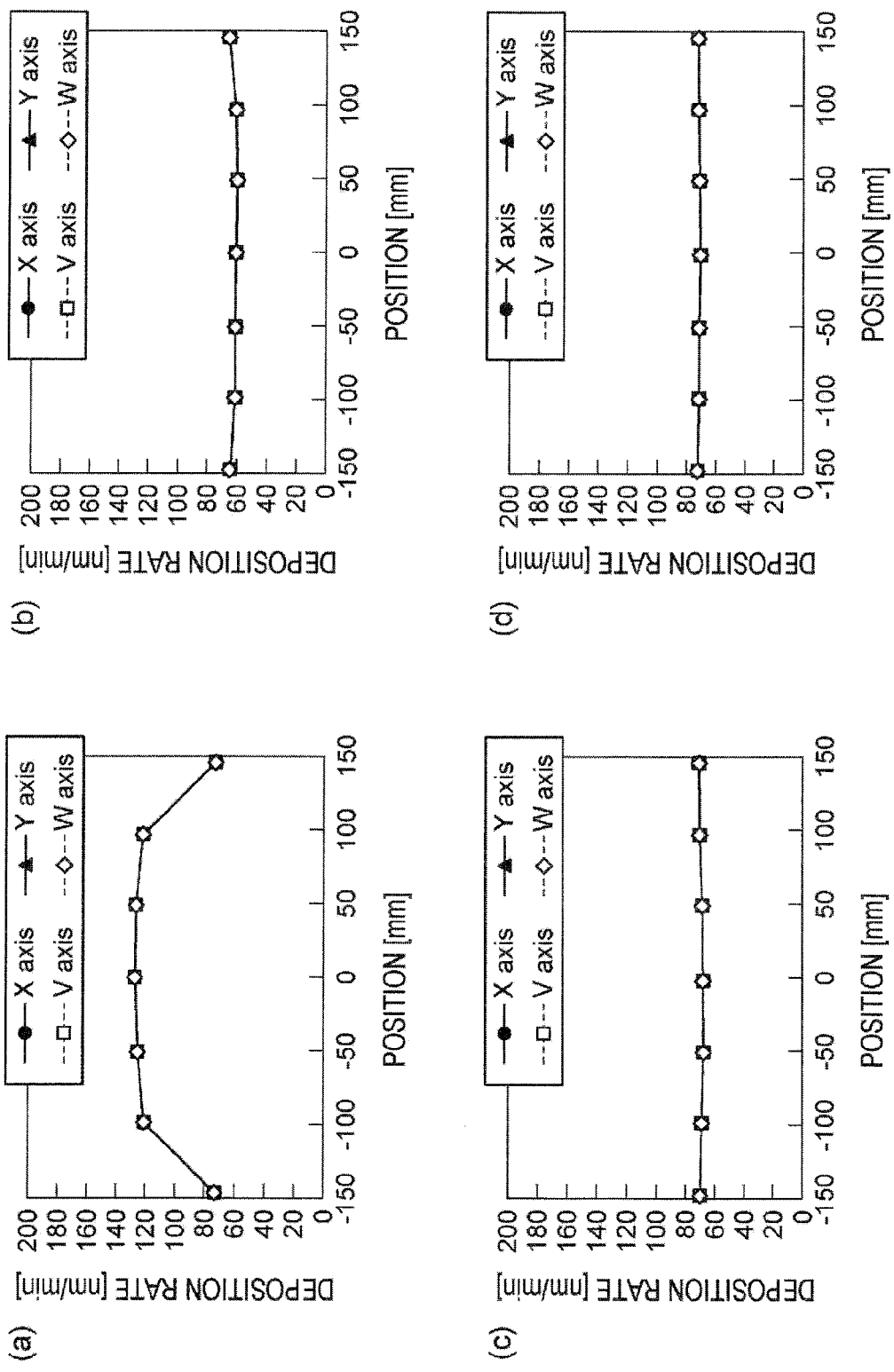
FIG. 27 illustrates graphs of distribution of deposition rates for fluorocarbon films obtained in Test Examples 21 to 24.

The distribution of the etching rate of the $SiO_2$ layer determined in Test Examples 1 to 4 is illustrated in FIG. 22(*a*) to (*d*). The distribution of the etching rate of the polycrystalline silicon layer determined in Test Examples 5 to 8 is illustrated in FIG. 23(*a*) to (*d*). The distribution of the deposition rate of the fluorocarbon film determined in Test Examples 9 to 12 is illustrated in FIG. 24(*a*) to (*d*). Meanwhile, in the graphs illustrated in FIGS. 22 and 23, the horizontal axis represents a position on the axis X, the axis Y, the axis V, and the axis W when the central position of the wafer W is set to zero (0). Further, in the graphs illustrated in FIGS. 22 and 23, the vertical axis represents an etching rate. In the graph illustrated in FIG. 24, the vertical axis represents a deposition rate.

As illustrated in FIG. 22, although the flow rate of He gas, that is, the rare gas introduced into the processing container 12 from the central introducing unit 50 was changed, the distribution of the etching rate of the $SiO_2$ layer was not considerably changed. Meanwhile, as illustrated in FIG. 23, it has been that, when the flow rate of He gas, that is, the rare gas introduced into the processing container 12 from the central introducing unit 50 is decreased, the etching rate of the polycrystalline silicon layer in the periphery of the wafer is relatively increased with respect to the etching rate of the polycrystalline silicon layer in the central portion of the wafer. Further, as illustrated in FIG. 24, it has been found that, when the flow rate of He gas, that is, the rare gas introduced into the processing container 12 from the central introducing unit 50 is decreased, the deposition rate of the fluorocarbon film in the periphery of the wafer is relatively increased with respect to the etching rate of the fluorocarbon film in the central portion of the wafer.

To summarize the results of Test Examples 1 to 12 as described above, it has been found that the distribution of the etching rate of the polycrystalline silicon layer and the distribution of the deposition rate of the fluorocarbon film capable of protecting the polycrystalline silicon layer may be adjusted, without adversely affecting the distribution of the etching rate of the $SiO_2$ layer, by adjusting the flow rate of the rare gas introduced into the processing container 12 from the central introducing unit 50 while introducing mainly a rare gas into the processing container 12 from the central introducing unit 50 and introducing $C_4F_6$ gas into the processing container 12 from the peripheral introducing unit 52.

TEST EXAMPLES 13 to 16

In Test Examples 13 to 16, a gas mainly containing He gas was introduced into the processing container 12 from the central introducing unit 50 of the plasma processing apparatus 10, and the flow rate of $C_4F_6$ gas introduced into the processing container 12 from the peripheral introducing unit 52 was changed as a parameter to generate plasma. A 300-mmφ wafer W including a $SiO_2$ layer formed uniformly on a base substrate was exposed to the plasma. Other conditions of Test Examples 13 to 16 are as follows.

Conditions of Test Examples 13 to 16

Inner diameter of the processing container 12 in Test Examples 13 to 16: 540 mm Distance between the lower surface of the dielectric window 18 and the placement region MR in Test Examples 13 to 16: 245 mm Diameter of the annular pipe 52p in Test Examples 13 to 16: 540 mm Angle (θ) of the peripheral introduction ports 52i in Test Examples 13 to 16: 45°

Distance (Height) of the annular pipe 52p from the placement region MR in Test Examples 13 to 16: 90 mm Pressure in the processing container in Test Examples 13 to 16: 40 mTorr (5.333 Pa)

Microwave Power in Test Examples 13 to 16: 1,500 W

High frequency bias Power in Test Examples 13 to 16: 350 W

Gas flow rate ($He/C_4F_6/O_2$) of the central introducing unit in Test Example 13: 360 sccm/6 sccm/9 sccm Gas flow rate ($He/C_4F_6/O_2$) of the central introducing unit in Test Examples 14 to 16: 360 sccm/0 sccm/9 sccm Gas flow rate ($He/C_4F_6/O_2$) of the peripheral introducing unit in Test Example 13: 840 sccm/14 sccm/2.1 sccm Gas flow rate ($He/C_4F_6/O_2$) of the peripheral introducing unit in Test Example 14: 840 sccm/14 sccm/2.1 sccm Gas flow rate ($He/C_4F_6/O_2$) of the peripheral introducing unit in Test Example 15: 840 sccm/17 sccm/2.1 sccm Gas flow rate ($He/C_4F_6/O_2$) of the peripheral introducing unit in Test Example 16: 840 sccm/20 sccm/2.1 sccm Processing time in Test Examples 13 to 16: 60 seconds TEST EXAMPLES 17 to 24

In Test Examples 17 to 24, a gas mainly containing He gas was introduced into the processing container 12 from the central introducing unit 50 of the plasma processing apparatus 10, and the flow rate of $C_4F_6$ gas introduced into the processing container 12 from the peripheral introducing unit 52 was changed as a parameter to generate plasma. A 300-mmφ wafer W including a polycrystalline silicon layer formed uniformly on a base substrate was exposed to the plasma. Other conditions of Test Examples 17 to 20 are the same as in Test Examples 13 to 16. In addition, other conditions of Test Examples 21 to 24 are the same as in Test Examples 13 to 16 except that the high frequency bias power was set to 0 W.

EVALUATION OF TEST EXAMPLES 13 to 24

The etching rate of the $SiO_2$ layer was determined from the change in film thickness of the $SiO_2$ layer before and after processing and the processing time in Test Examples 13 to 16. Specifically, sampling points were set at intervals of 50 mm on the axis X, the axis Y, the axis V, and the axis W, and the etching rate of the $SiO_2$ layer was determined at the sampling points.

The etching rate of the polycrystalline silicon layer was determined from the change in film thickness of the polycrystalline silicon layer before and after processing and the processing time in Test Examples 17 to 20. Specifically, sampling points were set at intervals of 50 mm on the axis X, the axis Y, the axis V, and the axis W, and the etching rate of the polycrystalline silicon layer was determined at the sampling points.

Further, the deposition rate of the fluorocarbon film was determined from the change in film thickness of the fluorocarbon film before and after processing and the processing time in Test Examples 21 to 24. Specifically, sampling points were set at intervals of 50 mm on the axis X, the axis Y, the axis V, and the axis W, and the deposition rate of the fluorocarbon film was determined at the sampling points.

The distribution of the etching rate of the $SiO_2$ layer determined in Test Examples 13 to 16 is illustrated in FIG. 25(a) to (d). The distribution of the etching rate of the polycrystalline silicon layer determined in Test Examples 17 to 20 is illustrated in FIG. 26(a) to (d). The distribution of the deposition rate of the fluorocarbon film determined in Test Examples 21 to 24 is illustrated in FIG. 27(a) to (d). Meanwhile, in the graphs illustrated in FIGS. 25 and 26, the horizontal axis represents a position on the axis X, the axis Y, the axis V, and the axis W when the central position of the wafer W is set to zero (0). Further, in the graphs illustrated in FIGS. 25 and 26, the vertical axis represents an etching rate. In the graph illustrated in FIG. 27, the vertical axis represents a deposition rate.

In Test Example 13, $C_4F_6$ gas was also introduced from the central introducing unit 50. Accordingly, as illustrated in FIG. 25(a), the etching rate of the $SiO_2$ layer showed a tendency of increasing in the center of the wafer. Meanwhile, in Test Examples 14 to 16, $C_4F_6$ gas was not introduced from the central introducing unit 50. In Test Example 14, as illustrated in FIG. 25(b) to (d), the etching rate of the $SiO_2$ layer in the periphery of the wafer was slightly increased. Further, in Test Examples 14 to 16, it has been found that, when the flow rate of $C_4F_6$ gas introduced into the processing container 12 from the peripheral introducing unit 52 is increased, the etching rate of the $SiO_2$ layer in the central portion of the wafer tends to be relatively increased with respect to the etching rate of the $SiO_2$ layer in the periphery of the wafer.

Further, in Test Example 21, as illustrated in FIG. 27(a), it has been found that the deposition rate of the fluorocarbon film in the central portion of the wafer tends to be relatively increased with respect to the deposition rate of the fluorocarbon film in the periphery of the wafer. Further, in Test Example 17, as illustrated in FIG. 26(a), it has been found that the etching rate of the polycrystalline silicon layer in the central portion of the wafer tends to be relatively increased with respect to the etching rate of the polycrystalline silicon layer in the periphery of the wafer. It is considered that the tendency of the results of Test Examples 17 and 21 is caused by that fact that a large amount of fluorocarbon is supplied to the central portion of the wafer as the $C_4F_6$ gas is also introduced from the central introducing unit 50 in these test examples.

Meanwhile, in Test Examples 18 to 20 in which a gas mainly containing a rare gas was introduced into the processing container 12 from the central introducing unit 50 and $C_4F_6$ gas was introduced into the processing container 12 from the peripheral introducing unit 52, as illustrated in FIG. 26(b) to (d), it has been found that, although the flow rate of $C_4F_6$ gas of the peripheral introducing unit 52 is changed, the tendency of the distribution of the etching rate of the polycrystalline silicon layer is not considerably changed, and the deviation of the etching rate of the polycrystalline silicon layer is small. Further, in Test Examples 22 to 24 in which a gas mainly containing a rare gas was introduced into the processing container 12 from the central introducing unit 50 and $C_4F_6$ gas was introduced into the processing container 12 from the peripheral introducing unit 52, it has been found that, although the flow rate of $C_4F_6$ gas of the peripheral introducing unit 52 is changed, the tendency of the distribution of the deposition rate of the fluorocarbon film is not considerably changed, and the deviation of the deposition rate of the fluorocarbon film is small.

To summarize the results of Test Examples 13 to 24 as described above, it has been found that the distribution of the etching rate of the $SiO_2$ layer may be adjusted, without adversely affecting the distribution of the etching rate of the polycrystalline silicon layer and the distribution of the deposition rate of the fluorocarbon film capable of protecting the polycrystalline silicon layer, by adjusting the flow rate of $C_4F_6$ gas introduced into the processing container 12 from the peripheral introducing unit 52 while introducing the gas mainly containing a rare gas into the processing container 12 from the central introducing unit 50 and introducing $C_4F_6$ gas into the processing container 12 from the peripheral introducing unit 52.

TEST EXAMPLES 25 to 27

In Test Examples 25 to 27, Ar gas was introduced into the processing container 12 from the central introducing unit 50 of the plasma processing apparatus 10, and the flow rate of HBr gas introduced into the processing container 12 from the peripheral introducing unit 52 was changed as a parameter to generate plasma. A 300-mmϕ wafer W including a polycrystalline silicon layer formed uniformly on a base substrate was exposed to the plasma. Other conditions of Test Examples 25 to 27 are as follows.

Conditions of Test Examples 25 to 27

Inner diameter of the processing container 12 in Test Examples 25 to 27: 540 mm
Distance between the lower surface of the dielectric window 18 and the placement region MR in Test Examples 25 to 27: 245 mm
Diameter of the annular pipe 52p in Test Examples 25 to 27: 540 mm
Angle (θ) of the peripheral introduction ports 52i in Test Examples 25 to 27: 45°
Distance (Height) of the annular pipe 52p from the placement region MR in Test Examples 25 to 27: 90 mm
Pressure in the processing container in Test Examples 25 to 27: 40 mTorr (5.333 Pa)
Microwave Power in Test Examples 25 to 27: 2,000 W
High frequency bias Power in Test Examples 25 to 27: 150 W
Ar gas flow rate of the central introducing unit in Test Examples 25 to 27: 440 sccm
HBr flow rate of the peripheral introducing unit in Test Example 25: 200 sccm
HBr flow rate of the peripheral introducing unit in Test Example 26: 400 sccm
HBr flow rate of the peripheral introducing unit in Test Example 27: 600 sccm
Processing time in Test Examples 25 to 27: 60 seconds TEST EXAMPLES 28 to 30

In Test Examples 28 to 30, Ar gas was introduced into the processing container 12 from the central introducing unit 50 of the plasma processing apparatus 10, and the flow rate of HBr gas introduced into the processing container 12 from the peripheral introducing unit 52 was changed as a parameter to generate plasma. A 300-mmϕ wafer W including a SiN layer formed uniformly on a base substrate was exposed to the plasma. Other conditions of Test Examples 28 to 30 are the same as in Test Examples 25 to 27.

EVALUATION OF TEST EXAMPLES 25 to 30

The etching rate of the polycrystalline silicon layer was determined from the change in film thickness of the polycrystalline silicon layer before and after processing and the processing time in Test Examples 25 to 27. Specifically, sampling points were set at intervals of 50 mm on the axis X, the axis Y, the axis V, and the axis W, and the etching rate of the polycrystalline silicon layer was determined at the sampling points.

The etching rate of the SiN layer was determined from the change in film thickness of the SiN layer before and after processing and the processing time in Test Examples 28 to 30. Specifically, sampling points were set at intervals of 50 mm on the axis X, the axis Y, the axis V, and the axis W, and the etching rate of the SiN layer was determined at the sampling points.

Figure 28:
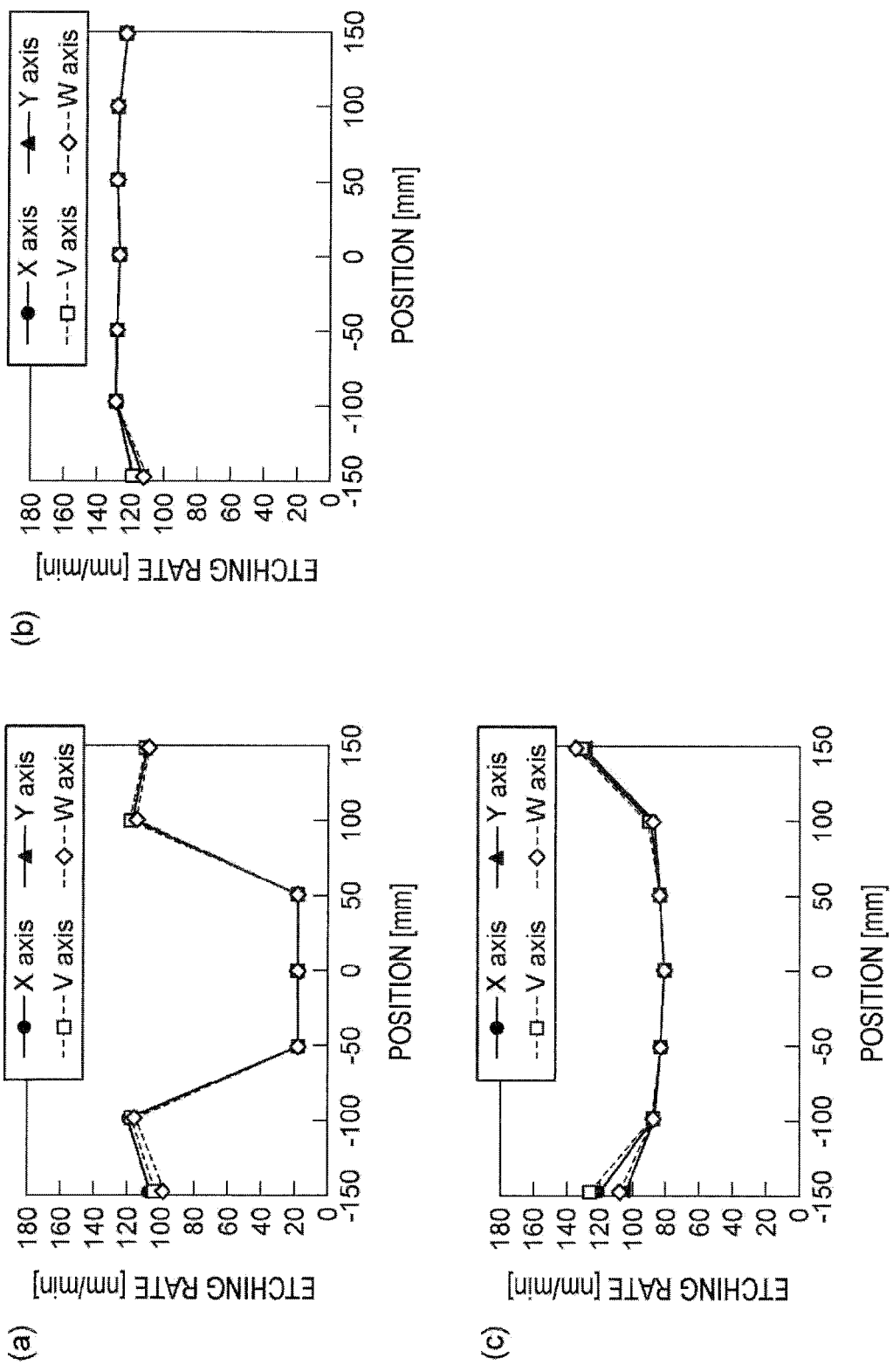
FIG. 28 illustrates graphs of distribution of etching rates for polycrystalline silicon layers obtained in Test Examples 25 to 27.
Figure 29:
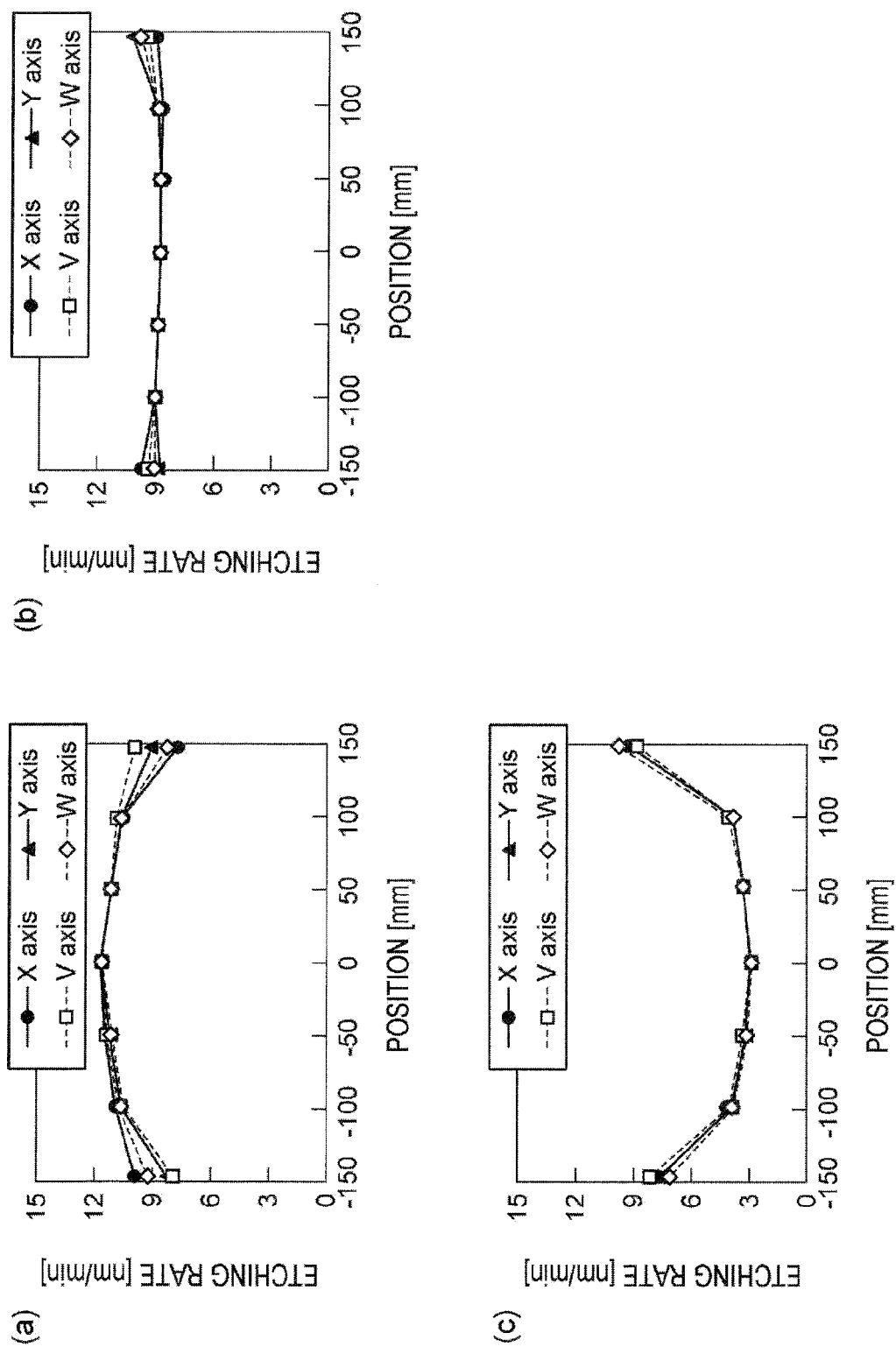
FIG. 29 illustrates graphs of distribution of etching rates for SiN layers obtained in Test Examples 28 to 30.
Figure 30:
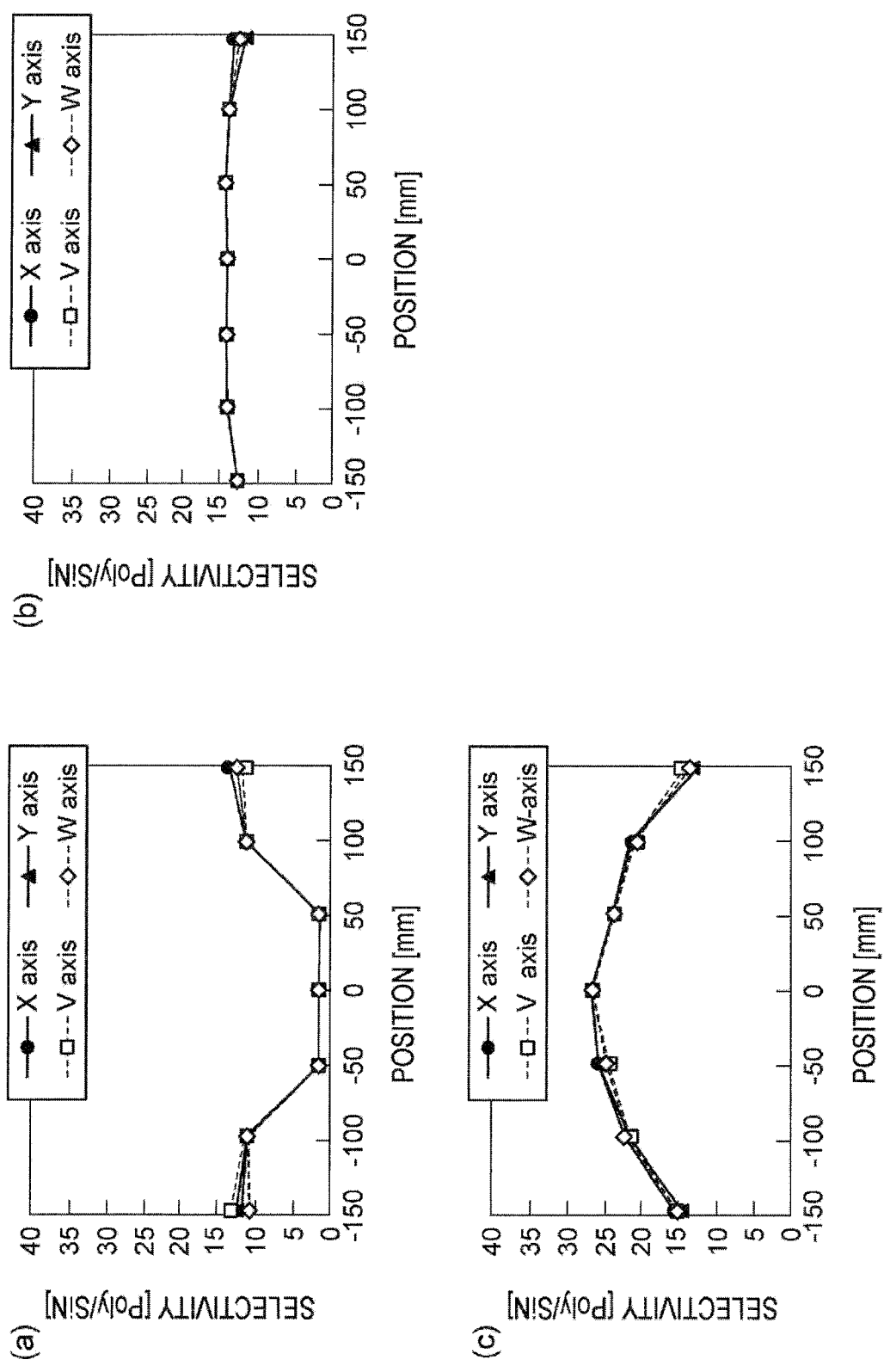
FIG. 30 illustrates graphs of distribution of etching selectivity of the polycrystalline silicon layer for the etching of the SiN layer, obtained from the results of Test Examples 25 to 30.

The distribution of the etching rate of the polycrystalline silicon layer determined in Test Examples 25 to 27 is illustrated in FIG. 28(a) to (c). Further, the distribution of the etching rate of the SiN layer determined in Test Examples 28 to 30 is illustrated in FIG. 29(a) to (c). Further, the distribution of the selectivity of the etching of the polycrystalline silicon layer with respect to the etching of the SiN layer determined from the results of Test Examples 25 to 30 is illustrated in FIG. 30(a) to (c). In the graphs illustrated in FIGS. 28 to 30, the horizontal axis represents a position on the axis X, the axis Y, the axis V, and the axis W when the central position of the wafer W is set to zero (0). Further, in the graphs illustrated in FIGS. 28 and 29, the vertical axis represents an etching rate. In the graph illustrated in FIG. 30, the vertical axis represents selectivity. Meanwhile, the distribution of the selectivity illustrated in FIG. 30(a) was determined by dividing the etching rate of the polycrystalline silicon at each position as determined in Test Example 25 by the etching rate of the SiN layer at the corresponding position as determined in Test Example 28. Similarly, the distribution of the selectivity illustrated in FIG. 30(b) was determined by dividing the etching rate of the polycrystalline silicon at each position as determined in Test Example 26 by the etching rate of the SiN layer at the corresponding position as determined in Test Example 29. Similarly, the distribution of the selectivity illustrated in FIG. 30(c) was determined by dividing the etching rate of the polycrystalline silicon at each position as determined in Test Example 27 by the etching rate of the SiN layer at the corresponding position as determined in Test Example 30.

According to the results of Test Example 25 to 27, it has been found that, when Ar gas is introduced into the processing container 12 from the central introducing unit 50 of the plasma processing apparatus 10 and the flow rate of HBr gas introduced into the processing container 12 from the peripheral introducing unit 52 is increased, the distribution of the etching rate of the polycrystalline silicon layer in the radial direction may be adjusted as illustrated in FIG. 28(a) to (c). Further, according to the results of Test Example 28 to 30, it has been found that, when Ar gas is introduced into the processing container 12 from the central introducing unit 50 of the plasma processing apparatus 10 and the flow rate of HBr gas introduced into the processing container 12 from the peripheral introducing unit 52 is increased, the distribution of the etching rate of the SiN layer in the radial direction may be adjusted as illustrated in FIG. 29(a) to (c). Further, from the results of Test Examples 25 to 30, it has been found that, when Ar gas is introduced into the processing container 12 from the central introducing unit 50 of the plasma processing apparatus 10 and the flow rate of HBr gas introduced into the processing container 12 from the peripheral introducing unit 52 is increased, the distribution in the radial direction of the selectivity of the etching of the SiN layer with respect to the etching of the polycrystalline silicon layer may be adjusted as illustrated in FIG. 30(a) to (c). In addition, it has been found that the deviation in the radial direction of the selectivity of the etching of the SiN layer with respect to the etching of the polycrystalline silicon layer may be reduced as illustrated in FIG. 30(b) by adjusting the flow rate of HBr gas introduced into the processing container 12 from the peripheral introducing unit 52.

TEST EXAMPLES 31 and 32

In Test Example 31, the wafer W illustrated in FIG. 15 was fabricated by performing the plasma processing method illustrated in FIG. 14 using the plasma processing apparatus 10. That is, an etching was performed on a Si underlying portion below a gap between two adjacent sidewall spacer layers. The set value of the distance between the two sidewall spacer layers was 30 nm, and the set value of the gate height was 140 nm. The conditions of Test Example 31 are as follows.

Conditions of Test Example 31

Inner diameter of the processing container 12: 540 mm
Distance between the lower surface of the dielectric window 18 and the placement region MR: 245 mm
Diameter of the annular pipe 52p: 540 mm
Angle (θ) of the peripheral introduction ports 52i: 45°
Distance (Height) of the annular pipe 52p from the placement region MR: 90 mm
Gas flow rate (Ar/$C_4F_6$/$O_2$) of the central introducing unit in step Sb: 90 sccm/7 sccm/1.5 sccm
Gas flow rate (Ar/$C_4F_6$/$O_2$) of the peripheral introducing unit in step Sb: 210 sccm/18 sccm/3.5 sccm
Microwave Power in step Sb: 1,500 W
High frequency bias Power in step Sb: 50 W
Pressure in the processing container in step Sb: 150 mTorr (20 Pa)
Processing time in step Sb: 15 seconds
Gas flow rate (Ar/$N_2$) of the central introducing unit in step Sa: 300 sccm/500 sccm
Gas flow rate ($Cl_2$/$O_2$) of the peripheral introducing unit in step Sa: 120 sccm/12 sccm
Microwave Power in step Sa: 3,000 W
High frequency bias Power in step Sa: 0 W
Pressure in the processing container in step Sa: 200 mTorr (26.66 Pa)
Processing time in step Sa: 20 seconds
Further, for reference, Test Example 32 was performed. The conditions of Test Example 32 are the same as the conditions of Test Example 31, except that only step Sb was performed for 7 seconds but step Sa was not performed.

EVALUATION OF TEST EXAMPLES 31 and 32

SEM photographs of the central portion and the peripheral portion of the wafer W fabricated in Test Examples 31 and 32 were taken and a vertical depth and a width of the hole 206 were determined from the SEM photographs. The results are listed in Table 1.

TABLE 1

| | | Test Example 31 | Test Example 32 |
|---|---|---|---|
| Central portion of wafer | Width of hole (nm) | 13.2 | 10.3 |
| | Depth of hole (nm) | 17.7 | 20.6 |
| Peripheral portion of wafer | Width of hole (nm) | 12.9 | 2.6 |
| | Depth of hole (nm) | 17.4 | 18.6 |

TABLE 1-continued

| | Test Example 31 | Test Example 32 |
|---|---|---|
| Difference (nm) in width of the hole between the central portion and peripheral portion of the wafer | 0.3 | 7.7 |
| Difference (nm) in depth of the hole between the central portion and peripheral portion of the substrate | 0.3 | 2.0 |

As illustrated in Table 1, in Test Example 32 in which holes 206 were fabricated by continuously supplying the high frequency bias power to the placing table, the holes 206 could be expanded transversely in the central portion of the wafer, but the holes 206 could not be expanded transversely in the periphery of the wafer. Meanwhile, in Test Example 31 in which the holes 206 were fabricated according to the plasma processing method of FIG. 14, the holes 206 could be expanded transversely even in the periphery of the wafer. Further, in Test Example 31, the differences in width and depth of the holes 206 between the central portion and the periphery of the wafer were both 0.3 nm, which was a very small value.

Figure 31:
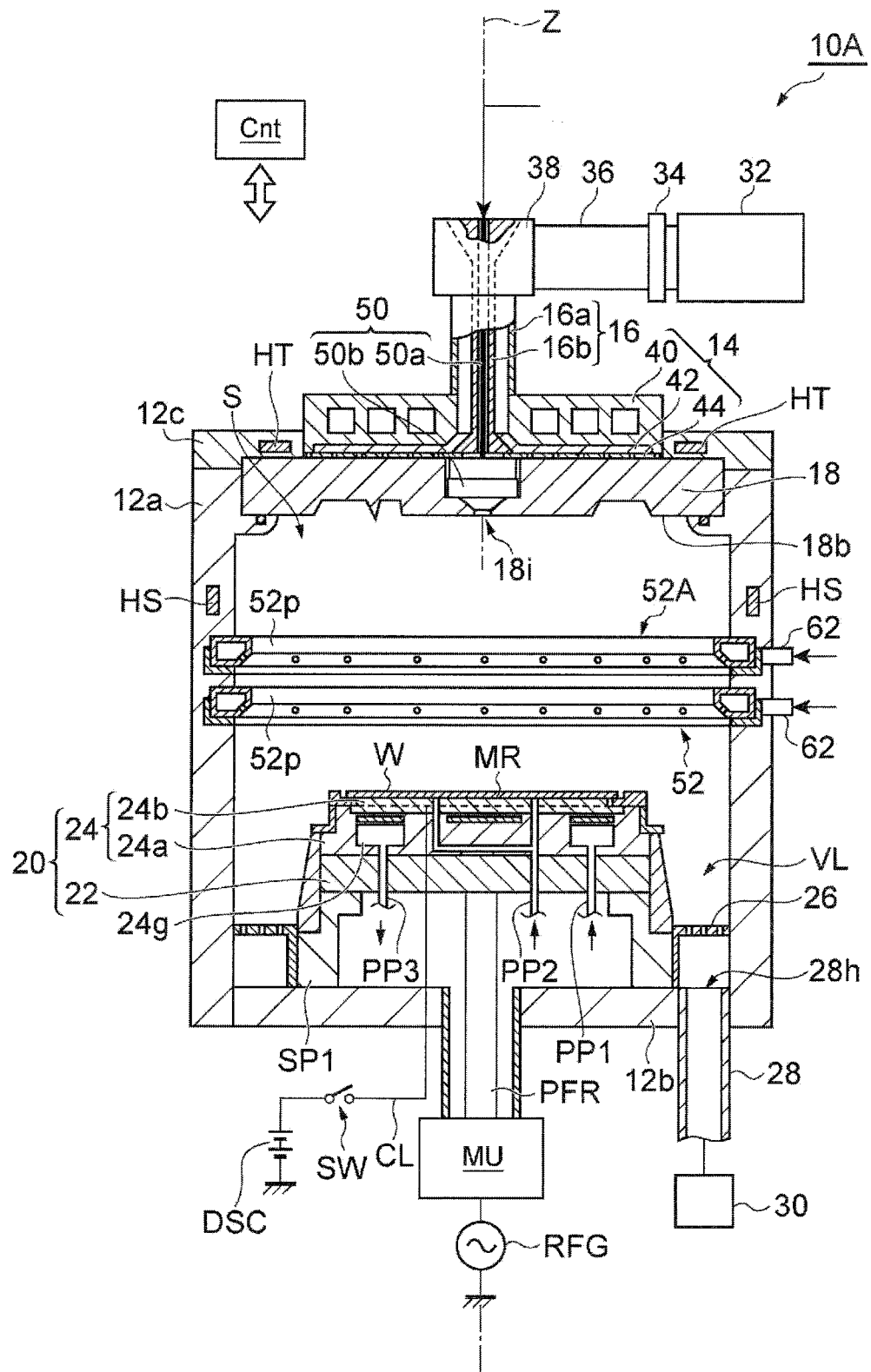
FIG. 31 is a schematic cross-sectional view illustrating a plasma processing apparatus according to another exemplary embodiment.

Hereinafter, plasma processing apparatuses according to several alternative exemplary embodiments will be described. FIG. 31 is a view illustrating a plasma processing apparatus according to another exemplary embodiment. A plasma processing apparatus 10A illustrated in FIG. 31 is different from the plasma processing apparatus 10 in that a separate peripheral introducing unit 52A is further provided. The peripheral introducing unit 52A is configured by the same components as those of the peripheral introducing unit 52, but its installation position is different from that of the peripheral introducing unit 52.

The annular pipe 52p of the peripheral introducing unit 52 is disposed in the plasma diffusion region as described above, for example, in a region above the placement region MR and at a distance of 100 mm or more from the lower surface 18b of the dielectric window 18 in the axis Z direction. Meanwhile, an annular pipe 52p of the peripheral introducing unit 52A is provided above the annular pipe 52p of the peripheral introducing unit 52 in the axis Z direction and below a plasma generation region. The plasma generation region is a region within a distance of 50 mm from the lower surface 18b of the dielectric window 18 in the axis Z direction.

In the plasma processing apparatus 10A, since the peripheral introducing unit 52A is formed above the peripheral introducing unit 52, the peripheral introducing unit 52A may supply the gas towards the region between the periphery and the central portion of the wafer W, whereas the peripheral introducing unit 52 supplies the gas to the periphery of the wafer W. Further, in a case where the gas supplied from the peripheral introducing unit 52A contains a reactive gas, the reactive gas is dissociated at a dissociation rate higher than the dissociation rate of the reactive gas supplied from the peripheral introducing unit 52.

Figure 32:
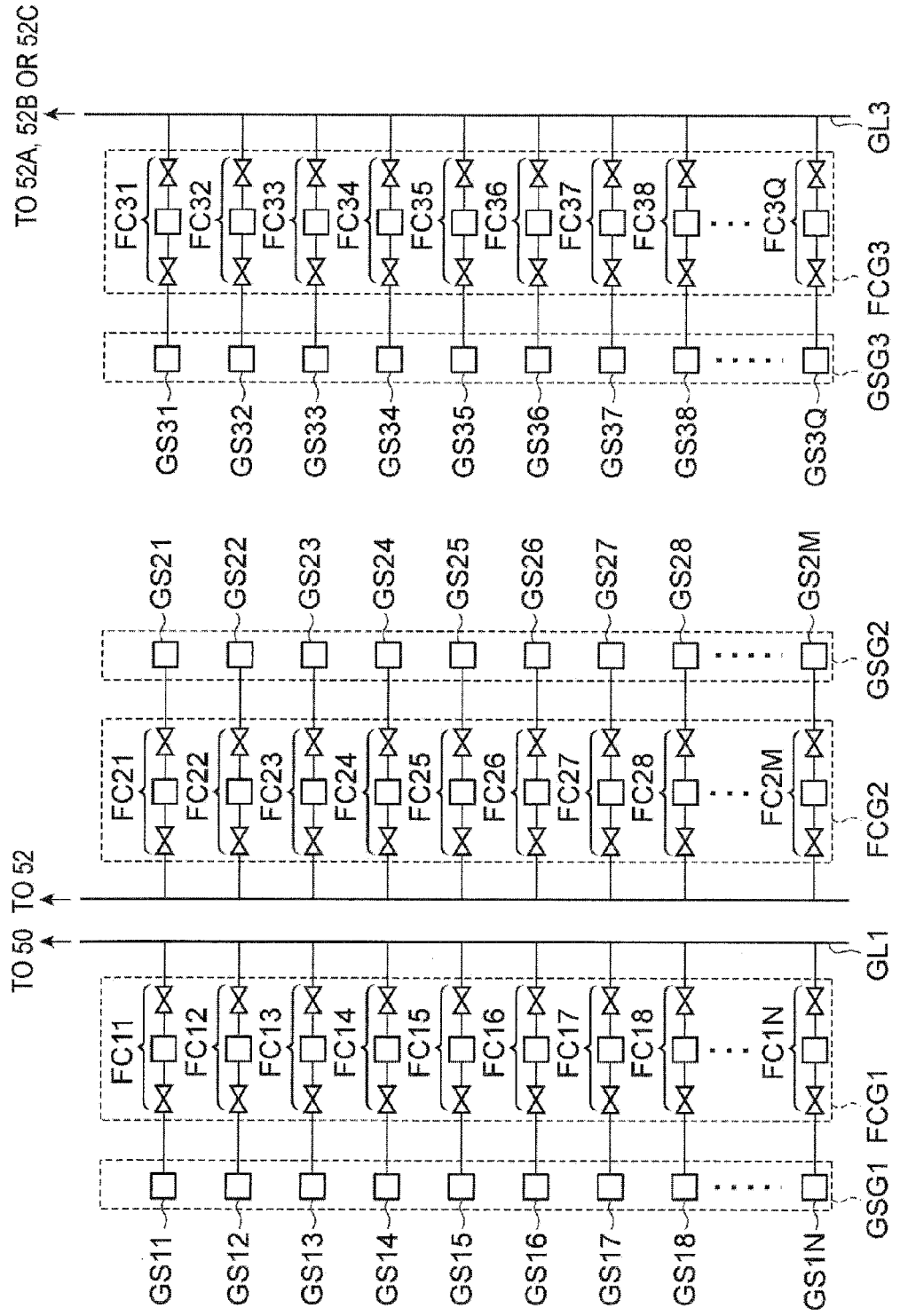
FIG. 32 is a diagram illustrating an exemplary gas supply system which is applicable to the plasma processing apparatus of the exemplary embodiment.

FIG. 32 is a diagram illustrating an exemplary gas supply system which is applicable to the plasma processing apparatus of the exemplary embodiment. In an exemplary embodiment, the plasma processing apparatus 10A may include a gas supply system illustrated in FIG. 32. The gas supply system illustrated in FIG. 32 includes a third gas source group GSG3 and the third flow rate control unit group FCG3, in addition to the first gas source group GSG1, the first flow rate control unit group FCG1, the second gas source group GSG2, and the second flow rate control unit group FCG2.

As illustrated in FIG. 32, the third gas source group GSG3 includes a plurality of third gas sources GS31 to GS3Q. Here, "Q" is a symbol representing the total number. The third gas sources GS31 to GS38 are a source of Ar gas, a source of He gas, a source of $C_4F_6$ gas, a source of $O_2$ gas, a source of HBr gas, a source of $CF_4$, a source of $Cl_2$ gas, and a source of $N_2$ gas, respectively. The third gas source group GSG3 may further include sources of gases other than these gases. The third flow rate control unit group FCG3 includes a plurality of third flow rate control units FC31 to FC3Q. Each of the plurality of third flow rate control units FC31 to FC3Q includes, for example, two valves and a flow rate controller provided between the two valves. The flow rate controller is, for example, a mass flow controller.

The plurality of third gas sources GS31 to GS3Q is connected to a common gas line GL3 through the plurality of third flow rate control units FC31 to FC3Q, respectively. The common gas line GL3 is connected to the peripheral introducing unit 52A. That is, the peripheral introducing unit 52A is connected with the third gas source group GSG3, which is independent from the first gas source group GSG1 and the second gas source group GSG2, through the third flow rate control unit group FCG3, which is independent from the first flow rate control unit group FCG1 and the second flow rate control unit group FCG2. Accordingly, the kinds of one or more gases introduced into the processing space S from the peripheral introducing unit 52A and the flow rates of one or more gases introduced into the processing space S from the peripheral introducing unit 52A may be independently controlled. For example, the composition ratio of the gas introduced into the processing space S from the peripheral introducing unit 52A may be different from the composition ratio of the gas introduced into the processing space S from the peripheral introducing unit 52. In addition, in a case where gases having the same composition ratio are introduced into the processing space S from the peripheral introducing unit 52 and the peripheral introducing unit 52A, a ratio of the flow rate of the gas introduced into the processing space S from the peripheral introducing unit 52 and the flow rate of the gas introduced into the processing space S from the peripheral introducing unit 52A may be adjusted.

Therefore, according to the plasma processing apparatus 10A, gases each having a composition and a flow rate relatively adjusted may be supplied to a plurality of regions in the radial direction of the wafer W from the peripheral introducing unit 52 and the peripheral introducing unit 52A, so that the processing speeds in the plurality of regions of the wafer W become uniform. Further, according to the plasma processing apparatus 10A, reactive gases each having a different dissociation rate may be supplied to a plurality of regions in the radial direction of the wafer W, so that the processing speeds in the plurality of regions of the wafer W become uniform.

Further, a gas having the same composition as that of the gas introduced into the processing space S from the central introducing unit 50 may be introduced into the processing space S from the peripheral introducing unit 52A. When the gas introduced from the central introducing unit 50 is radiated to the central region of the wafer W, the gas is reflected by the wafer W. As a result, a flow of the gas flowing outward and upward from the central portion of the wafer W may occur. When a gas having the same composition as that of the gas introduced into the processing space S from the central introducing unit 50 is introduced into the processing space S from the peripheral introducing unit 52A towards the central portion of the wafer W, the gas introduced into the processing space S from the peripheral introducing unit 52A flows in a direction opposite to the flow of the gas flowing outward and upward. Therefore, it is possible to suppress the flow of the gas which is introduced from the central introducing unit 50 and reflected by the central portion of the wafer W, thereby flowing outward and upward.

Figure 33:
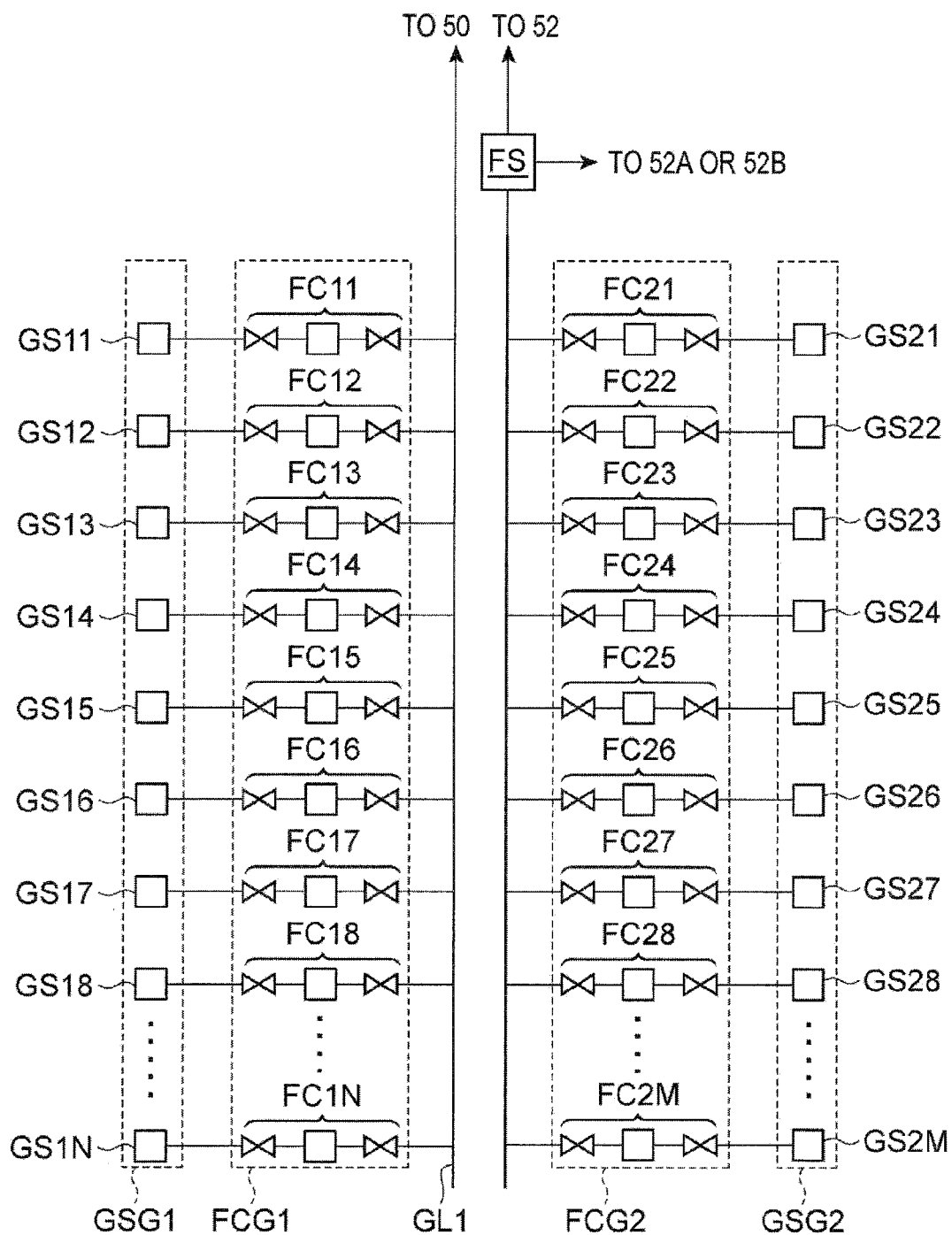
FIG. 33 is a diagram illustrating another exemplary gas supply system which is applicable to the plasma processing apparatus of the exemplary embodiment.

FIG. 33 is a diagram illustrating another exemplary gas supply system which is applicable to the plasma processing apparatus of the exemplary embodiment. In another exemplary embodiment, the plasma processing apparatus 10A may include a gas supply system illustrated in FIG. 33. That is, as illustrated in FIG. 33, the peripheral introducing unit 52A of the plasma processing apparatus 10A may be connected with the second gas source group GSG2 through the second flow rate control unit group FCG2 and a flow splitter FS. In this exemplary embodiment, the peripheral introducing unit 52 and the peripheral introducing unit 52A are supplied with gases having the same composition, but the ratio of the flow rate of the gas introduced into the processing space S from the peripheral introducing unit 52 and the flow rate of the gas introduced into the processing space S from the peripheral introducing unit 52A may be adjusted. Therefore, even in this case, gases each having a flow rate relatively adjusted may be supplied to the plurality of regions in the radial direction of the wafer W from the peripheral introducing unit 52 and the peripheral introducing unit 52A, so that the processing speeds in the plurality of regions become uniform. Further, reactive gases each having a different dissociation rate may be supplied to the plurality of regions of the wafer W.

Figure 34:
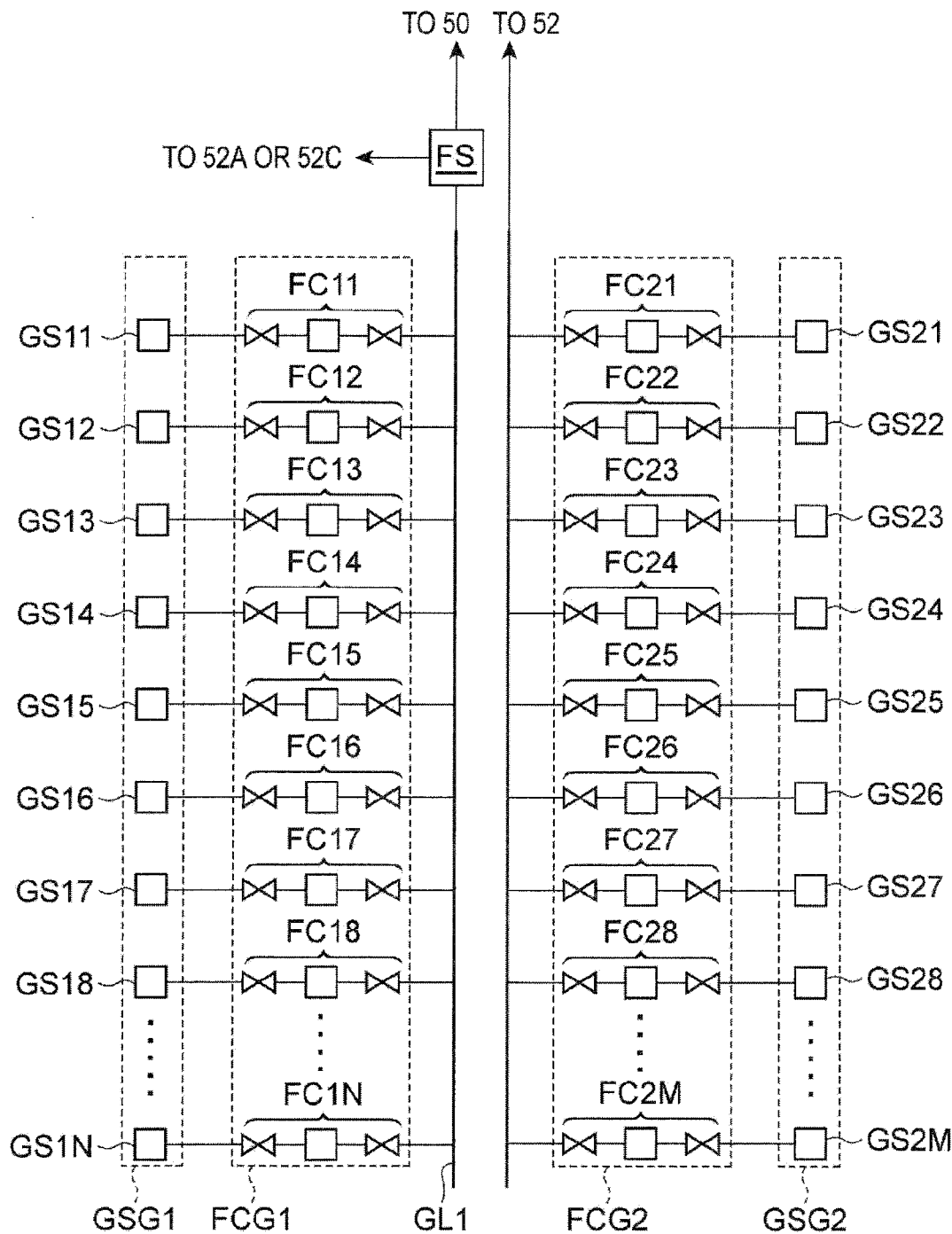
FIG. 34 is a diagram illustrating still another exemplary gas supply system which is applicable to the plasma processing apparatus of the exemplary embodiment.

FIG. 34 is a diagram illustrating still another exemplary gas supply system which is applicable to the plasma processing apparatus of the exemplary embodiment. In still another exemplary embodiment, the plasma processing apparatus 10A may include a gas supply system illustrated in FIG. 34. That is, as illustrated in FIG. 34, the peripheral introducing unit 52A of the plasma processing apparatus 10A may be connected with the first gas source group GSG1 through the first flow rate control unit group FCG1 and the flow splitter FS. In this case, it is possible to suppress the flow of the gas which is introduced from the central introducing unit 50 and reflected by the central portion of the wafer W, thereby flowing outward and upward.

Figure 35:
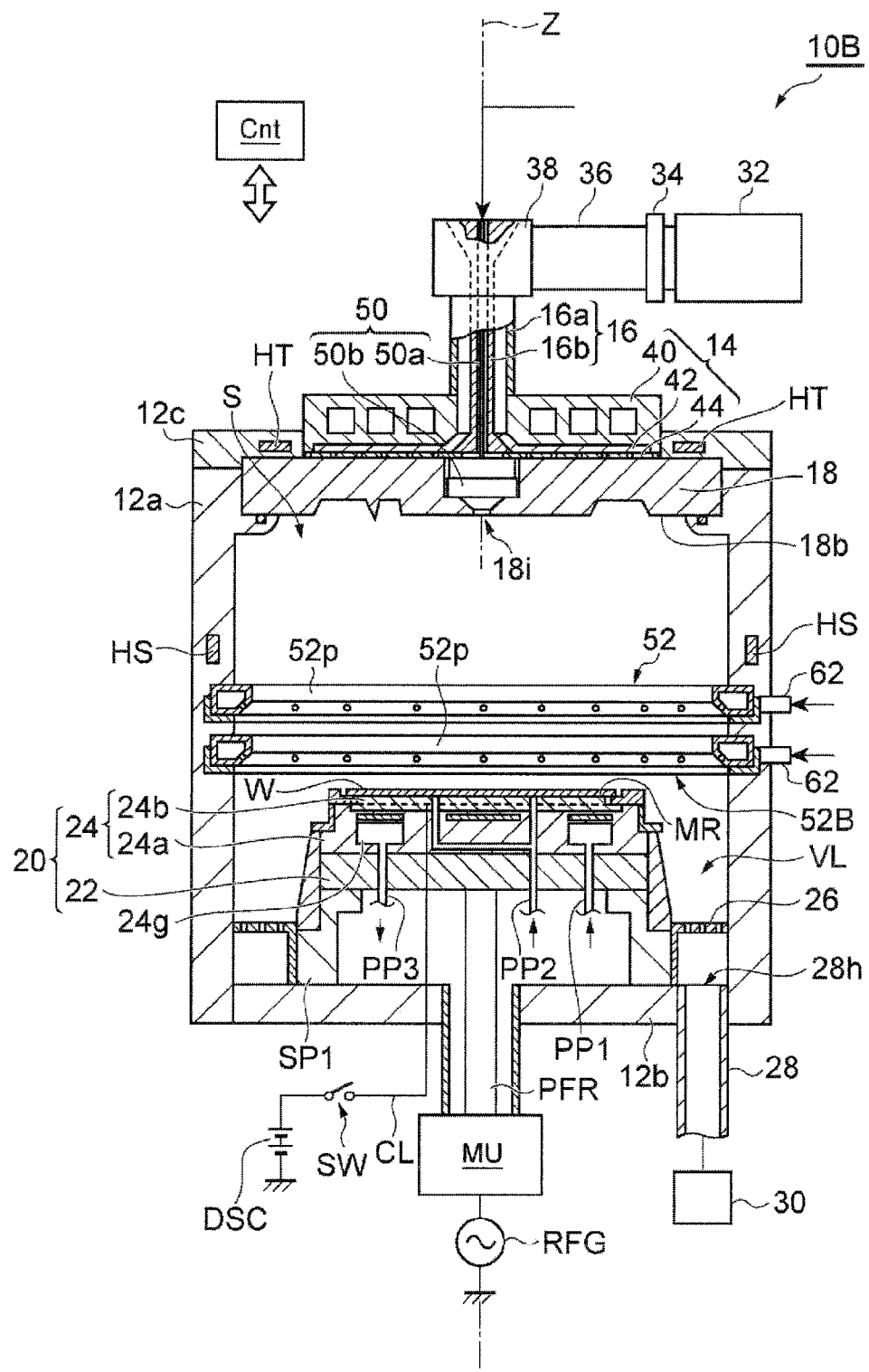
FIG. 35 is a schematic cross-sectional view illustrating a plasma processing apparatus according to still another exemplary embodiment.

FIG. 35 is a schematic cross-sectional view illustrating a plasma processing apparatus according to still another exemplary embodiment. A plasma processing apparatus 10B illustrated in FIG. 35 is different from the plasma processing apparatus 10 in that a separate peripheral introducing unit 52B is further provided. The peripheral introducing unit 52B is configured by the same components as those of the peripheral introducing unit 52. The annular pipe 52p of the peripheral introducing unit 52A of the plasma processing apparatus 10A is provided above the annular pipe 52p of the peripheral introducing unit 52 in the axis Z direction, but an annular pipe 52p of the peripheral introducing unit 52B of the plasma processing apparatus 10B is provided above the placement region MR and below the annular pipe 52p of the peripheral introducing unit 52 in the axis Z direction.

The plasma processing apparatus 10B may include the gas supply system illustrated in FIG. 32 or the gas supply system illustrated in FIG. 33. That is, the peripheral introducing unit 52B may be connected with the gas source group GSG3 for exclusive use through the flow rate control unit group FCG3 for exclusive use. Otherwise, the peripheral introducing unit 52B may be connected with the second gas source group GSG2 through the second flow rate control unit FCG2 and the flow splitter FS.

Figure 36:
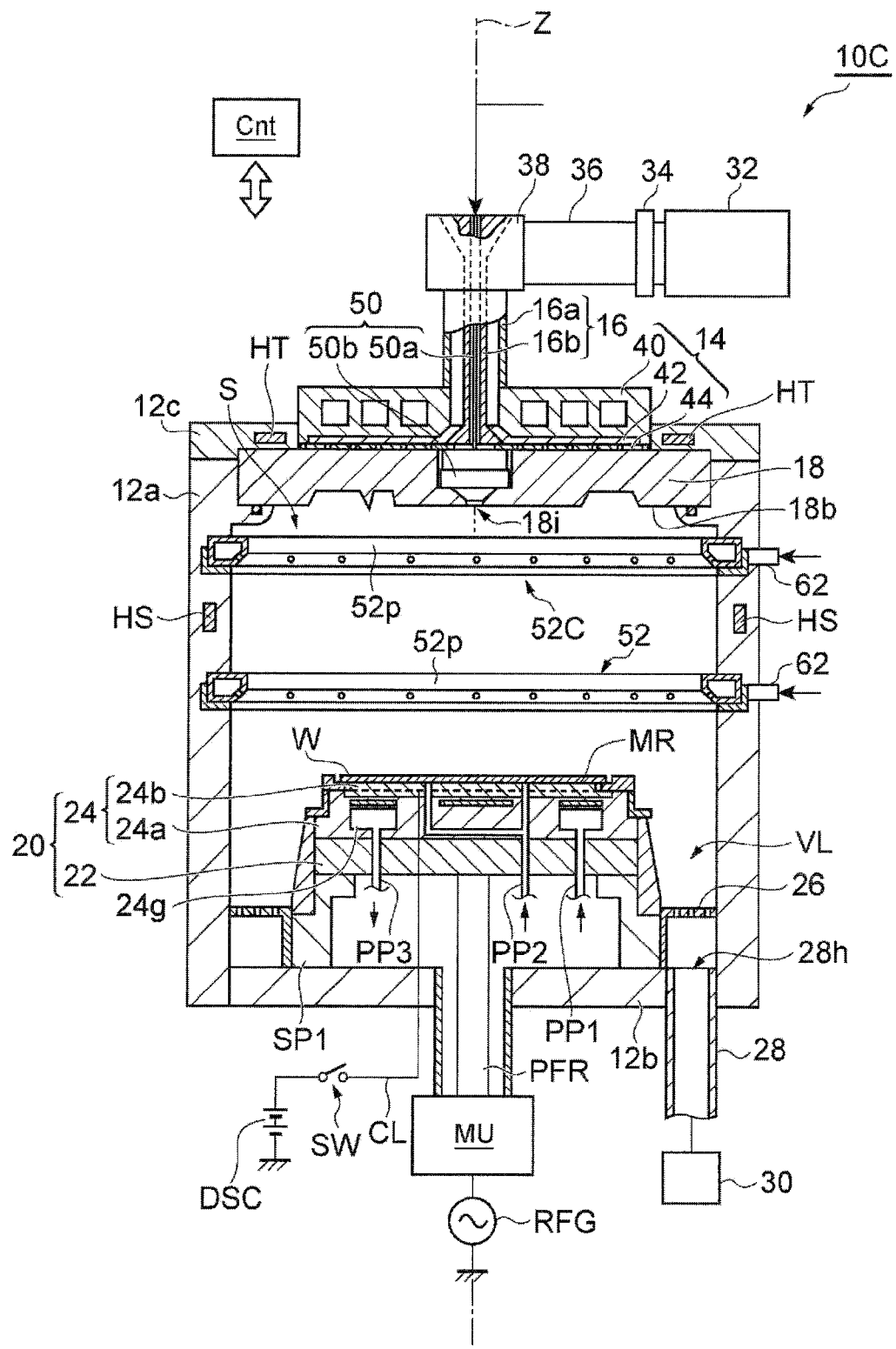
FIG. 36 is a schematic cross-sectional view illustrating a plasma processing apparatus according to yet another exemplary embodiment.

FIG. 36 is a schematic cross-sectional view illustrating a plasma processing apparatus according to yet another exemplary embodiment. A plasma processing apparatus 10C illustrated in FIG. 36 is different from the plasma processing apparatus 10 in that a separate peripheral introducing unit 52C is further provided. The peripheral introducing unit 52C is configured by the same components as those of the peripheral introducing unit 52. An annular pipe 52p of the peripheral introducing unit 52C of the plasma processing apparatus 10C is provided in the plasma generation region, that is, near the lower surface of the dielectric window 19. The plasma processing apparatus 10C may include the gas supply system illustrated in FIG. 32 or the gas supply system illustrated in FIG. 34. In the plasma processing apparatus 10C, when a gas is introduced into the processing space S from the peripheral introducing unit 52A towards the center of the wafer W, the gas introduced into the processing space S from the peripheral introducing unit 52A is introduced from the central introducing unit 50 and reflected by the central portion of the wafer W, thereby flowing in a direction opposite to the flow of the gas flowing outward and upward. Therefore, it is possible to suppress the flow of the gas which is introduced from the central introducing unit 50 and reflected by the central portion of the wafer W, thereby flowing outward and upward.

Here, descriptions will be made on Simulations 26 and 27 which were performed to confirm the effect of the peripheral introducing unit 52A of the plasma processing apparatus 10A. In Simulation 26, a setting was made, in which 200 sccm of HBr gas was introduced into the processing space S from the central introducing unit 50. Further, in Simulation 27, a setting was made, in which 200 sccm of HBr gas was introduced into the processing space S from the central introducing unit 50 and 100 sccm of He gas was introduced into the processing space S from the peripheral introducing unit 52A. In Simulations 26 and 27, the inner diameter of the processing container 12 was set to 540 mm, the distance in the axis Z direction between the lower surface 18b of the dielectric window 18 and the placement region MR was set to 245 mm, the diameter of the annular pipe 52p of the peripheral introducing unit 52A was set to 540 mm, and the distance in the axis Z direction between the annular pipe 52p of the peripheral introducing unit 52A and the placement region MR was set to 120 mm. Further, the pressure in the processing container 12 was set to 10 mTorr (1.333 Pa).

FIG. 37 illustrates diagrams of distribution of gas flows in the processing containers obtained in Simulations 26 and 27. In FIG. 37(a), a flow of a gas in the processing container obtained in Simulation 26 is illustrated by arrows, and in FIG. 37(b), a flow of a gas in the processing container obtained in Simulation 27 is illustrated by arrows. As illustrated in FIG. 37(a), when a gas is introduced into the processing space S only from the central introducing unit 50, the gas is reflected in the central portion of the wafer W and flows outward and upward. Accordingly, a vortex of the gas is generated above the middle region between the central portion and the periphery of the wafer W. Meanwhile, as illustrated in FIG. 37(b), from the results of Simulation 27, it has been found that the flow of the gas reflected in the central portion of the wafer W and flowing outward and upward is suppressed by introducing the gas into the processing space S from the peripheral introducing unit 52A. Further, from the result of Simulation 27, it has been found that a uniform flow of the gas is generated on the surface of the wafer W from the central portion of the wafer W towards the periphery and then, towards the exhaust path VL.

Various exemplary embodiments have been described above, but various modifications may be made without being limited to the above-mentioned exemplary embodiments. For example, in the plasma processing apparatus 10A, the annular pipe 52p of the peripheral introducing unit 52 and the annular pipe 52p of the peripheral introducing unit 52A may be formed integrally. For example, the annular pipe 52p of the peripheral introducing unit 52 and the annular pipe 52p of the peripheral introducing unit 52A may be formed integrally as a single ceramic part. Similarly, the annular pipe 42p of the peripheral introducing unit 52 and the annular pipe 52p of the peripheral introducing unit 52B may be formed integrally.

DESCRIPTION OF SYMBOL

10: plasma processing apparatus, 12: processing container, 12a: sidewall, 14: antenna, 16: coaxial waveguide, 18: dielectric window, 18b: lower surface of dielectric window, 18u: upper surface of dielectric window, 181: recess, 182: second recess (dimple), 20: placing table, 22: plate (RF plate), 24a: base plate, 24b: chuck, 24c: lower portion, 24d: upper portion, MR: placement region, 26: baffle plate, 28: exhaust pipe, 28h: exhaust port, 30: exhaust device, 32: microwave generator, 40: cooling jacket, 42: dielectric plate, 44: slot plate, 44a, 44b: slot holes, 44p: slot pair, 50: central introducing unit, 18i: central introduction port, 52: peripheral introducing unit, 52i: peripheral introduction port, 52p: annular pipe, 56: support member, 58, 60: fixing members, 62: gas supply block, 70, 72: insulating members, Cnt: control unit, GS11 to GS1N: first gas sources, GS21 to GS2M: second gas sources, FC11 to FC1N: first flow rate control unit, FC21 to FC2M: second flow rate control unit, FR: focus ring, MU: matching unit, PFR: power feeding rod, RFG: high frequency power supply, S: processing space, W: wafer (substrate).

What is claimed is:
1. A method of performing a plasma processing on a substrate, comprising:
    etching a substrate placed on a placing table to face a lower surface of a dielectric window by supplying a first gas from a central introducing unit into a processing container, supplying a second gas from a peripheral introduction unit into the processing container, and introducing energy of microwaves from an antenna provided above an upper surface of the dielectric window into the processing container through the dielectric window,
    wherein the central introducing unit includes a central introduction port opened towards the center of the substrate and configured to inject a gas just below the dielectric window, the central introduction unit being connected with a plurality of first gas sources including a source of the first gas through a plurality of first flow rate control units,
    the peripheral introducing unit includes a plurality of peripheral introduction ports arranged in a circumferential direction below the central introduction ports and above the placing table and configured to inject a gas towards the periphery of the substrate, the peripheral introducing unit being connected with a plurality of second gas sources including a source of the second gas through a plurality of second flow rate control units, and
    a flow rate of a reactive gas in the second gas is higher than a flow rate of a reactive gas in the first gas, and a ratio of the flow rate of the reactive gas to a flow rate of a rare gas in the second gas is greater than a ratio of the flow rate of the reactive gas to a flow rate of a rare gas in the first gas.
2. The method of claim 1, wherein the substrate includes a silicon oxide layer and a polycrystalline silicon layer, and
    in the etching of the substrate, $C_4F_6$ gas is supplied as the reactive gas to the peripheral introducing unit.
3. The method of claim 2, wherein the polycrystalline silicon layer constitutes a fin having a source, a drain, and a channel in a fin type field effect transistor, and the silicon oxide layer is formed around the fin.

4. The method of claim 1, wherein the substrate includes an underlying portion made of silicon, a plurality of gates arranged on the underlying portion, and sidewall spacer layers formed along sidewalls of the plurality of gates, the placing table is connected to a high frequency power supply configured to generate a high frequency bias power, the method further comprises etching the underlying portion below a gap between two spacer layers interposed between two adjacent gates by introducing a reactive gas for etching the underlying portion into the processing container, introducing energy of microwaves from the antenna into the processing container through the dielectric window, and applying the high frequency bias power to the placing table, and after the etching of the underlying portion, the etching of the substrate is performed using the reactive gas for etching the underlying portion as the reactive gas in the second gas without applying the high frequency bias power to the placing table.

\* \* \* \* \*